(12) United States Patent
Bang et al.

(10) Patent No.: US 12,302,743 B2
(45) Date of Patent: *May 13, 2025

(54) LIGHT-EMITTING DEVICE AND ELECTRONIC APPARATUS COMPRISING SAME

(71) Applicant: SAMSUNG DISPLAY CO., LTD., Yongin-si (KR)

(72) Inventors: Jinsook Bang, Yongin-si (KR); Donghoon Kim, Yongin-si (KR); Sanghoon Yim, Yongin-si (KR); Jinyoung Choi, Yongin-si (KR); Eunjeong Hong, Yongin-si (KR); Kwanhee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/608,740

(22) Filed: Mar. 18, 2024

(65) Prior Publication Data

US 2024/0292733 A1 Aug. 29, 2024

Related U.S. Application Data

(63) Continuation of application No. 17/098,455, filed on Nov. 16, 2020, now Pat. No. 11,957,043.

(30) Foreign Application Priority Data

May 6, 2020 (KR) ........................ 10-2020-0054095

(51) Int. Cl.
*H10K 85/30* (2023.01)
*C09K 11/06* (2006.01)
(Continued)

(52) U.S. Cl.
CPC ............ *H10K 85/342* (2023.02); *C09K 11/06* (2013.01); *H10K 85/623* (2023.02);
(Continued)

(58) Field of Classification Search
CPC .... H10K 85/342; H10K 85/623; H10K 50/11; H10K 50/13; H10K 50/8445;
(Continued)

(56) References Cited

U.S. PATENT DOCUMENTS 6,312,836 B1 11/2001 Bulovic et al.
7,851,579 B2 12/2010 Ye et al.
(Continued)

FOREIGN PATENT DOCUMENTS

JP 2012-113976 6/2012
JP 2013-008806 1/2013
(Continued)

OTHER PUBLICATIONS

"EQE Optimization for A TOP-Emitting OLED", Jul. 28, 2020, available at www.fluxim.com/high-eqe-toled, 7 pages.
(Continued)

*Primary Examiner* — Michael M. Bernshteyn
(74) *Attorney, Agent, or Firm* — Womble Bond Dickinson (US) LLP

(57) ABSTRACT

A light-emitting device includes: a first electrode; a second electrode facing the first electrode; and an interlayer disposed between the first electrode and the second electrode and including an emission layer patterned into a red emission layer and a green emission layer for a corresponding sub-pixel, wherein the red emission layer includes a red dopant having a horizontal dipole moment, and the green emission layer comprises a green dopant having a horizontal
(Continued)

dipole moment, and the horizontal dipole moment of the green dopant is greater than the horizontal dipole moment of the red dopant.

13 Claims, 4 Drawing Sheets

(51) Int. Cl.
| | |
|---|---|
| *H10K 50/11* | (2023.01) |
| *H10K 50/13* | (2023.01) |
| *H10K 50/844* | (2023.01) |
| *H10K 85/60* | (2023.01) |
| *H10K 101/10* | (2023.01) |

(52) U.S. Cl.
CPC ............. C09K 2211/1029 (2013.01); *C09K 2211/1044* (2013.01); *C09K 2211/185* (2013.01); *H10K 50/11* (2023.02); *H10K 50/13* (2023.02); *H10K 50/8445* (2023.02); *H10K 2101/10* (2023.02)

(58) Field of Classification Search
CPC ............. H10K 2101/10; C09K 11/06; C09K 2211/185; C09K 2211/1044; C09K 2211/1029
USPC ........................................................ 257/40
See application file for complete search history.

(56) References Cited

U.S. PATENT DOCUMENTS

| | | | |
|---|---|---|---|
| 8,585,659 B2 | 11/2013 | Shay | |
| 8,653,548 B2 | 2/2014 | Krummacher et al. | |
| 8,928,976 B2 | 1/2015 | Kang et al. | |
| 8,957,236 B2 | 2/2015 | Zhang et al. | |
| 8,993,129 B2 | 3/2015 | Endo et al. | |
| 9,024,026 B2 | 5/2015 | Yersin et al. | |
| 9,059,460 B2 | 6/2015 | Hattori et al. | |
| 9,093,650 B2 | 7/2015 | Kim et al. | |
| 9,099,658 B2 | 8/2015 | Kawamura et al. | |
| 9,101,447 B2 | 8/2015 | Sramek | |
| 9,153,788 B2 | 10/2015 | Adachi et al. | |
| 9,266,906 B2 | 2/2016 | Baumann et al. | |
| 9,312,496 B2 | 4/2016 | Sawada et al. | |
| 9,316,704 B2* | 4/2016 | Chang | H10N 50/01 |
| 9,357,217 B2 | 5/2016 | Hoffer et al. | |
| 9,431,625 B2 | 8/2016 | Moon et al. | |
| 9,476,782 B2 | 10/2016 | Suzuki et al. | |
| 9,481,980 B2 | 11/2016 | Bang | |
| 9,496,516 B2 | 11/2016 | Sakuma et al. | |
| 9,502,475 B2* | 11/2016 | Lee | H10K 50/852 |
| 9,502,668 B2 | 11/2016 | Adachi et al. | |
| 9,537,117 B2 | 1/2017 | Yersin et al. | |
| 9,559,323 B2* | 1/2017 | Lee | H10K 59/80524 |
| 9,559,324 B2 | 1/2017 | Seo et al. | |
| 9,564,598 B2 | 2/2017 | Ito et al. | |
| 9,604,928 B2 | 3/2017 | Shitagaki et al. | |
| 9,614,166 B2 | 4/2017 | Kai et al. | |
| 9,615,461 B2 | 4/2017 | Nakamura et al. | |
| 9,634,262 B2 | 4/2017 | Adachi et al. | |
| 9,647,218 B2 | 5/2017 | Kwong et al. | |
| 9,660,199 B2 | 5/2017 | Shizu et al. | |
| 9,660,214 B2* | 5/2017 | Kim | H10K 59/131 |
| 9,673,409 B2 | 6/2017 | Li et al. | |
| 9,685,615 B2 | 6/2017 | Numata et al. | |
| 9,793,492 B2 | 10/2017 | Sagara et al. | |
| 9,947,896 B2* | 4/2018 | Sakamoto | H10K 50/844 |
| 9,957,260 B2 | 5/2018 | Sakai et al. | |
| 9,966,541 B2 | 5/2018 | Yamamoto et al. | |
| 9,985,234 B2 | 5/2018 | Seo et al. | |
| 10,062,867 B2 | 8/2018 | Seo et al. | |
| 10,211,417 B2* | 2/2019 | Kim | H10K 50/15 |
| 10,290,826 B2 | 5/2019 | Kim et al. | |
| 10,326,111 B2 | 6/2019 | Yoo et al. | |
| 10,454,038 B2 | 10/2019 | Nakagawa et al. | |
| 10,461,261 B2 | 10/2019 | Li et al. | |
| 10,573,822 B2 | 2/2020 | Kim et al. | |
| 10,651,394 B2 | 5/2020 | Danz | |
| 2005/0260440 A1 | 11/2005 | Seo et al. | |
| 2011/0304262 A1 | 12/2011 | Kwong | |
| 2012/0217869 A1 | 8/2012 | Adachi et al. | |
| 2013/0062599 A1 | 3/2013 | Holmes et al. | |
| 2014/0027734 A1 | 1/2014 | Kwong | |
| 2014/0138627 A1 | 5/2014 | Kwong et al. | |
| 2014/0145149 A1 | 5/2014 | Lin et al. | |
| 2014/0145151 A1 | 5/2014 | Xia et al. | |
| 2014/0158992 A1 | 6/2014 | Xia et al. | |
| 2014/0167015 A1* | 6/2014 | Lee | H10K 50/13 257/40 |
| 2014/0179585 A1 | 6/2014 | Souter et al. | |
| 2014/0291647 A1 | 10/2014 | Suzuki et al. | |
| 2014/0332758 A1 | 11/2014 | Kwong et al. | |
| 2015/0021555 A1 | 1/2015 | Kwong et al. | |
| 2015/0132831 A1 | 5/2015 | Olinski et al. | |
| 2015/0141642 A1 | 5/2015 | Adachi et al. | |
| 2015/0155519 A1* | 6/2015 | Lee | H10K 59/32 257/40 |
| 2015/0170847 A1 | 6/2015 | Wrede | |
| 2015/0218191 A1 | 8/2015 | Sannomiya et al. | |
| 2015/0318510 A1 | 11/2015 | Ito et al. | |
| 2016/0054401 A1 | 2/2016 | Chang et al. | |
| 2016/0126297 A1* | 5/2016 | Kim | H10K 50/16 438/35 |
| 2016/0190501 A1* | 6/2016 | Kim | H10K 50/171 257/40 |
| 2016/0197286 A1 | 7/2016 | Kawamura et al. | |
| 2016/0232265 A1 | 8/2016 | Thomson et al. | |
| 2016/0285015 A1 | 9/2016 | Li et al. | |
| 2016/0372683 A1 | 12/2016 | Tanimoto et al. | |
| 2017/0018600 A1 | 1/2017 | Ito et al. | |
| 2017/0077448 A1* | 3/2017 | Sakamoto | H10K 59/80524 |
| 2017/0162817 A1 | 6/2017 | Ogiwara et al. | |
| 2017/0200899 A1 | 7/2017 | Kim et al. | |
| 2017/0271597 A1 | 9/2017 | Miyata et al. | |
| 2017/0352829 A1 | 12/2017 | Seo et al. | |
| 2018/0182980 A1 | 6/2018 | Lennartz et al. | |
| 2018/0351124 A1 | 12/2018 | Yoneda et al. | |
| 2018/0375035 A1 | 12/2018 | Ji et al. | |
| 2019/0036055 A1 | 1/2019 | Lin et al. | |
| 2019/0058144 A1 | 2/2019 | Lee et al. | |
| 2019/0203114 A1 | 7/2019 | Ihn et al. | |
| 2019/0372055 A1 | 12/2019 | Wu et al. | |
| 2020/0203652 A1 | 6/2020 | Duan et al. | |
| 2022/0376004 A1* | 11/2022 | Kitazawa | H10K 59/353 |

FOREIGN PATENT DOCUMENTS

| | | |
|---|---|---|
| JP | 2014-043541 | 3/2014 |
| JP | 2014-521856 | 8/2014 |
| JP | 5594750 | 9/2014 |
| JP | 5679496 | 3/2015 |
| JP | 5789439 | 10/2015 |
| JP | 2016-036025 | 3/2016 |
| JP | 5875011 | 3/2016 |
| JP | 2016-210728 | 12/2016 |
| JP | 6169078 | 7/2017 |
| JP | 6305391 | 4/2018 |
| JP | 6439791 | 12/2018 |
| JP | 6542122 | 7/2019 |
| JP | 6756614 | 9/2020 |
| KR | 10-0669776 | 1/2007 |
| KR | 10-2010-0037607 | 4/2010 |
| KR | 10-2012-0112517 | 10/2012 |
| KR | 10-2014-0010359 | 1/2014 |
| KR | 10-2014-0044904 | 4/2014 |
| KR | 10-2014-0064265 A | 5/2014 |
| KR | 10-2014-0068027 | 6/2014 |
| KR | 10-2014-0144152 A | 12/2014 |
| KR | 10-2015-0010862 | 1/2015 |
| KR | 10-2015-0056046 | 5/2015 |
| KR | 10-2015-0126527 A | 11/2015 |

(56) References Cited

FOREIGN PATENT DOCUMENTS

| | | |
|---|---|---|
| KR | 10-2016-0101519 | 8/2016 |
| KR | 10-1680934 | 11/2016 |
| KR | 10-2017-0026075 | 3/2017 |
| KR | 10-2017-0031362 | 3/2017 |
| KR | 10-2017-0059980 | 5/2017 |
| KR | 10-1742359 | 5/2017 |
| KR | 10-2017-0131234 A | 11/2017 |
| KR | 10-1844434 | 4/2018 |
| KR | 10-1908385 | 10/2018 |
| KR | 10-2019-0012117 | 2/2019 |
| KR | 10-2019-0012679 | 2/2019 |
| KR | 10-2000980 | 7/2019 |
| WO | WO 2012050003 | 4/2012 |
| WO | WO 2012-073888 | 6/2012 |
| WO | WO 2013-161437 | 10/2013 |
| WO | WO 2013-180241 | 12/2013 |
| WO | WO 2014-050904 | 4/2014 |
| WO | WO 2014103724 | 7/2014 |
| WO | WO 2014-126200 | 8/2014 |
| WO | WO 2014-157268 | 10/2014 |
| WO | WO 2015-002213 | 1/2015 |
| WO | WO 2015-008580 | 1/2015 |
| WO | WO 2015-022835 | 2/2015 |
| WO | WO 2015-118035 | 8/2015 |
| WO | WO 2015-158692 | 10/2015 |
| WO | WO 2016-017514 | 2/2016 |
| WO | WO 2016-017684 | 2/2016 |
| WO | WO 2016-017741 | 2/2016 |
| WO | WO 2016-091887 | 6/2016 |
| WO | WO 2016-096851 | 6/2016 |

OTHER PUBLICATIONS

A. Graf et al., Correlating the transition dipole moment orientation of phosphorescent emitter molecules in OLEDs to basic material properties, J. Mater. Chem. C, 2(48), 2012, 10298-10304.
Malika Ibrahim-Ouali et al., Recent Advances on Metal-Based Near-Infrared and Infrared Emitting OLEDs, Molecules, 24(7), 1412, 2019, 39 pages.
Jeong-Hwan Lee et al., "An Exciplex Forming Host for Highly Efficient Blue Organic Light Emitting Diodes with Low Driving Voltage," Advanced Functional Materials, 2014, vol. 25, pp. 1-6.
L. Penninck et al., Determining emissive dipole orientation in organic light emitting devices by decay time measurement, Organic Electronics 13, 2012, pp. 3079-3084.
Alessia Senes et al., Increasing the horizontal orientation of transition dipole moments in solution processed small molecular emitters, J. Mater. Chem. C, 5(26), 2017, 6555-6562.
www.spiedigitallibrary.org, no later than Aug. 4, 2020, 1 page.
Non-Final Office Action dated Jan. 12, 2023, issued in U.S. Appl. No. 17/009,286.
U.S. Appl. No. 16/987,332, filed Aug. 6, 2020.
U.S. Appl. No. 17/009,286, filed Sep. 1, 2020.
U.S. Appl. No. 17/030,365, filed Sep. 23, 2020.
U.S. Appl. No. 17/035,448, filed Sep. 28, 2020.
Korean Notice of Allowance issued Nov. 27, 2024, in corresponding KR Patent Application No. 10-2020-0054095 (3 pages).

* cited by examiner

| 190 |
| --- |
| 150 |
| 110 |

LIGHT-EMITTING DEVICE AND ELECTRONIC APPARATUS COMPRISING SAME

CROSS-REFERENCE TO RELATED APPLICATION(S)

This application is a continuation application based on copending parent patent application Ser. No. 17/098,455, filed on Nov. 16, 2020, the entire content of which is incorporated by reference herein.

The copending parent patent application Ser. No. 17/098,455 claims priority from and the benefit of Korean Patent Application No. 10-2020-0054095, filed on May 6, 2020, which is hereby incorporated by reference for all purposes as if fully set forth herein.

FIELD OF INVENTION

Exemplary embodiments of the invention relate generally to a light-emitting device, and more particularly, to an electronic apparatus including the light-emitting device.

DISCUSSION OF THE BACKGROUND

Organic light-emitting devices (OLEDs) are self-emission devices that, as compared with devices in the art, have wide viewing angles, high contrast ratios, short response times, and excellent characteristics in terms of brightness, driving voltage, and response speed.

An organic light-emitting device may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit from an excited state to a ground state, to thereby generate light.

The above information disclosed in this Background section is only for understanding of the background of the inventive concepts, and, therefore, it may contain information that does not constitute prior art.

SUMMARY

Light-emitting devices and electronic apparatuses including the same constructed according to exemplary implementations of the invention allow a user not to recognize color change according to the viewing angle, thus the color viewed from the front is substantially identical to the color viewed from the side. For example, Applicant discovered that when the horizontal dipole moment of the green dopant and the horizontal dipole moment of the red dopant of a light emitting device are within any of the ranges disclosed herein, the direction of a color-coordinate change movement according to the viewing angle may be a minimum perceptible color difference (MPCD) line direction, and thus, a user may not recognize the color change depending on a change in the viewing angle.

Additional features of the inventive concepts will be set forth in the description which follows, and in part will be apparent from the description, or may be learned by practice of the inventive concepts.

According to one aspect of the invention, a light-emitting device includes: a first electrode; a second electrode facing the first electrode; and an interlayer disposed between the first electrode and the second electrode and including an emission layer patterned into a red emission layer and a green emission layer for a corresponding sub-pixel, wherein the red emission layer includes a red dopant having a horizontal dipole moment, and the green emission layer comprises a green dopant having a horizontal dipole moment, and the horizontal dipole moment of the green dopant is greater than the horizontal dipole moment of the red dopant.

The horizontal dipole moment of the green dopant may be in a range of about 60% to about 95% of the total dipole moment of the green dopant.

The horizontal dipole moment of the red dopant may be about 80% or lower of the total dipole moment of the red dopant.

The second electrode may have a capping layer with a refractive index of about 1.6 or higher.

The capping layer may be in contact with the second electrode.

An encapsulation layer may be disposed on the second electrode.

The encapsulation layer may be disposed by alternately stacking at least one organic layer and at least one inorganic layer.

The light-emitting device may not include a capping layer.

The green dopant and the red dopant may each be represented by Formula 401:

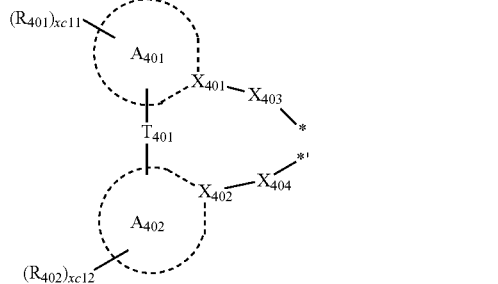

Formula 401
Formula 402 wherein, in Formulae 401 and 402, the variables are defined herein.

The variable M may be iridium, platinum, palladium, osmium, titanium, gold, hafnium, europium, terbium, rhodium, rhenium, or thulium.

The variable X401 in Formula 402 may be nitrogen, and variable X402 may be carbon.

The variables X401 and X402 in Formula 402 may each be nitrogen.

The variable L402 may be an organic ligand comprising a halogen group, a diketone group, a carboxylic acid group, —C(=O), an isonitrile group, a —CN group, a phosphorus group, or any combination thereof.

At least one of the red dopant and the green dopant may be any one of following compounds 1-53 as defined herein.

The interlayer further may include an emission layer patterned into a blue emission layer.

A direction of a color-coordinate change movement according to a viewing angle may be a minimum perceptible color difference line direction.

The color-coordinate change movement may be a movement at a viewing angle of greater than about 0 degrees to about 60 degrees.

The horizontal dipole moment of the red dopant may be in a range of about 60% to about 80% of the total dipole moment of the red dopant.

The first electrode may be an anode, the second electrode may be a cathode, and the interlayer may be disposed between the first electrode and the second electrode, may include an emission layer patterned into a red emission layer, a green emission layer, and/or a blue emission layer for a corresponding sub-pixel, and may include: i) a hole transport region located between the first electrode and the emission layer and including a hole injection layer, a hole transport layer, a buffer layer, an electron blocking layer, or any combination thereof; and ii) an electron transport region located between the emission layer and the second electrode and including a hole blocking layer, an electron transport layer, an electron injection layer, or any combination thereof.

An electronic apparatus may include: a thin-film transistor; and the light-emitting device as defined above, wherein the thin-film transistor may include a source electrode, a drain electrode, an activation layer, and a gate electrode, and the first electrode of the light-emitting device may be electrically connected to one of the source electrode and the drain electrode of the thin-film transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 1 is a schematic cross-sectional diagram of an exemplary embodiment of a light-emitting device constructed according to principles of the invention.

DETAILED DESCRIPTION

Figure 2:
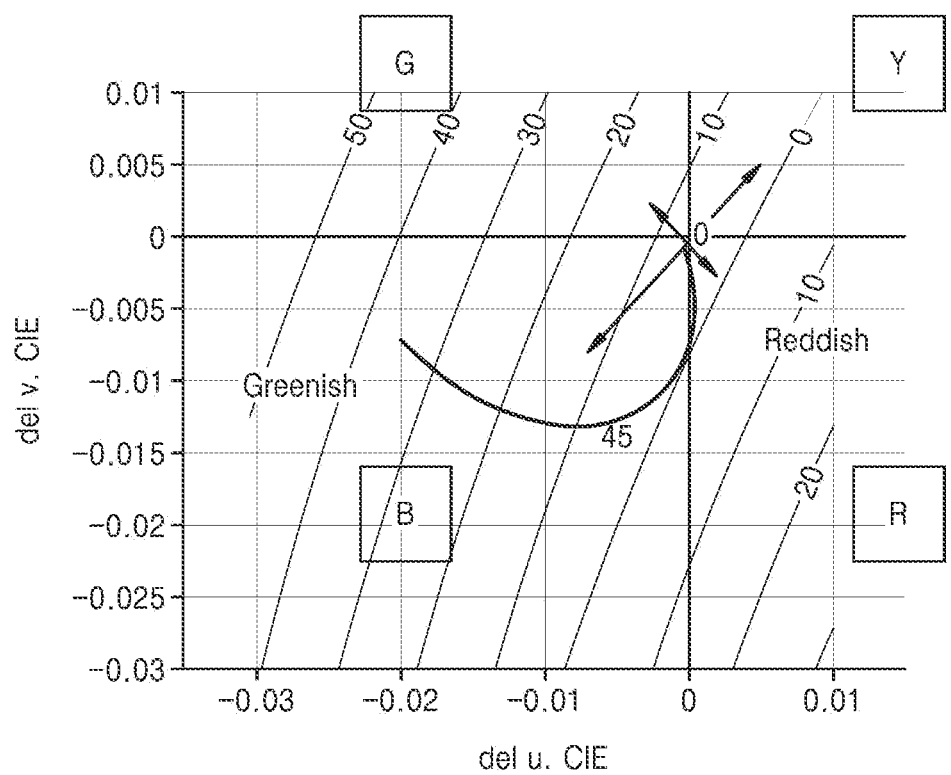
FIG. 2 is a graphical depiction illustrating color-coordinate change movement according to a viewing angle in a light-emitting device of the related art.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Light travels in the vertical dipole moment of a luminescent compound molecule, and in the dipole moment arranged in an x-y plane, light is emitted in the vertical direction. However, in the dipole moment in the z-axis, light is emitted in the horizontal direction, causing light loss. When the molecular arrangement is oriented in the horizontal direction of a substrate (that is, when the dipole moment in the horizontal direction is increased), efficiency may be improved.

In an organic light-emitting device, the larger the horizontal dipole moment, the more light is emitted to the front, which increases the external quantum efficiency. Therefore, molecular structures are designed in a planar form such that the horizontal dipole moment increases when a luminescent material is deposited.

Figure 1:
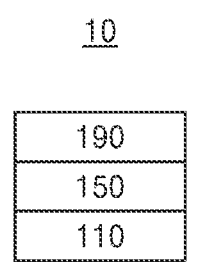
Figure 3:
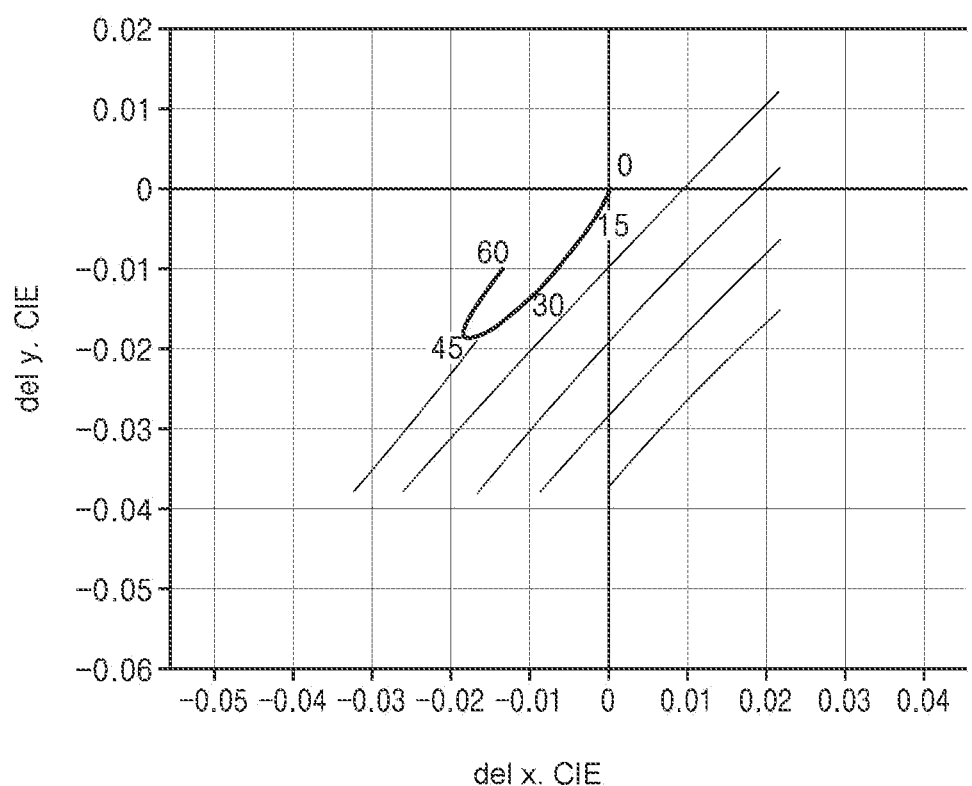
FIG. 3 is a graphical depiction illustrating color-coordinate change movement according to a viewing angle in a light-emitting device constructed according to principles of the invention.

FIG. 1 is a schematic cross-sectional diagram of an exemplary embodiment of a light-emitting device constructed according to principles of the invention. FIG. 2 is a graphical depiction illustrating color-coordinate change movement according to a viewing angle in a light-emitting device of the related art. FIG. 3 is a graphical depiction illustrating color-coordinate change movement according to a viewing angle in a light-emitting device constructed according to principles of the invention.

As shown in FIG. 2, as a viewing angle increases from about 0 to about 60 degrees, the color moves toward the red area, the blue area, and the green area (number "45" represents a viewing angle of about 45 degrees). This change may be observed as a color change according to a viewing angle from reddish to bluish to greenish by the naked eyes of a user.

One of the reasons for the color change according to the viewing angle is that the red resonance is similar with the green in terms of the strength, and thus the color coordinates are changed according to the viewing angle (white angular difference: WAD).

According to one or more exemplary embodiments, a light-emitting device may include: a first electrode; a second electrode facing the first electrode; and an interlayer located between the first electrode and the second electrode and including an emission layer patterned into a red emission layer and a green emission layer according to a sub-pixel, wherein the red emission layer may include a red dopant, and the green emission layer may include a green dopant, and a horizontal dipole moment of the green dopant may be greater than a horizontal dipole moment of the red dopant.

Because green color is strong at a high viewing angle (e.g. at about 60 degrees), it is necessary to widen the red angular distribution at a high angle so as not to be moved toward green color. When the red horizontal dipole moment is decreased, the red light emission rate at a high angle (e.g., about 60 degrees) may be increased. On the other hand, by adjusting the green horizontal dipole moment, the position of the viewing angle of about 60 degrees may be adjusted. When the green horizontal dipole moment is decreased, the green light emission rate at a high angle (e.g., about 60 degrees) may be increased.

In a light emitting device according to one or more exemplary embodiments, the horizontal dipole moment of the green dopant may be greater than the horizontal dipole moment of the red dopant. In some exemplary embodiments, the horizontal dipole moment of the green dopant may be in a range of about 60 percent (%) to about 95% of the total dipole moment of the green dopant.

In some exemplary embodiments, the horizontal dipole moment of the red dopant may be about 80% or lower of the total dipole moment of the red dopant. In some exemplary embodiments, the horizontal dipole moment of the red dopant may be in a range of about 60% to about 80% of the total dipole moment of the red dopant. In some exemplary embodiments, the horizontal dipole moment of the red dopant may be in a range of about 65% to about 75%.

The total dipole moment refers to the sum of the horizontal dipole moment and the vertical dipole moment. When the horizontal dipole moment of the green dopant and the horizontal dipole moment of the red dopant are within any of these ranges, the direction of a color-coordinate change movement according to a viewing angle may be a minimum perceptible color difference (MPCD) line direction, and thus, a user may not recognize the color change depending on the change of a viewing angle.

In some exemplary embodiments, the green dopant and the red dopant may each be represented by Formula 401:

$$M(L_{401})_{xc1}(L_{402})_{xc2}$$ Formula 401

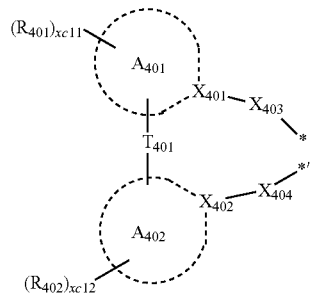

Formula 402 wherein, in Formulae 401 and 402,

M may be transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or greater, at least two $L_{401}$(s) may be identical to or different from each other, $L_{402}$ may be an organic ligand, and xc2 may be an integer from 0 to 4, and when xc2 is 2 or greater, at least two $L_{402}$(s) may be identical to or different from each other, $X_{401}$ and $X_{402}$ may each independently be nitrogen or carbon, ring $A_{401}$ and ring $A_{402}$ may each independently be a $C_5$-$C_{60}$ carbocyclic group or a $C_1$-$C_{60}$ heterocyclic group, $T_{401}$ may be a single bond, —O—, —S—, —C(=O)—, —N($Q_{411}$)—, —N=, —C($Q_{411}$)($Q_{412}$)—, C($Q_{411}$)=C($Q_{412}$)—, —C($Q_{411}$)=, or =C=, $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($Q_{414}$), wherein $Q_{411}$ to $Q_{414}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, $R_{401}$ and $R_{402}$ may each independently be hydrogen, deuterium, —F, —Cl, —Br, —I, a hydroxyl group, a cyano group, a nitro group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may respectively be understood by referring to the descriptions of $Q_{411}$ to $Q_{414}$ provided herein, xc11 and xc12 may each independently be an integer from 0 to 10, and

* and *' in Formula 402 each indicate a binding site to M in Formula 401.

In one or more exemplary embodiments, in Formula 402, i) $X_{401}$ may be nitrogen, and $X_{402}$ may be carbon, or ii) $X_{401}$ and $X_{402}$ may both be nitrogen.

In one or more exemplary embodiments, when xc1 in Formula 402 is 2 or greater, two ring $A_{401}$(s) of at least two $L_{401}$(s) may optionally be bound via $T_{402}$ as a linking group, or two ring $A_{402}$(s) may optionally be bound via $T_{403}$ as a linking group (see Compounds 12 to 24 provided herein). $T_{402}$ and $T_{403}$ may each be understood by referring to the description of $T_{401}$ provided herein.

$L_{402}$ in Formula 401 may be any suitable organic ligand. For example, $L_{402}$ may be a halogen group, a diketone group (e.g., an acetylacetonate group), a carboxylic acid group (e.g., a picolinate group), —C(=O), an isonitrile group, —CN, or a phosphorus group (e.g., a phosphine group or a phosphite group), but the exemplary embodiments are not limited thereto.

In some exemplary embodiments, the green dopant may be a compound different from the red dopant. In some exemplary embodiments, at least one of the red dopant and the green dopant may be any one of the following compounds:

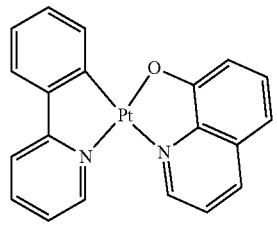
1
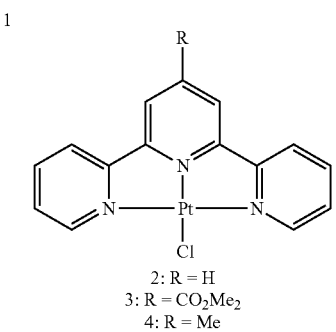
2: R = H
3: R = CO₂Me₂
4: R = Me
5
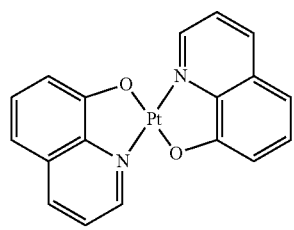
6
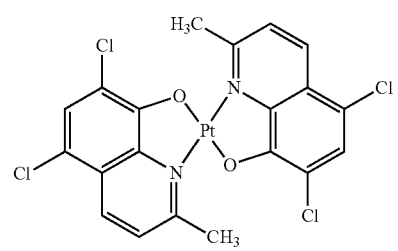
7
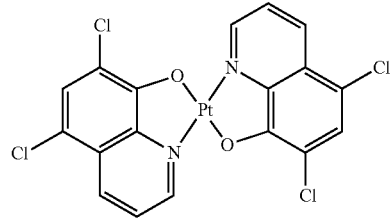
8
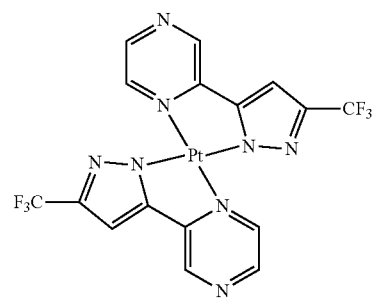
9
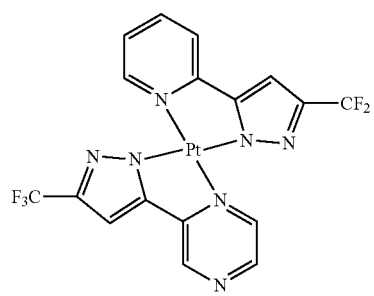
10
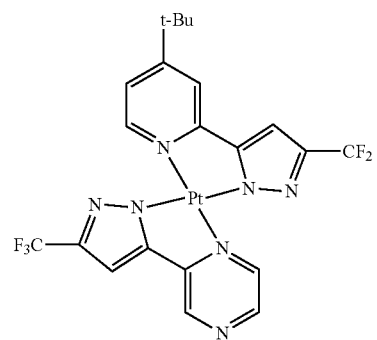

-continued
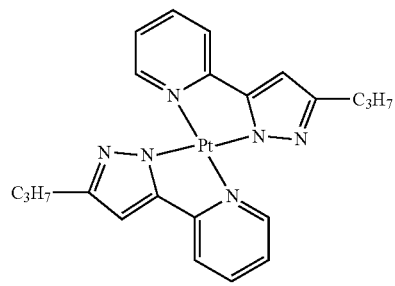
11
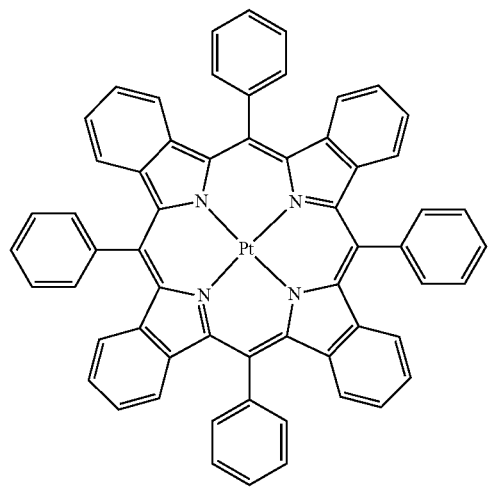
12
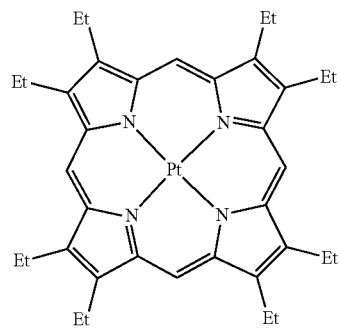
13
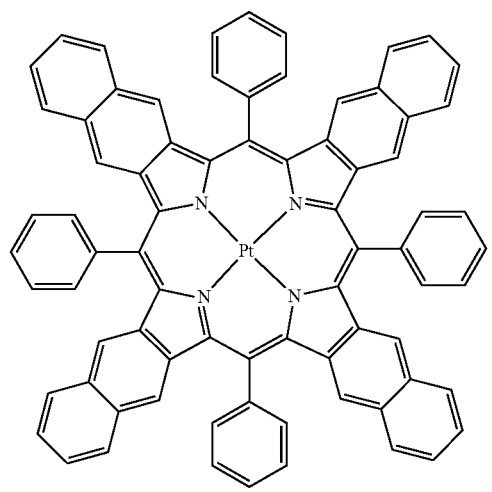
14
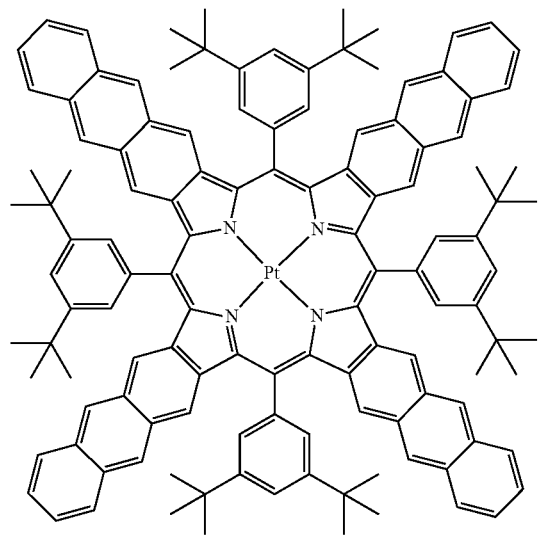
15
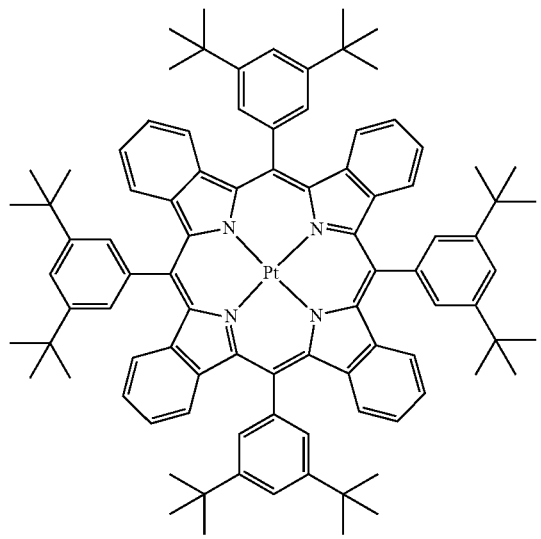
16

17
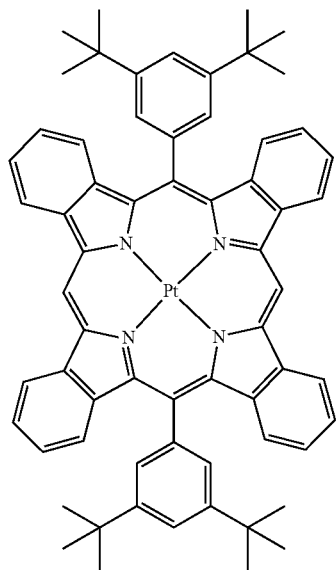
18
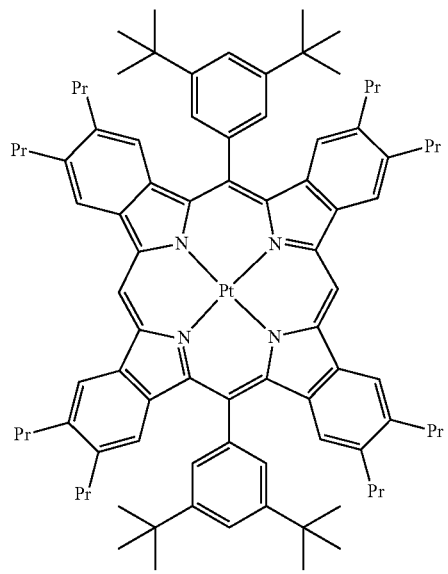
19
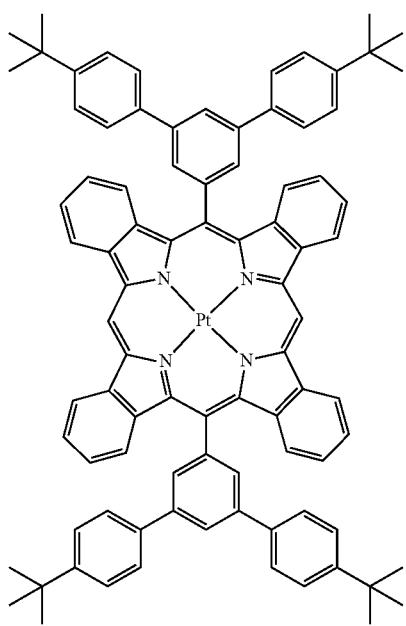
20
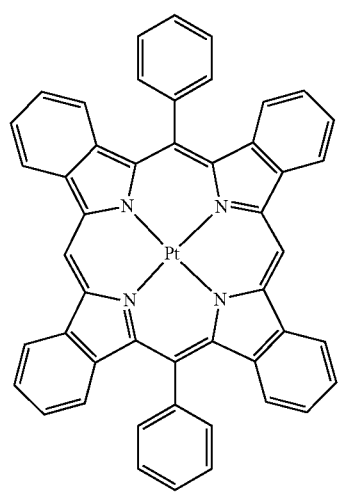

21
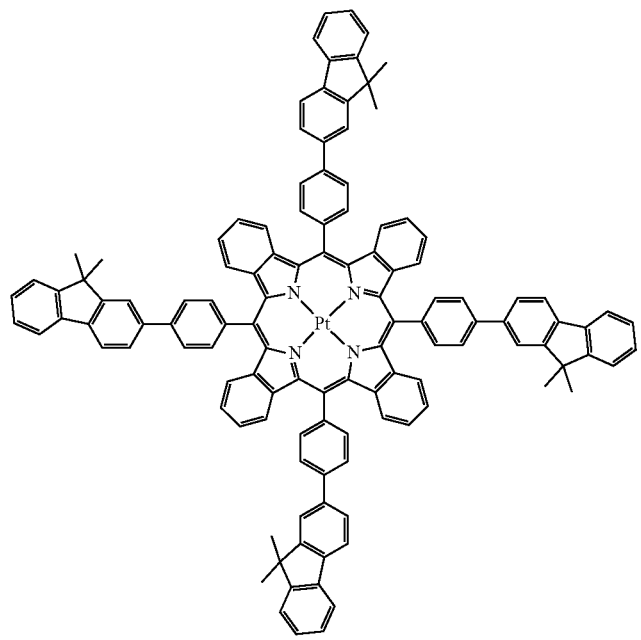
22
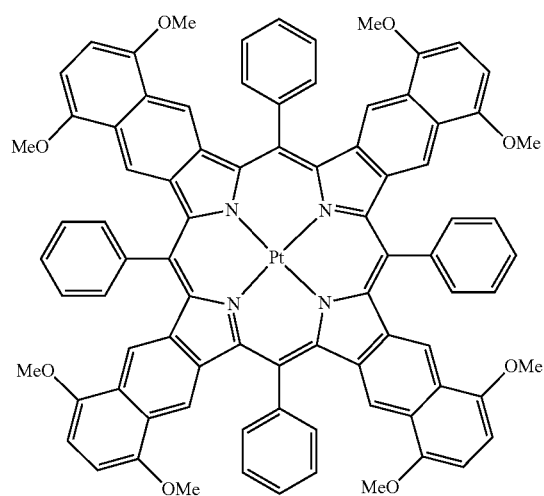
23
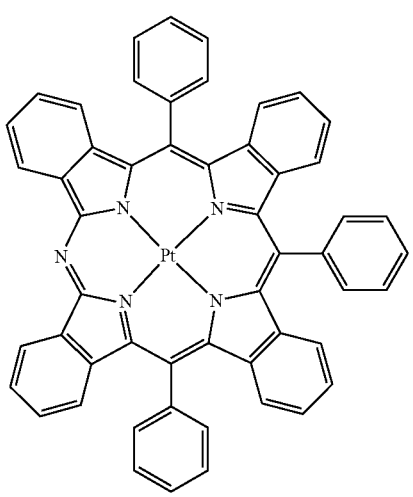
24
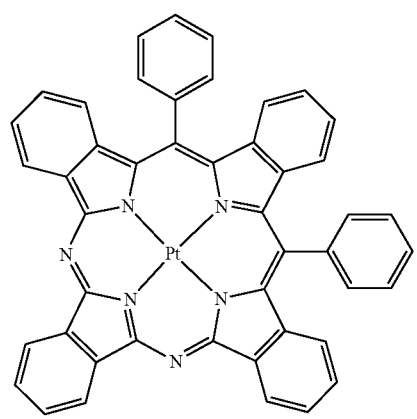
25
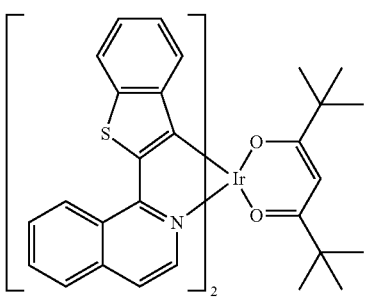

-continued
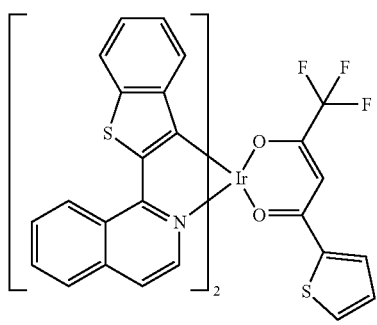
26
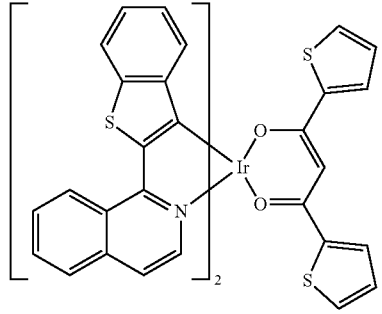
27
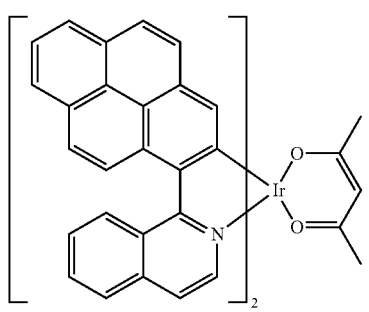
28
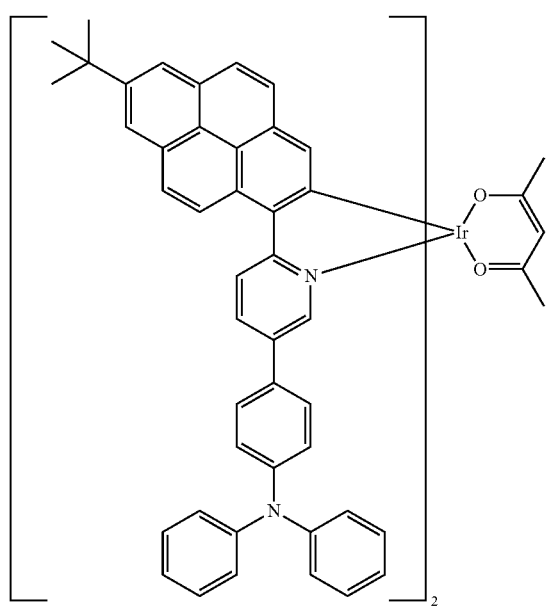
29
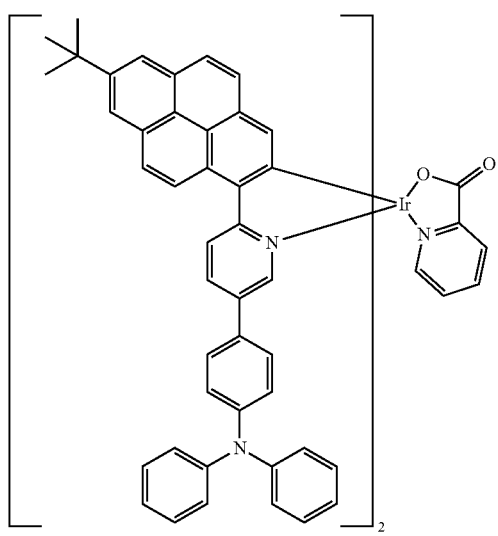
30
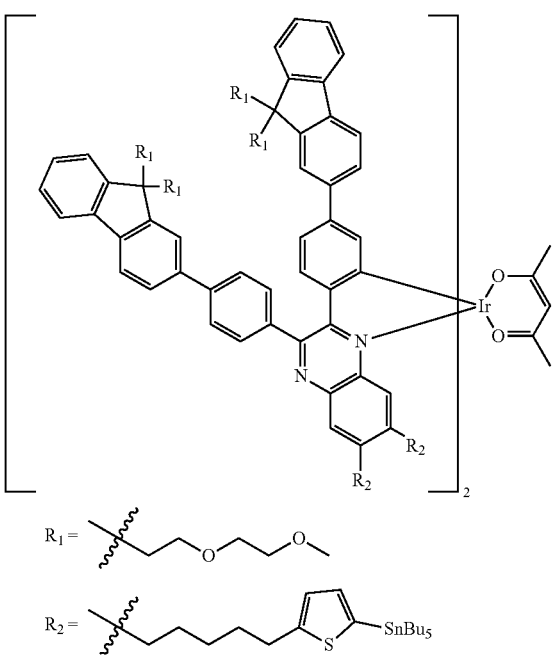
31

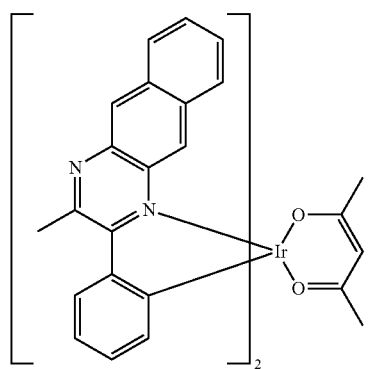
32
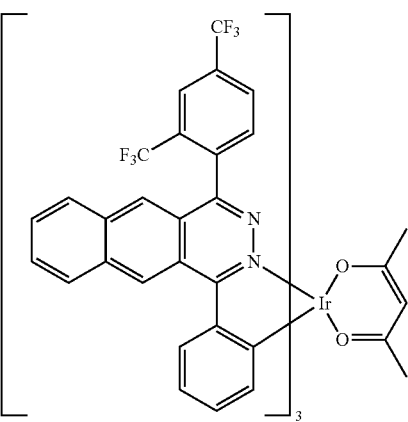
33
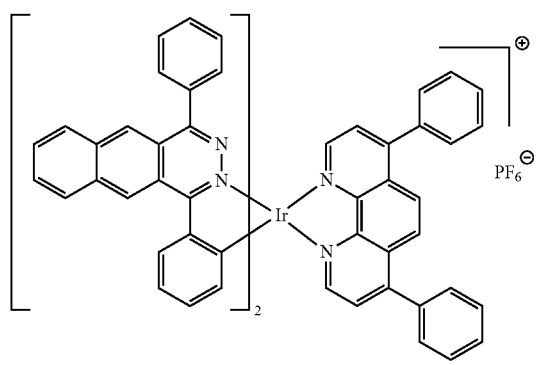
34
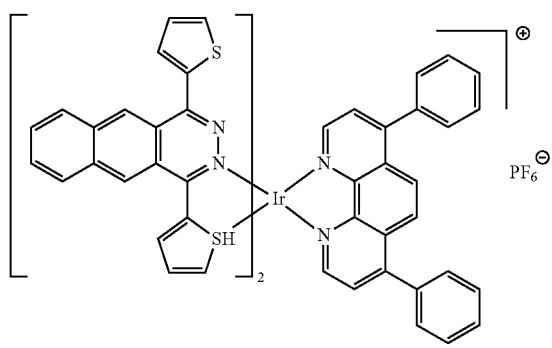
35
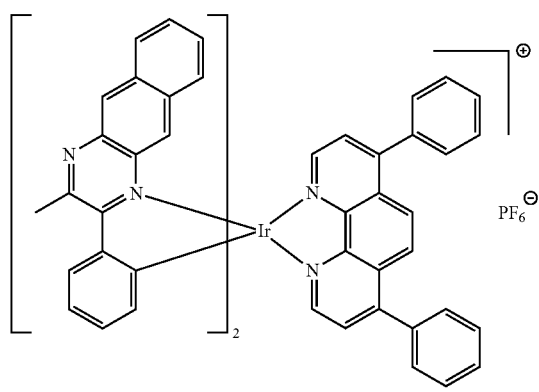
36
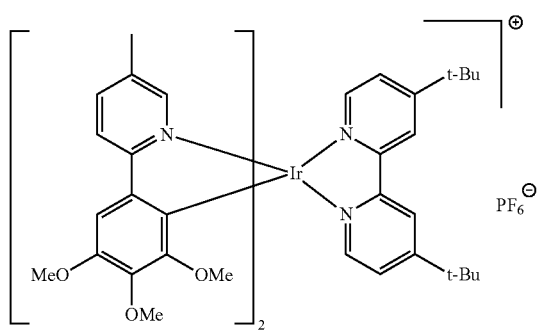
37
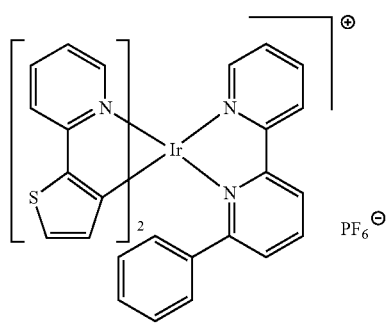
38
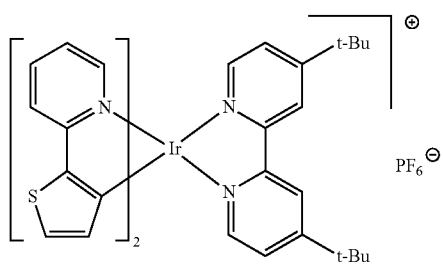
39

-continued
40
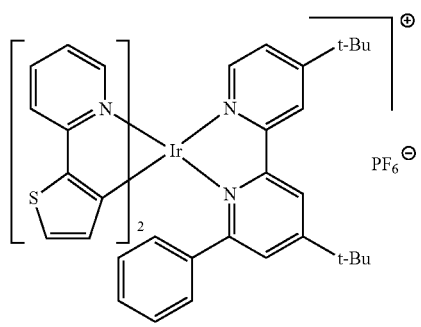
41
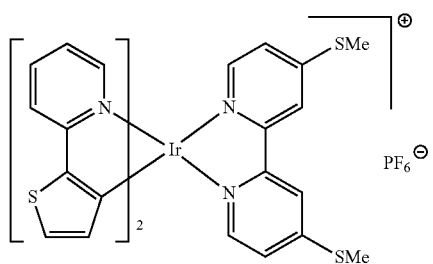
42
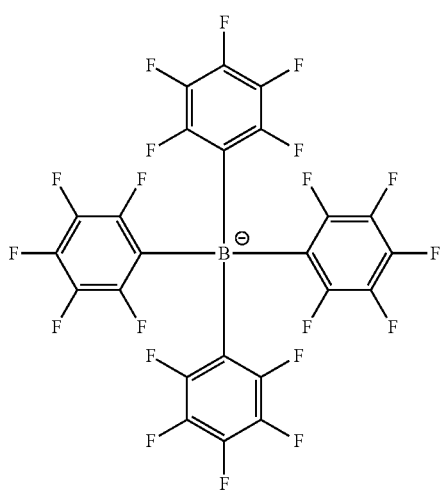
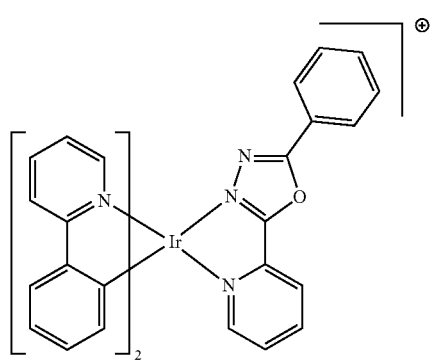
43
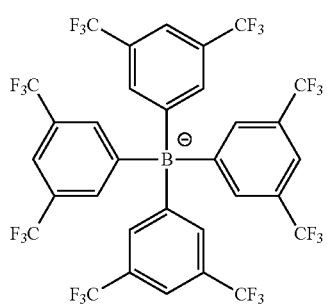
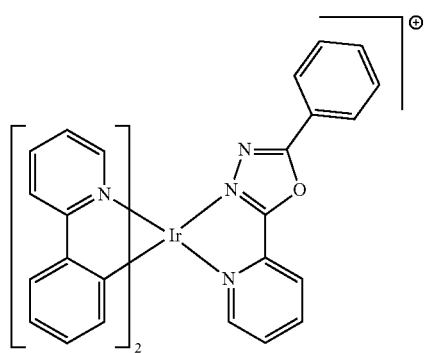
44
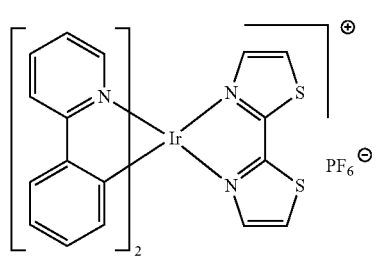
45
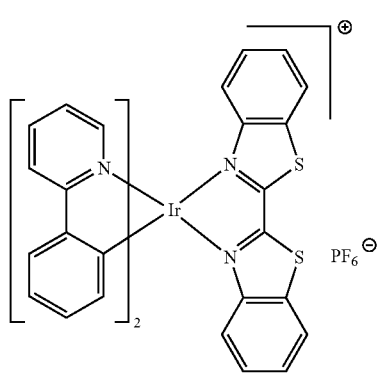

-continued
46 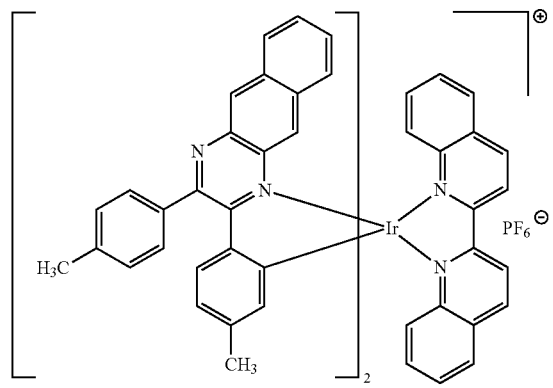
47 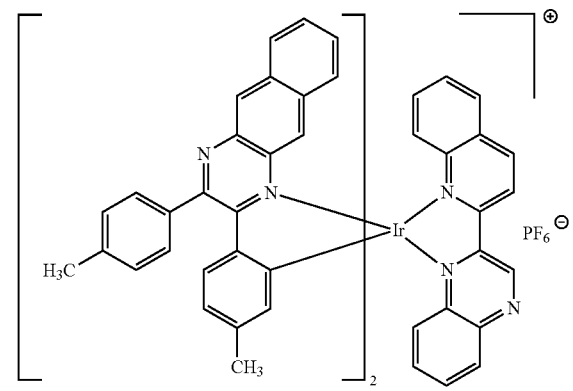
48 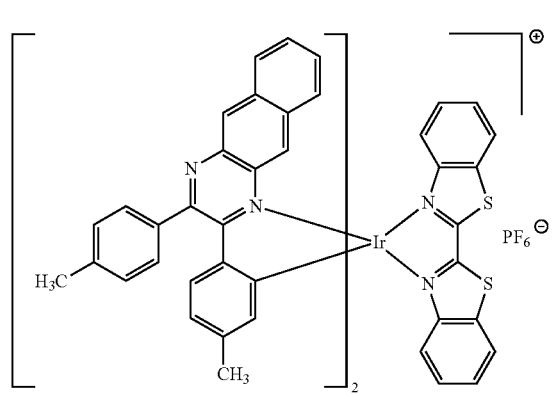
49 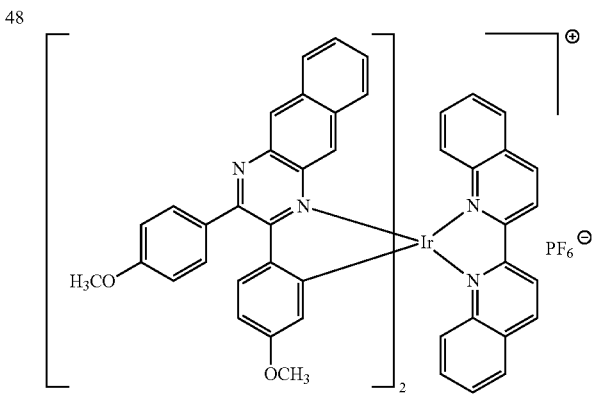
50 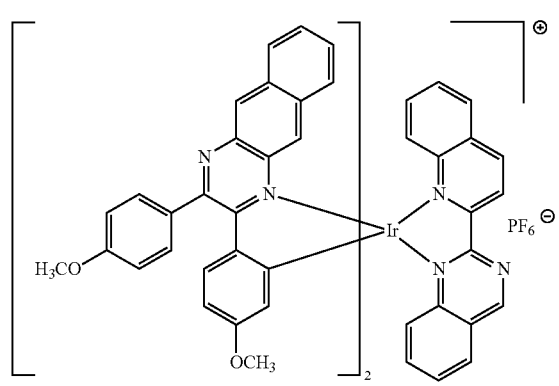
51 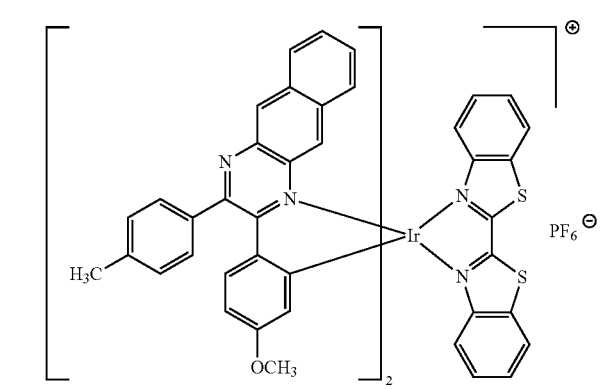
52 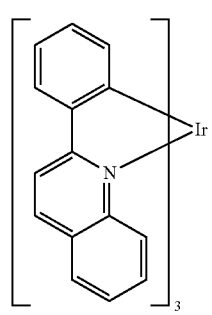
53 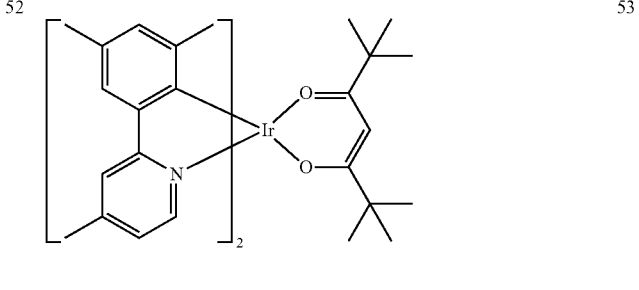

In some exemplary embodiments, the interlayer may further include an emission layer patterned into a blue emission layer. In some exemplary embodiments, a dopant included in the blue emission layer may be a metal complex including a ligand and a metal. The blue dopant may be a generally used blue dopant compound.

In some exemplary embodiments, the direction of a color-coordinate change movement according to a viewing angle may be a minimum perceptible color difference (MPCD) line direction. The expression 'direction of a color-coordinate change movement according to a viewing angle being an MPCD line direction' as used herein means that the direction of a color-coordinate change movement according to a viewing angle is in the same direction as an MPCD line direction, rather than the direction of a color-coordinate change movement according to a viewing angle being identical to the MPCD line direction.

The term 'identical direction' as used herein means that, for example, the direction of a color-coordinate change movement according to a viewing angle is an up and down direction, and the MPCD line direction is also the up and down direction. The term 'identical direction' as used herein means that, for example, the direction of a color-coordinate change movement according to a viewing angle is a left and right direction, and the MPCD line direction is also the left and right direction, or a viewing angle is an up and right direction, and the MPCD line direction is also the up and right direction.

In some exemplary embodiments, the color-coordinate change movement may be a movement at a viewing angle of greater than about 0 to about 60 degrees. The viewing angle of about 0 degrees means a case of being viewed from the front.

In some exemplary embodiments, in a light-emitting device, the first electrode may be an anode, the second electrode may be a cathode, and the interlayer located between the first electrode and the second electrode and including an emission layer patterned into a red emission layer, a green emission layer, and/or a blue emission layer according to a sub-pixel may include: i) a hole transport region between the first electrode and the emission layer and including a hole injection layer, a hole transport layer, a buffer layer, an electron blocking layer, or any combination thereof; and ii) an electron transport region between the emission layer and the second electrode and including a hole blocking layer, an electron transport layer, an electron injection layer, or any combination thereof.

An electronic apparatus may include: a thin-film transistor and the light-emitting device, wherein the thin-film transistor may include a source electrode, a drain electrode, an activation layer, and a gate electrode, and the first electrode of the light-emitting device may be electrically connected to one of the source electrode and the drain electrode of the thin-film transistor.

Description of FIG. 1

FIG. 1 is a schematic view of a light-emitting device 10 according to an embodiment. The light-emitting device 10 may include a first electrode 110, an interlayer 150, and a second electrode 190. As used herein, the structure of the light-emitting device 10 according to some exemplary embodiments and a method of manufacturing the near-infrared light-emitting diode 10 according to an embodiment will be described in connection with FIG. 1.

First Electrode 110

In FIG. 1, a substrate may be additionally located under the first electrode 110 or above the second electrode 190. The substrate may be a glass substrate or a plastic substrate.

The first electrode 110 may be formed by depositing or sputtering, onto the substrate, a material for forming the first electrode 110. When the first electrode 110 is an anode, a high work function material that may easily inject holes may be used as a material for a first electrode.

The first electrode 110 may be a reflective electrode, a semi-transmissive electrode, or a transmissive electrode. When the first electrode 110 is a transmissive electrode, a material for forming the first electrode 110 may be an indium tin oxide (ITO), an indium zinc oxide (IZO), a tin oxide ($SnO_2$), a zinc oxide (ZnO), or any combinations thereof, but the exemplary embodiments are not limited thereto. In some exemplary embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110, but the exemplary embodiments are not limited thereto.

The first electrode 110 may have a single-layered structure consisting of a single layer or a multi-layered structure including two or more layers. In some exemplary embodiments, the first electrode 110 may have a triple-layered structure of ITO/Ag/ITO, but the exemplary embodiments are not limited thereto.

Interlayer 150

The interlayer 150 may be on the first electrode 110. The interlayer 150 may include an emission layer. The interlayer 150 may further include a hole transport region between the first electrode 110 and the emission layer and an electron transport region between the emission layer and the second electrode 190. The interlayer 150 may further include metal-containing compounds such as organometallic compounds, inorganic materials such as quantum dots, and the like, in addition to various organic materials.

Hole Transport Region in Interlayer 150

The hole transport region may have i) a single-layered structure consisting of a single layer consisting of a single material, ii) a single-layered structure consisting of a single layer including a plurality of different materials, or iii) a multi-layered structure having a plurality of layers including a plurality of different materials. The hole transport region may include a hole injection layer (HIL), a hole transport layer (HTL), an emission auxiliary layer, an electron blocking layer (EBL), or a combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the first electrode 110 in each stated order, but the exemplary embodiments are not limited thereto.

The hole transport region may include the compound represented by Formula 201, the compound represented by Formula 202, or any combination thereof:

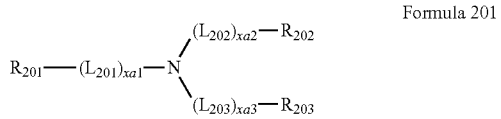

Formula 201

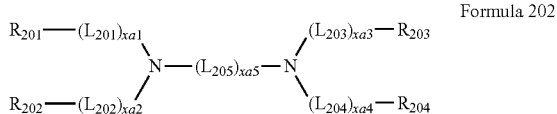

wherein, in Formulae 201 and 202, $L_{201}$ to $L_{204}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $L_{205}$ may be *—O—*', *—S—*', *—N($Q_{201}$)—*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xa1 to xa4 may each independently be 0, 1, 2, or 3 (e.g., 0, 1, or 2), xa5 may be an integer from 1 to 10 (e.g., 1, 2, 3, or 4), and $R_{201}$ to $R_{204}$ and $Q_{201}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In some exemplary embodiments, in Formula 202, $R_{201}$ and $R_{202}$ may optionally be bound via a single bond, a dimethyl-methylene group, or a diphenyl-methylene group, and $R_{203}$ and $R_{204}$ may optionally be bound via a single bond, a dimethyl-methylene group, or a diphenyl-methylene group.

In some exemplary embodiments, i) at least one of $R_{201}$ to $R_{203}$ in Formula 201 and ii) at least one of $R_{201}$ to $R_{204}$ in Formula 202 may each independently be a fluorenyl group, a spiro-bifluorenyl group, a benzofluorenyl group, an indenophenanthrenyl group, a pyridinyl group, a pyrrolyl group, a thiophenyl group, a furanyl group, an indolyl group, a benzoindolyl group, an isoindolyl group, a benzoisoindolyl group, a benzosilolyl group, a benzothiophenyl group, a benzofuranyl group, a carbazolyl group, a dibenzosilolyl group, a dibenzothiophenyl group, or a dibenzofuranyl group, each unsubstituted or substituted with at least one of deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a phenanthrenyl group, an indenyl group, a fluorenyl group, a dimethylfluorenyl group, a diphenylfluorenyl group, a spiro-bifluorenyl group, a benzofluorenyl group, a dimethyl benzofluorenyl group, a diphenylbenzofluorenyl group, an indenophenanthrenyl group, a dimethylindenophenanthrenyl group, a diphenylindenophenanthrenyl group, a pyridinyl group, a pyrrolyl group, a thiophenyl group, a furanyl group, an indolyl group, a phenylindolyl group, a benzoindolyl group, a phenylbenzoindolyl group, an isoindolyl group, a phenylisoindolyl group, a benzoisoindolyl group, a phenylbenzoisoindolyl group, a benzosilolyl group, a dimethylbenzosilolyl group, a diphenylbenzosilolyl group, a benzothiophenyl group, a benzofuranyl group, a carbazolyl group, a phenylcarbazolyl group, a biphenylcarbazolyl group, a dibenzosilolyl group, a dimethyl dibenzosilolyl group, a diphenyldibenzosilolyl group, a dibenzothiophenyl group, and a dibenzofuranyl group, but the exemplary embodiments are not limited thereto.

In some exemplary embodiments, the compound represented by Formula 201 or 202 may include at least one carbazole group. In some exemplary embodiments, the compound represented by Formula 201 may not include a carbazole group.

In some exemplary embodiments, the compound represented by Formula 201 may be represented by Formula 201A-1:

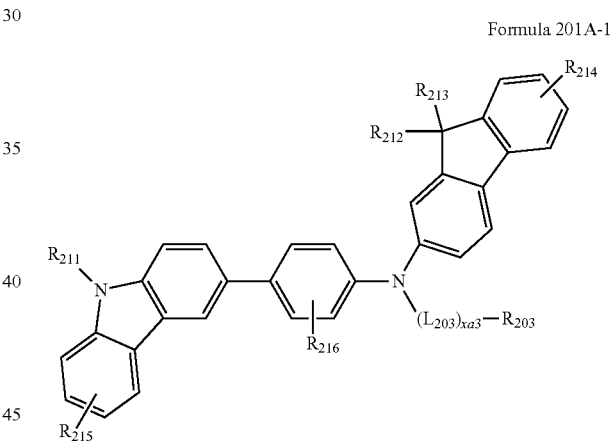

Formula 201A-1 wherein, in Formula 201A-1, L203, xa3, and R203 in Formula 201A-1 may respectively be understood by referring to the descriptions of L203, xa3, and R203 provided herein, and R211 to R216 may each independently be hydrogen, deuterium, —F, —Cl, —Br, —I, a hydroxyl group, a cyano group, a nitro group, a C1-C20 alkyl group, a C1-C20 alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a C1-C10 alkyl group, a phenyl group substituted with —F, a naphthyl group, a phenanthrenyl group, an indenyl group, a fluorenyl group, a dimethylfluorenyl group, a diphenylfluorenyl group, a spiro-bifluorenyl group, a benzofluorenyl group, a dimethylbenzofluorenyl group, a diphenylbenzofluorenyl group, an indenophenanthrenyl group, a dimethylindenophenanthrenyl group, a diphenylindenophenanthrenyl group, a pyridinyl group, a pyrrolyl group, a thiophenyl group, a furanyl group, an indolyl group, a phenylindolyl group, a benzoindolyl group, a phenylbenzoindolyl group, an isoindolyl group, a phenylisoindolyl group, a benzoisoindolyl group, a phenylbenzoisoindolyl group, a benzosilolyl group, a dimethylbenzosilolyl group, a diphenylbenzosilolyl group, a benzothiophenyl group, a benzofuranyl group, a carbazolyl group, a phenylcarbazolyl group, a biphenylcarbazolyl group, a dibenzosilolyl group, a dimethyldibenzosilolyl group, a diphenyldibenzosilolyl group, a dibenzothiophenyl group, or a dibenzofuranyl group.

In some exemplary embodiments, the hole transport region may include one of Compounds HT1 to HT44 and 4,4',4''-tris[phenyl(m-tolyl)amino]triphenylamine (m-MTDATA), 1-N,1-N-bis[4-(diphenylamino)phenyl]-4-N,4-N-diphenylbenzene-1,4-diamine (TDATA), 4,4',4''-tris[2-naphthyl(phenyl)amino]triphenylamine (2-TNATA), N,N'-di(1-naphthyl)-N,N'-diphenyl-(1,1'-biphenyl)-4,4'-diamine (NPB or NPD), N4,N4'-di(naphthalen-2-yl)-N4,N4'-diphenyl-[1,1'-biphenyl]-4,4'-diamine (p-NPB), N,N'-bis(3-methylphenyl)-N,N'-diphenylbenzidine (TPD), N,N'-bis(3-methylphenyl)-N,N'-diphenyl-9,9-spirobifluorene-2,7-diamine (spiro-TPD), N2,N7-di-1-naphthalenyl-N2,N7-diphenyl-9,9'-spirobi[9H-fluorene]-2,7-diamine (spiro-NPB), N, N,N'-di(1-naphthyl)-N,N'-2,2'dimethyldiphenyl-(1,1'-biphenyl)-4,4'-diamine (methylated-NPB), 4,4'-cyclohexylidenebis[N,N-bis(4-methylphenyl)benzenamine] (TAPC), N, N, N',N'-tetrakis(3-methylphenyl)-3,3'-dimethylbenzidine (HMTPD), 4,4',4''-tris(N-carbazolyl)triphenylamine (TCTA), polyaniline/dodecylbenzenesulfonic acid (PANT/DBSA), poly(3,4-ethylenedioxythiophene)/poly(4-styrenesulfonate) (PEDOT/PSS), polyaniline/camphorsulfonic acid (PANT/CSA), polyaniline/poly(4-styrenesulfonate (PANT/PSS), or any combination thereof, but the exemplary embodiments are not limited thereto:

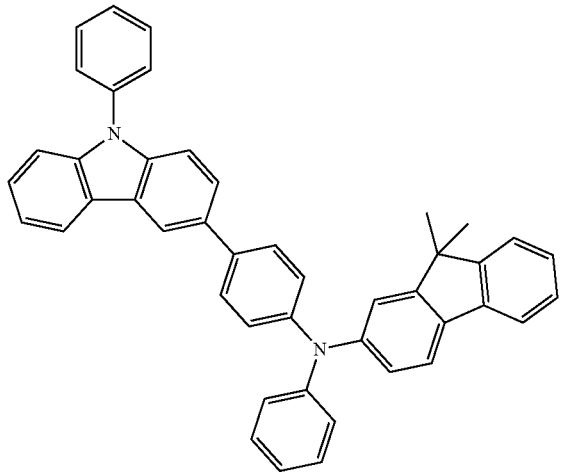

HT1

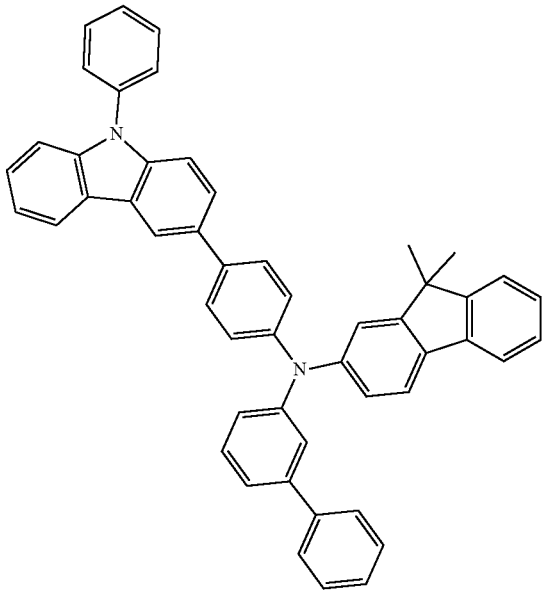

HT2

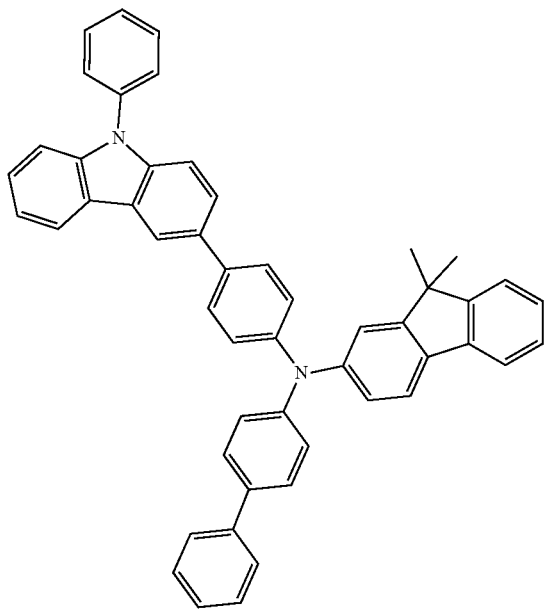

HT3

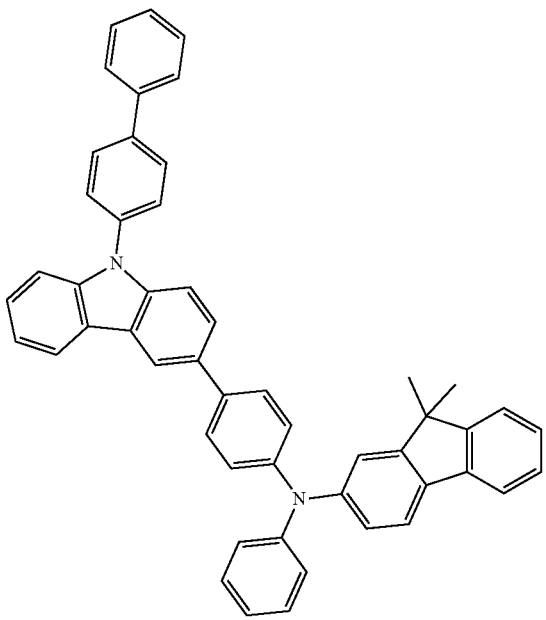

HT4

HT5
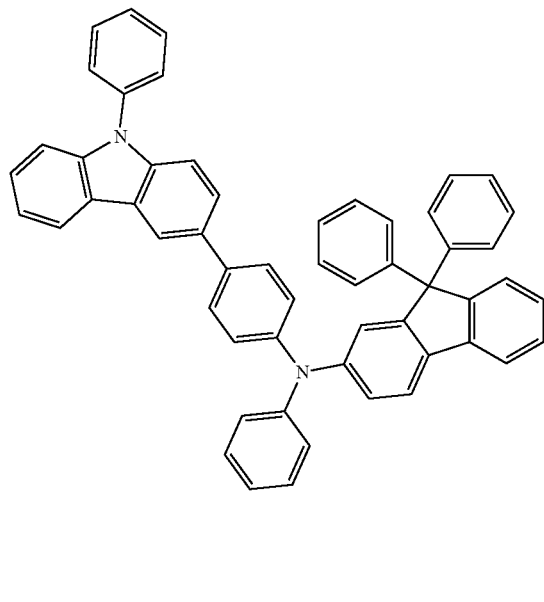
HT6
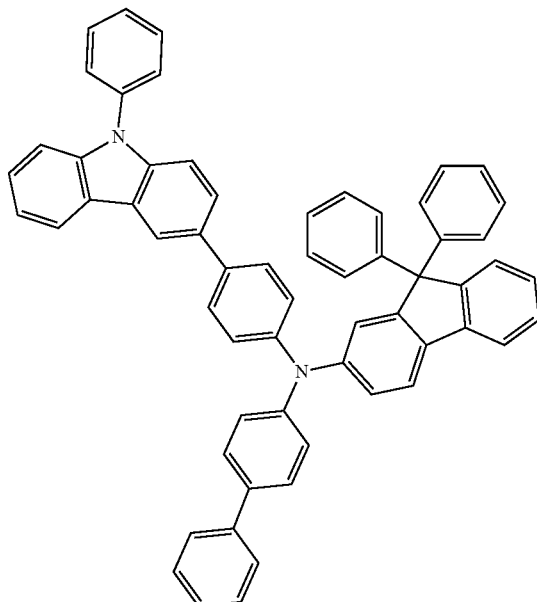
HT7
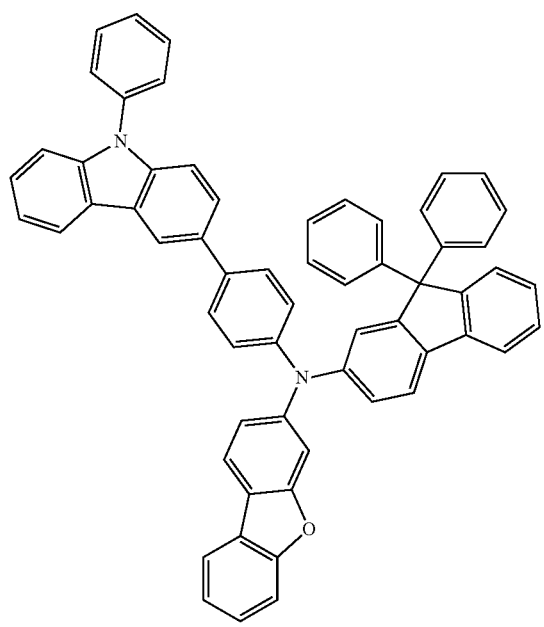
HT8
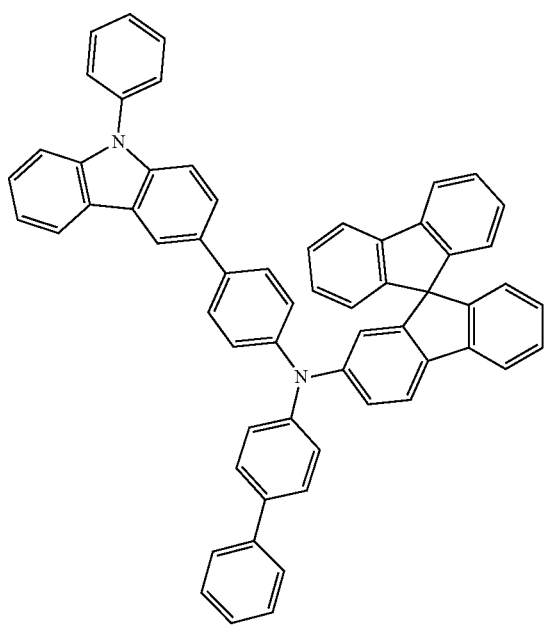

HT9
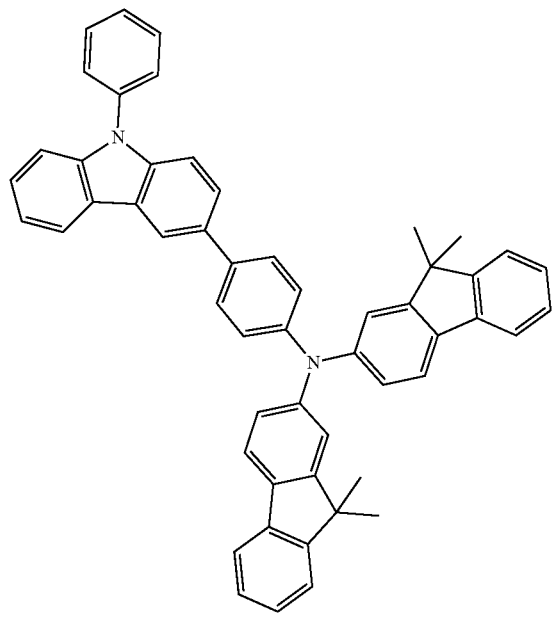
HT10
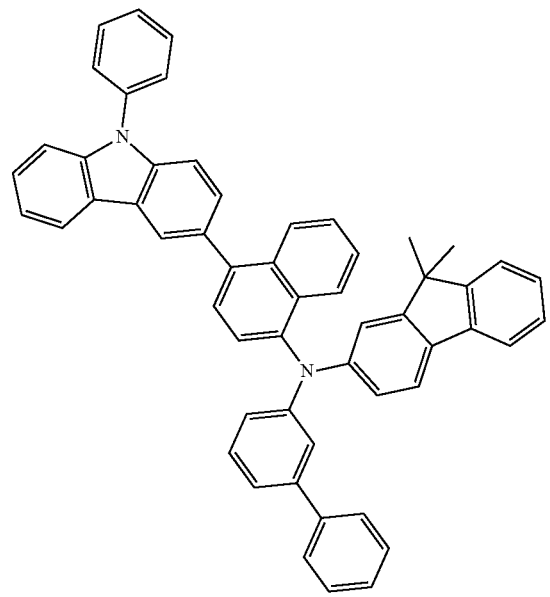
HT11
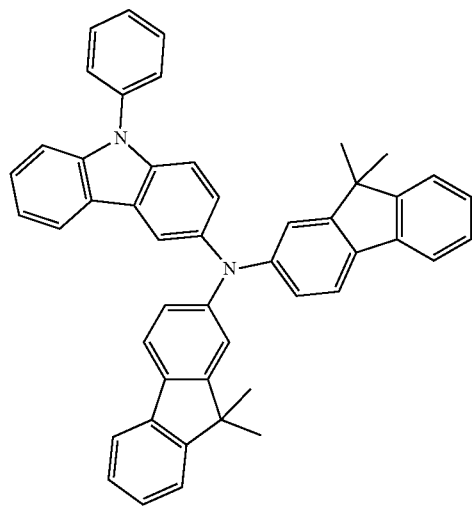
HT12
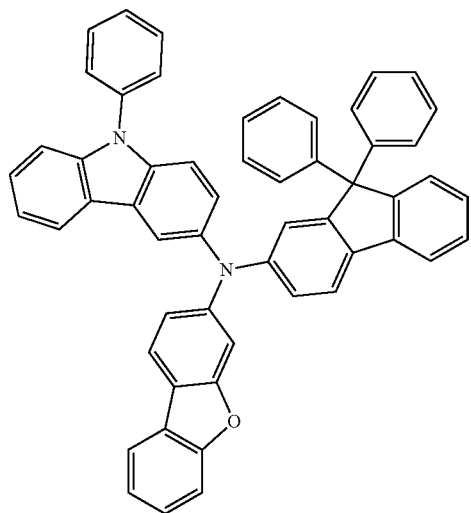

-continued
HT13
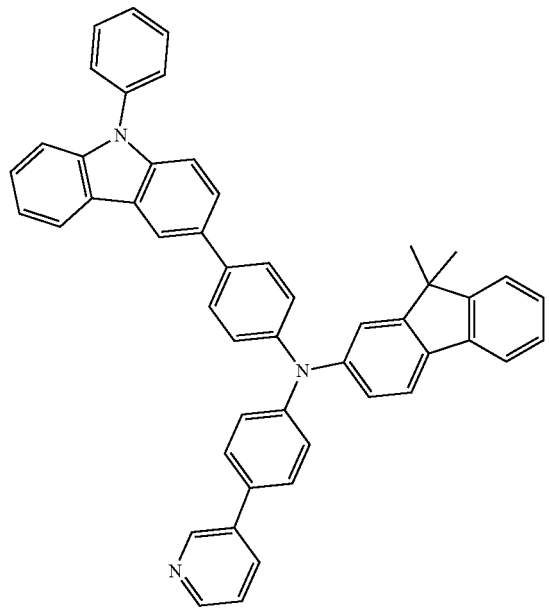
HT14
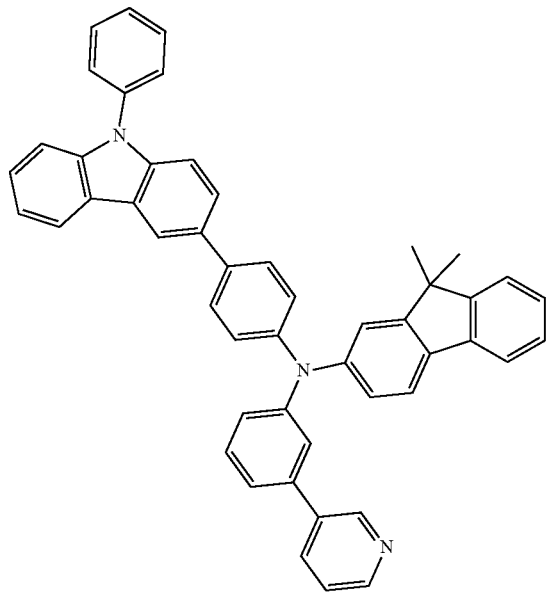
HT15
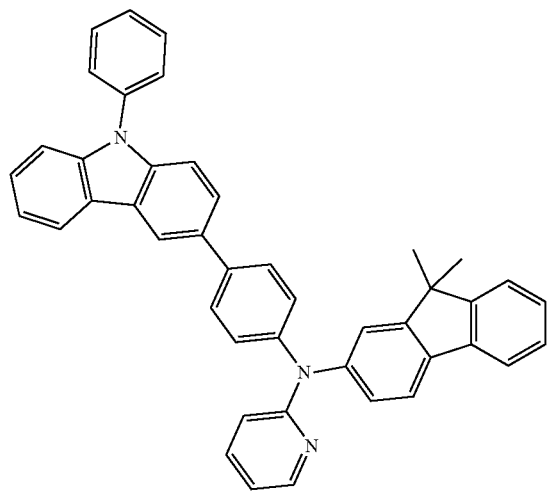
HT16
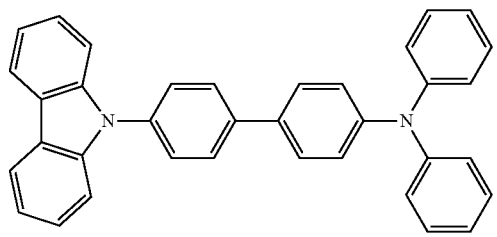
HT17
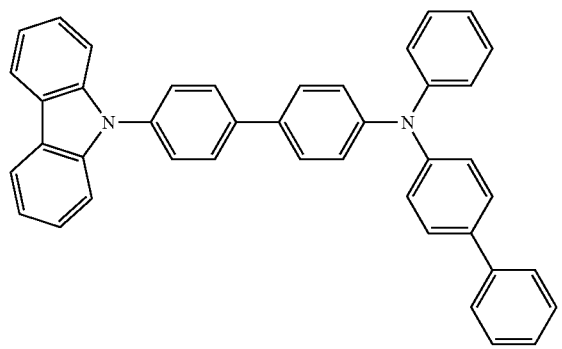
HT18
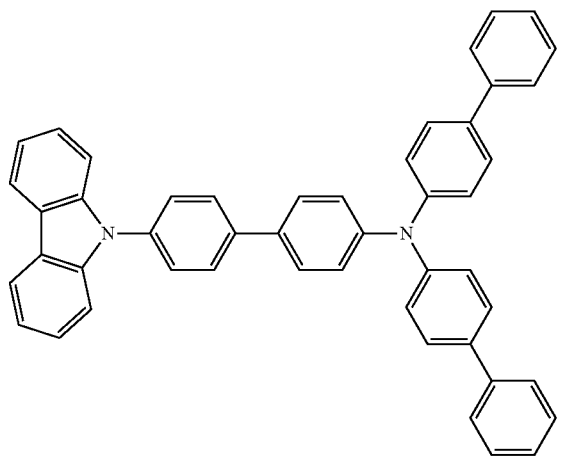

-continued
HT19
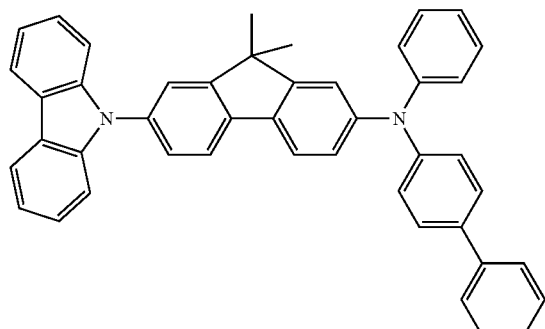
HT20
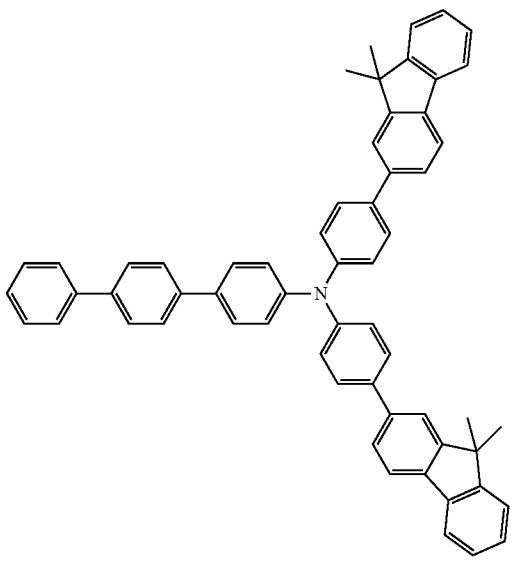
HT21
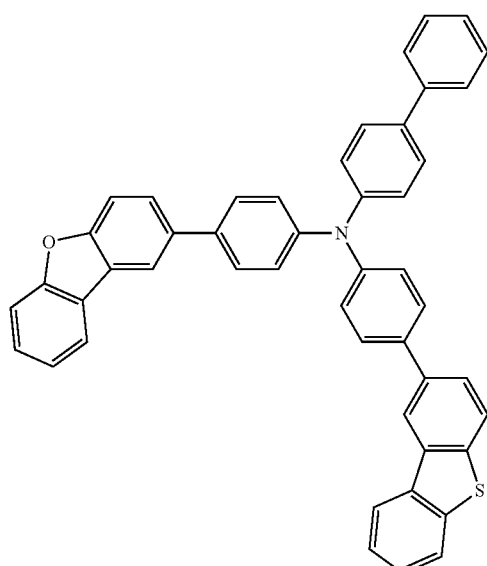
HT22
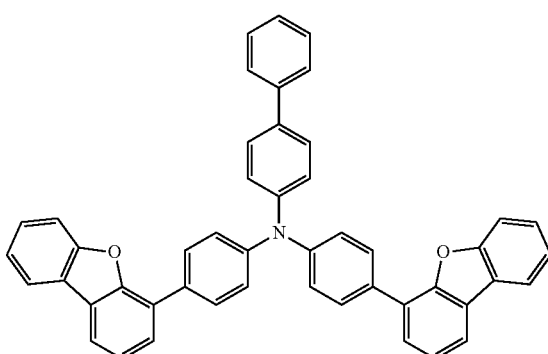
HT23
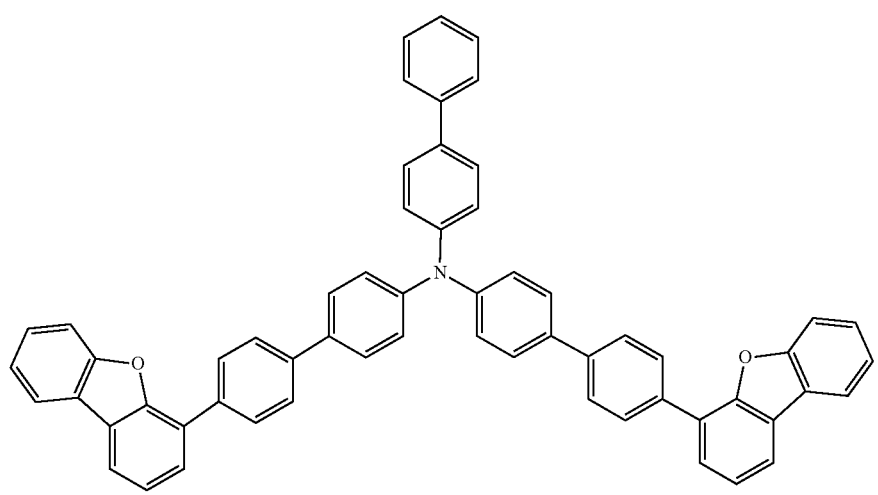

-continued
HT24
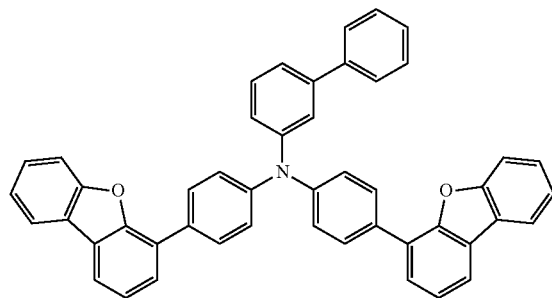
HT25
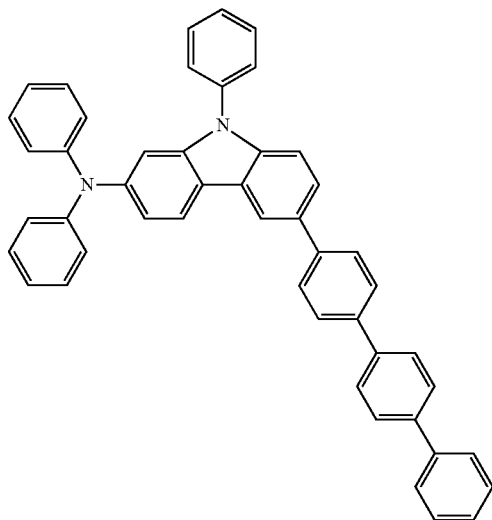
HT26
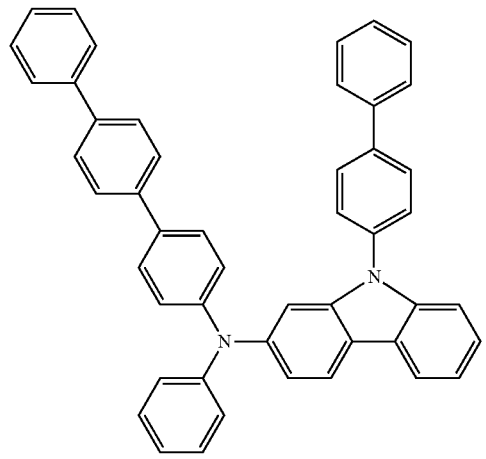
HT27
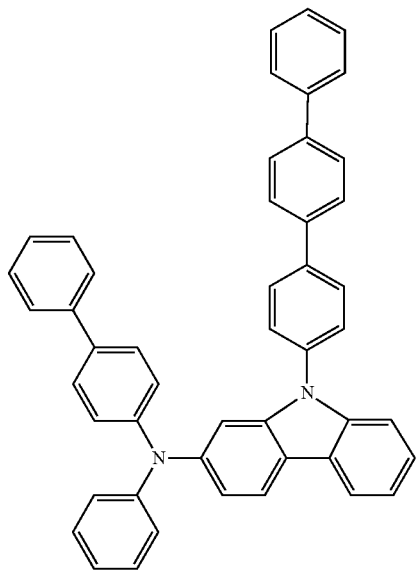
HT28
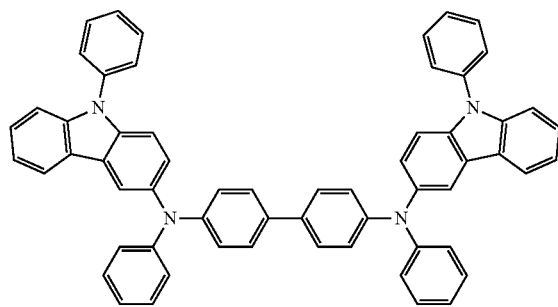
HT29
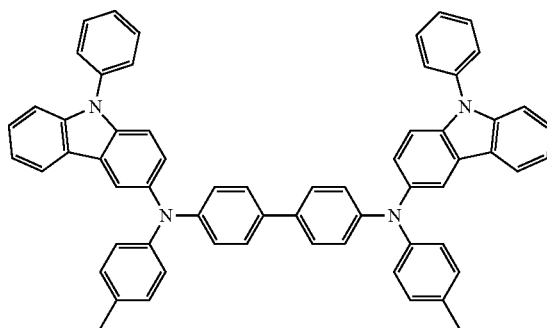

-continued
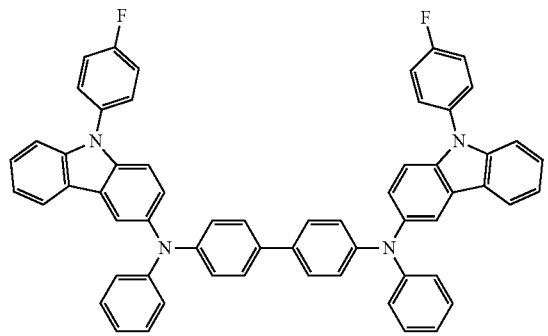
HT30
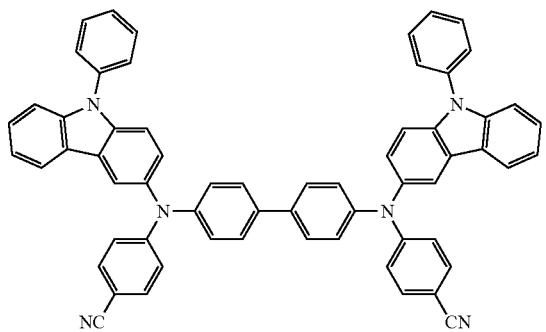
HT31
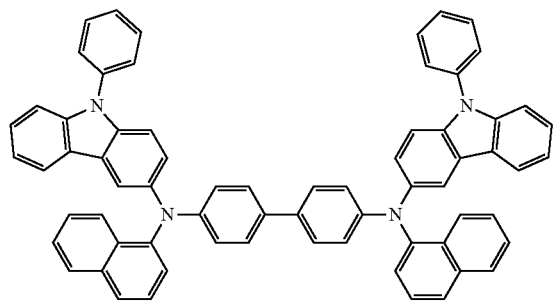
HT32
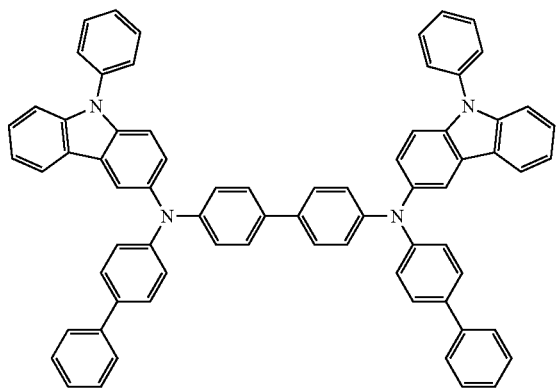
HT33
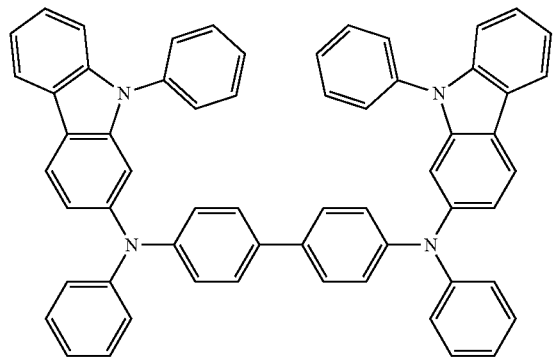
HT34
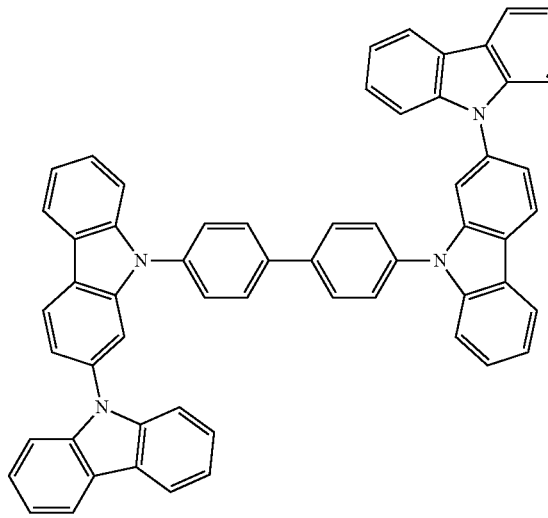
HT35

-continued
HT36
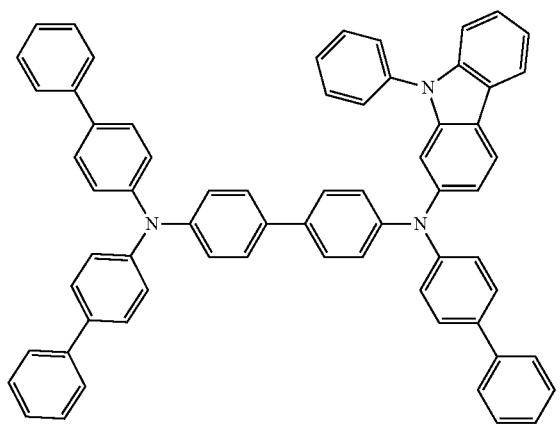
HT37
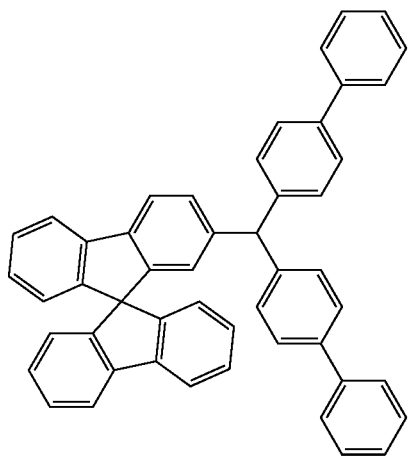
HT38
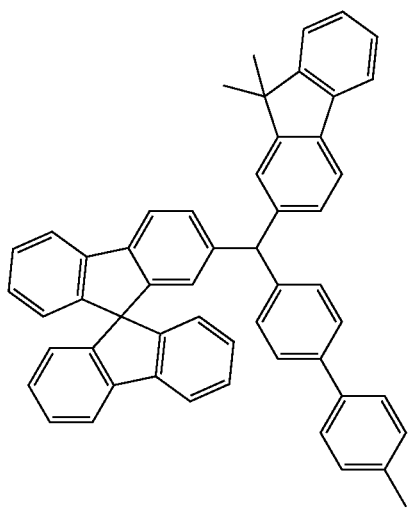
HT39
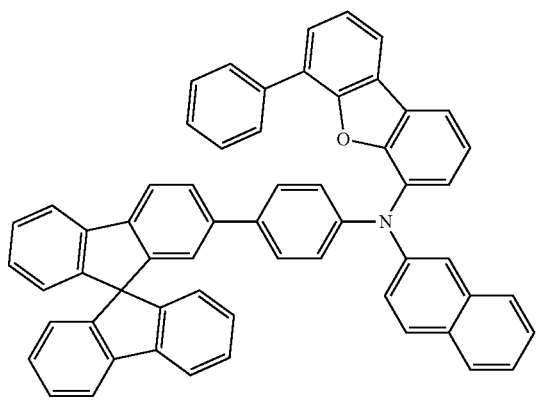
HT40
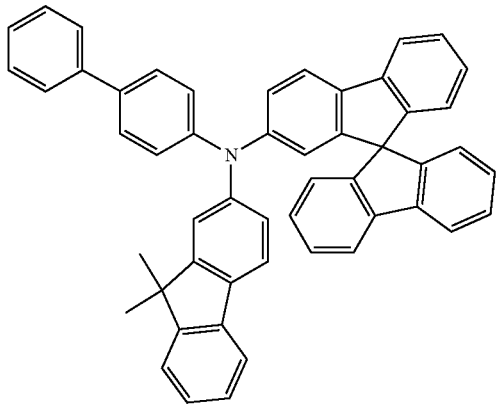
HT41
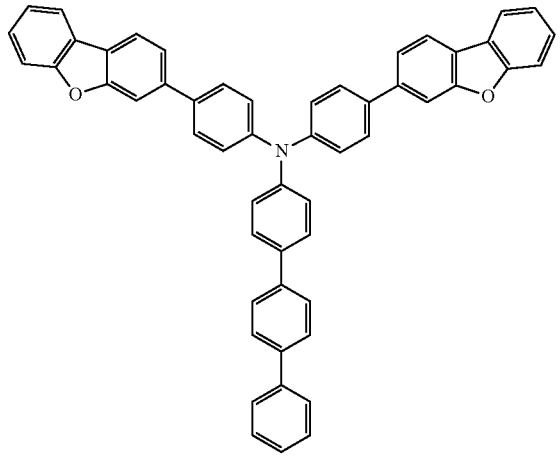

-continued
HT42
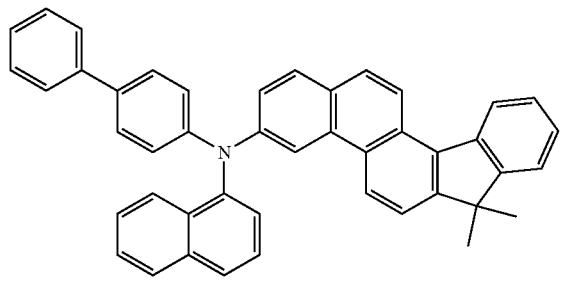
HT43
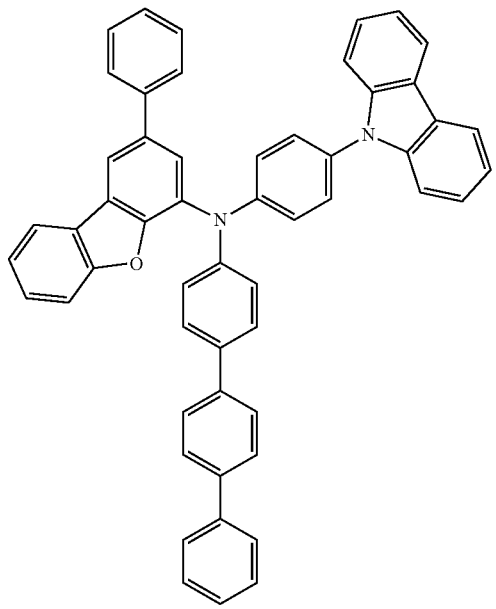
HT44
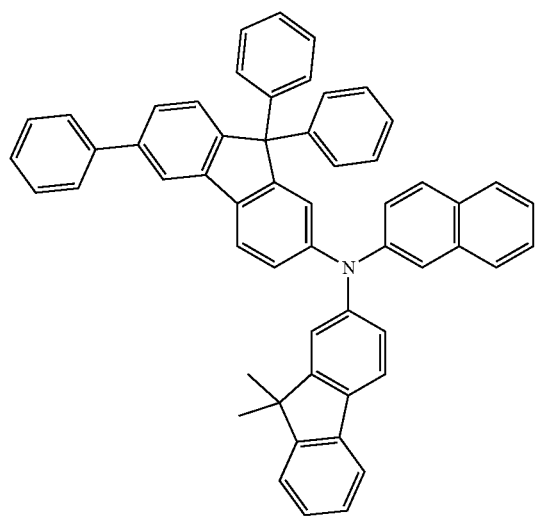
m-MTDATA
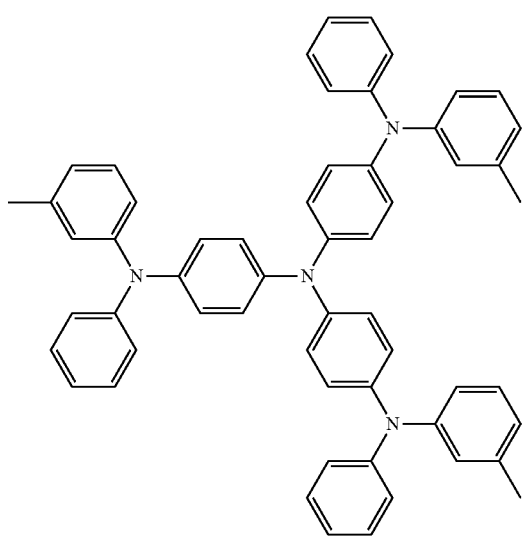

-continued
TDATA
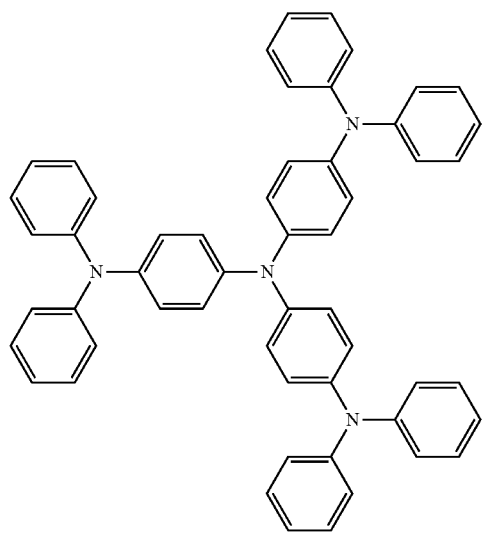
2-TNATA
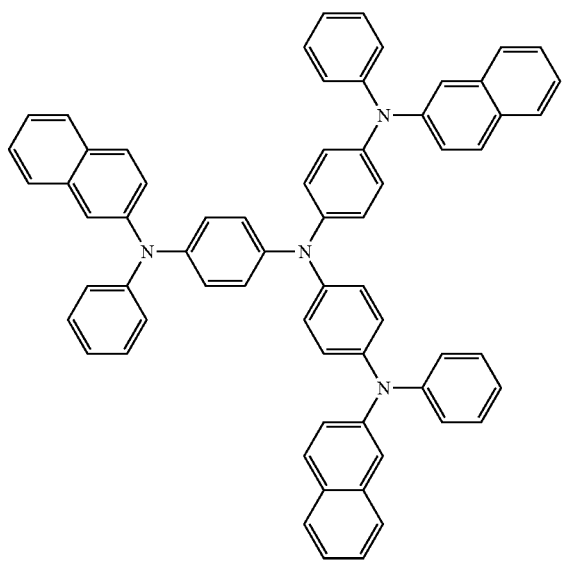
NPB
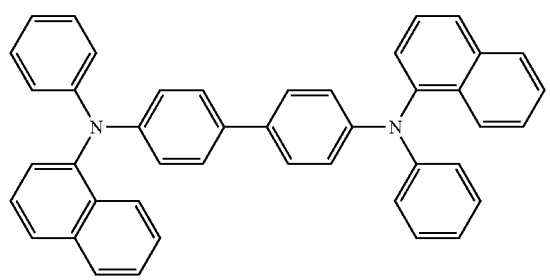
β-NPB
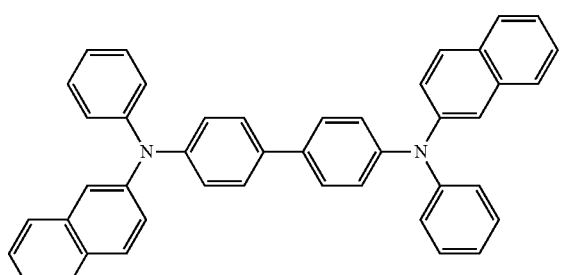
TPD
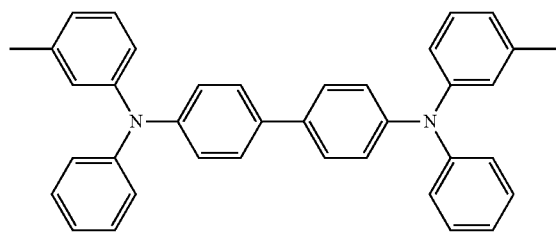
Spiro-TPD
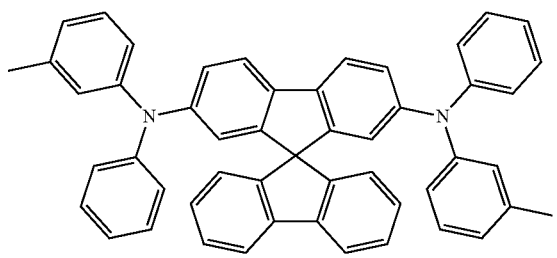
Spiro-NPB
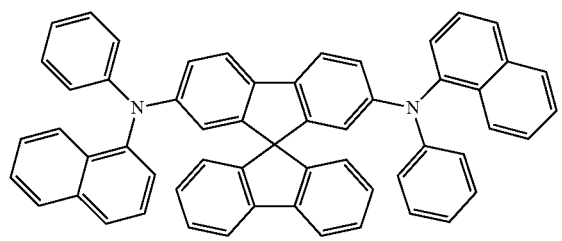
methylated-NPD
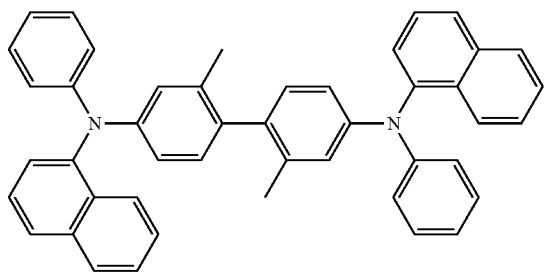

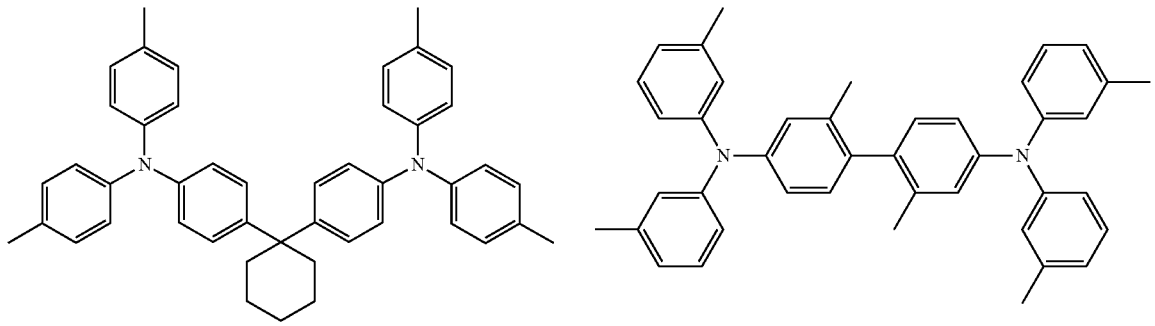

TAPC                                       HMTPD

The thickness of the hole transport region may be in a range of about 100 (Angstroms) Å to about 10,000 Å, and in some exemplary embodiments, about 100 Å to about 1,000 Å. When the hole transport region includes at least one selected from a hole injection layer and a hole transport layer, the thickness of the hole injection layer may be in a range of about 100 Å to about 9,000 Å, and in some exemplary embodiments, about 100 Å to about 1,000 Å, and the thickness of the hole transport layer may be in a range of about 50 Å to about 2,000 Å, and in some exemplary embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

The emission auxiliary layer may increase light emission efficiency by compensating for an optical resonance distance according to the wavelength of light emitted by an emission layer. The electron blocking layer may reduce or eliminate the flow of electrons from an electron transport region. The emission auxiliary layer and the electron blocking layer may include the aforementioned materials.

p-Dopant

The hole transport region may include a charge generating material as well as the aforementioned materials to improve conductive properties of the hole transport region. The charge generating material may be substantially homogeneously or non-homogeneously dispersed in the hole transport region. The charge generating material may include, for example, a p-dopant.

In some exemplary embodiments, a LUMO energy level of the p-dopant may be about −3.5 eV or less. The p-dopant may be a quinone derivative, a metal oxide, a compound containing a cyano group, or any combination thereof, but the exemplary embodiments are not limited thereto.

In some exemplary embodiments, the p-dopant may include: a quinone derivative such as tetracyanoquinodimethane (TCNQ) or 2,3,5,6-tetrafluoro-7,7,8,8-tetracyanoquinodimethane (F4-TCNQ); a metal oxide, such as tungsten oxide or molybdenum oxide; a cyano group-containing compound such as 1,4,5,8,9,12-hexaazatriphenylene-hexacarbonitrile (HAT-CN); a compound represented by Formula 221, or any combination thereof, but the exemplary embodiments are not limited thereto:

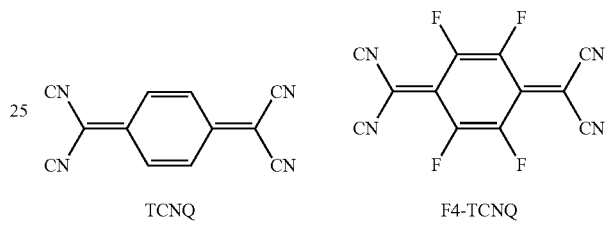

TCNQ                F4-TCNQ

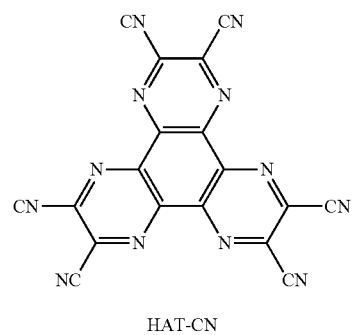

HAT-CN

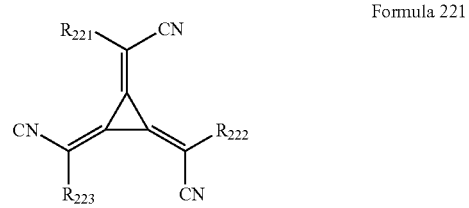

Formula 221 wherein, in Formula 221, $R_{221}$ to $R_{223}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, wherein at least one of $R_{221}$ to $R_{223}$ may each independently be a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group, each substituted with a cyano group; —F; —Cl; —Br; —I; a $C_1$-$C_{20}$ alkyl group substituted with at least one cyano group; a $C_1$-$C_{20}$ alkyl group substituted with at least —F; a $C_1$-$C_{20}$ alkyl group substituted with at least —Cl; a $C_1$-$C_{20}$ alkyl group substituted with at least —Br; a $C_1$-$C_{20}$ alkyl group substituted with at least —I; or any combination thereof.

Emission Layer in Interlayer 150

When the light-emitting device 10 is a full color light-emitting device, the emission layer may be patterned into a red emission layer, a green emission layer, and/or a blue emission layer, according to a sub-pixel. In one or more exemplary embodiments, the emission layer may have a stacked structure. The stacked structure may include two or more layers selected from a red emission layer, a green emission layer, and a blue emission layer. The two or more layers may be in direct contact with each other. In some exemplary embodiments, the two or more layers may be separated from each other. In one or more exemplary embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

The emission layer may include a host and a dopant. The dopant may be a phosphorescent dopant, a fluorescent dopant, or any combination thereof. The amount of the dopant in the emission layer may be in a range of about 0.01 parts to about 15 parts by weight based on 100 parts by weight of the host, but the exemplary embodiments are not limited thereto. In some exemplary embodiments, the emission layer may include a quantum dot.

The thickness of the emission layer may be in a range of about 100 Å to about 1,000 Å, and in some exemplary embodiments, about 200 Å to about 600 Å. When the thickness of the emission layer is within any of these ranges, improved luminescence characteristics may be obtained without a substantial increase in driving voltage.

Host in Emission Layer

The host may include a compound represented by Formula 301:

$$[Ar_{301}]xb11 - [(L_{301})xb1 - R_{301}]xb21 \quad \text{Formula 301}$$

wherein, in Formula 301,

Ar301 may be selected from a substituted or unsubstituted $C_5$-$C_{60}$ carbocyclic group and a substituted or unsubstituted $C_1$-$C_{60}$ heterocyclic group, xb11 may be 1, 2, or 3, $L_{301}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xb1 may be 0, 1, 2, 3, 4, or 5, $R_{301}$ may be deuterium, —F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), or —P(═O)($Q_{301}$)($Q_{302}$), xb21 may be 1, 2, 3, 4, or 5, and $Q_{301}$ to $Q_{303}$ may each be understood by referring to the descriptions of $Q_1$ provided herein.

In some exemplary embodiments, when xb11 in Formula 301 is 2 or greater, at least two $A_{301}$(s) may be bound via a single bond.

In some exemplary embodiments, the host may include a compound represented by Formula 301-1, a compound represented by Formula 301-2, or any combination thereof:

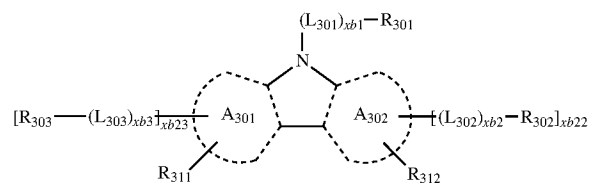

Formula 301-1

Formula 301-2

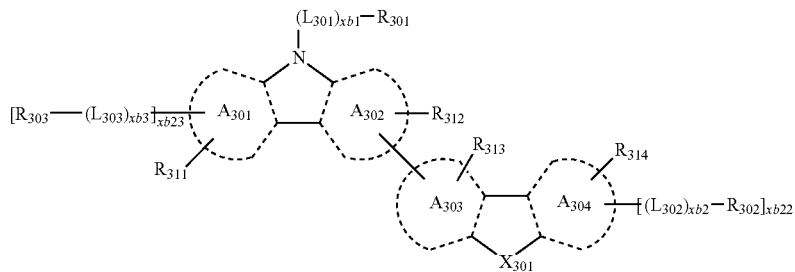

wherein, in Formulae 301-1 to 301-2,
ring $A_{301}$ to ring $A_{304}$ may each independently be a $C_5$-$C_{60}$ carbocyclic group or a $C_1$-$C_{60}$ heterocyclic group,
$X_{301}$ may be O, S, N-[$(L_{304})_{xb4}$-$R_{304}$], C($R_{304}$)($R_{305}$), or Si($R_{304}$)($R_{305}$),
xb22 and xb23 may each independently be 0, 1, or 2,
$L_{301}$, xb1, and $R_{301}$ may respectively be understood by referring to the descriptions of $L_{301}$, xb1, and $R_{301}$ provided above,
$L_{302}$ to $L_{304}$ may each be understood by referring to the description of $L_{301}$ provided herein,
xb2 to xb4 may each be understood by referring to the descriptions of xb1 provided herein, and $R_{302}$ to $R_{305}$ and $R_{311}$ to $R_{314}$ may each be understood by referring to the descriptions of $R_{301}$ provided herein.

In some exemplary embodiments, the host may include an alkaline earth metal complex. For example, the host may include a Be complex (e.g., Compound H55), a Mg complex, a Zn complex, or any combination thereof.

In some exemplary embodiments, the host may include one of Compounds H1 to H120, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof, but the exemplary embodiments are not limited thereto:

H1

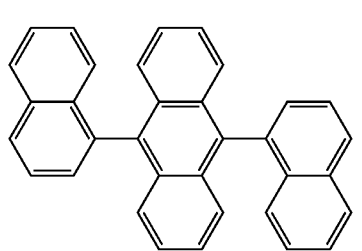

H2

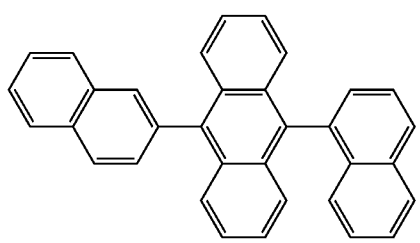

H3

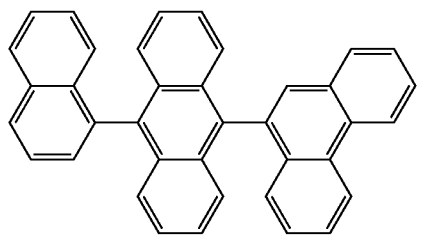

H4

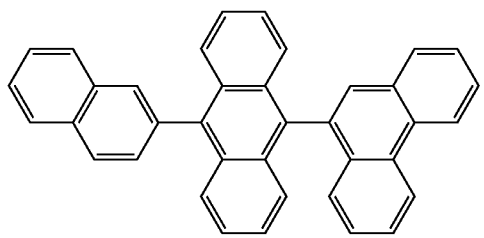

H5

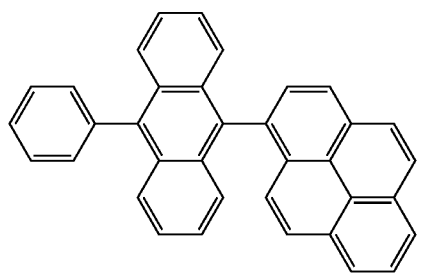

H6

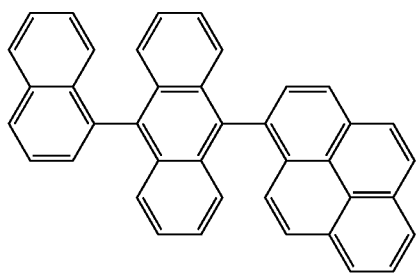

-continued
H7
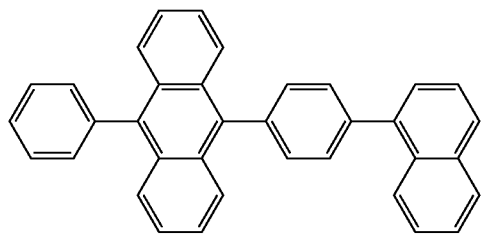
H8
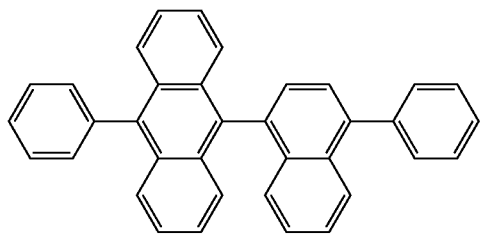
H9
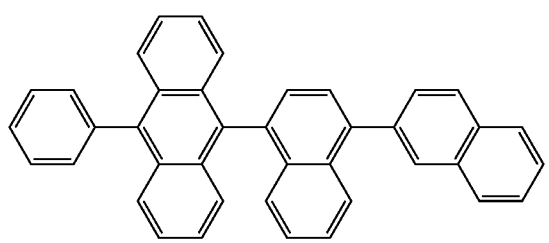
H10
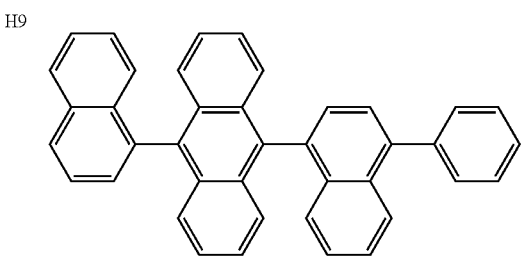
H11
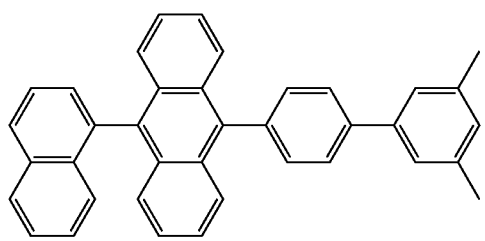
H12
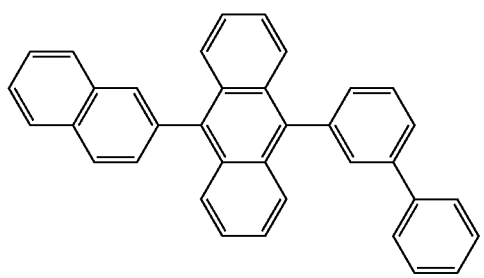
H13
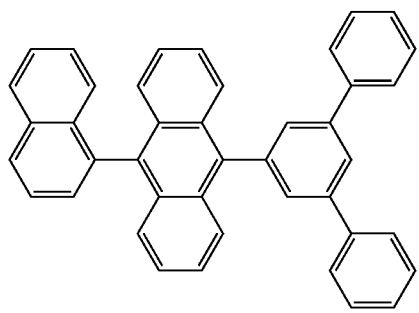
H14
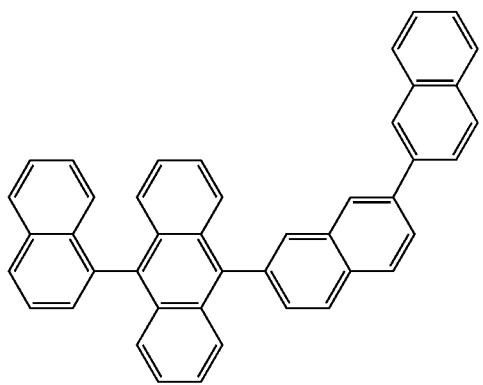
H15
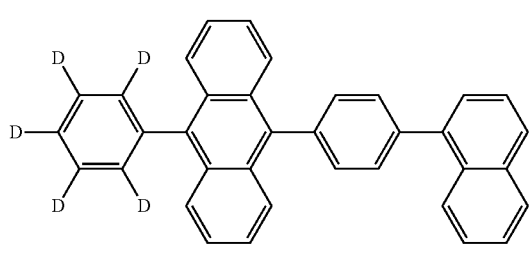
H16
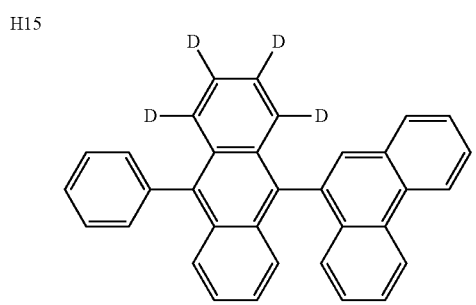

-continued
| H17 | H18 |
|---|---|
| 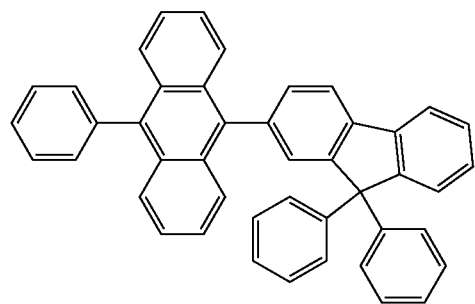 | 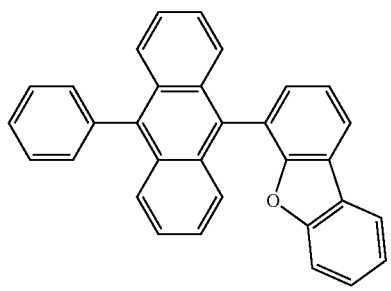 |
| H19 | H20 |
| 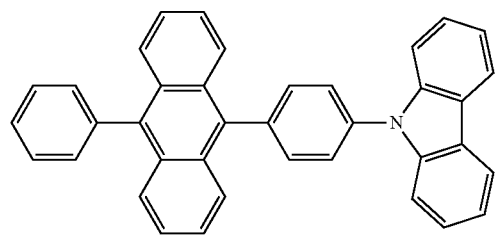 | 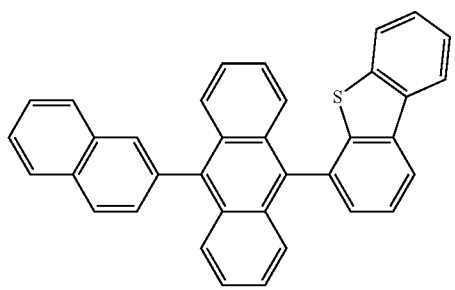 |
| H21 | H22 |
| 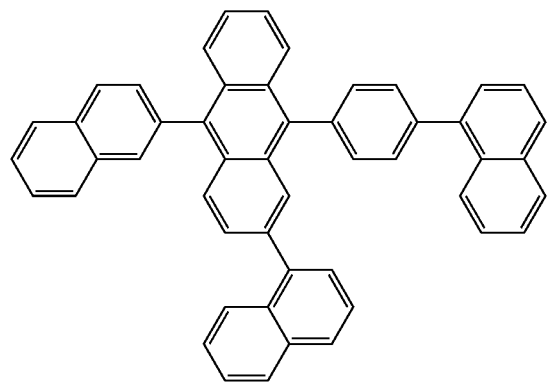 | 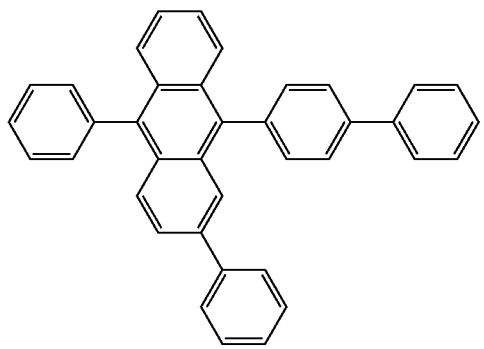 |
| H23 | H24 |
| 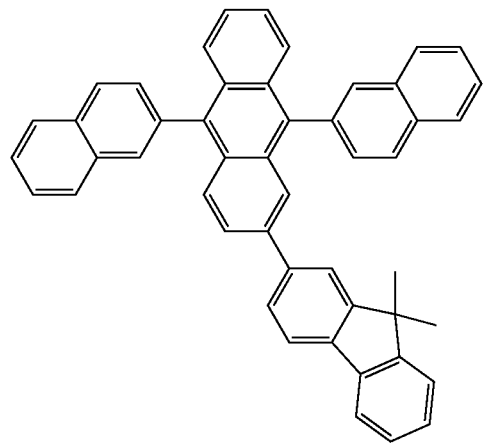 | 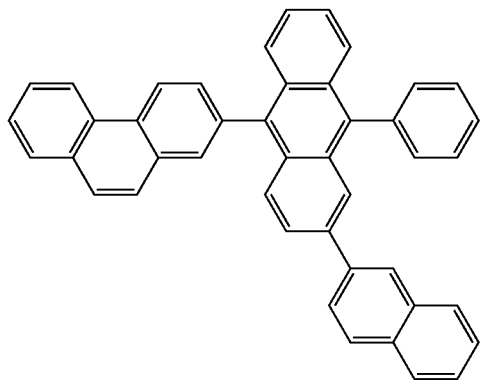 |

-continued
H25
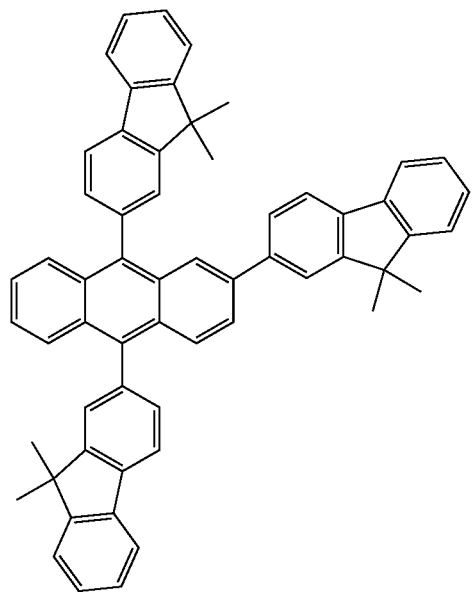
H26
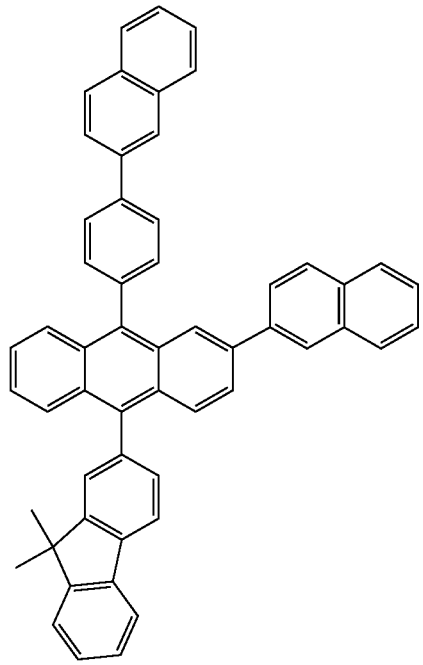
H27
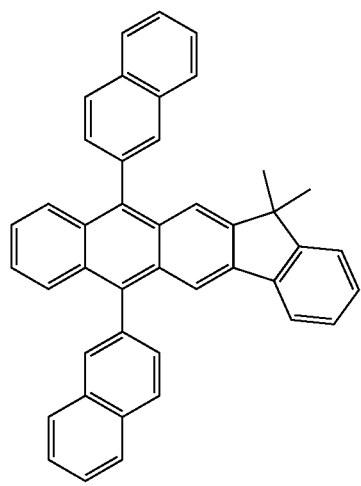
H28
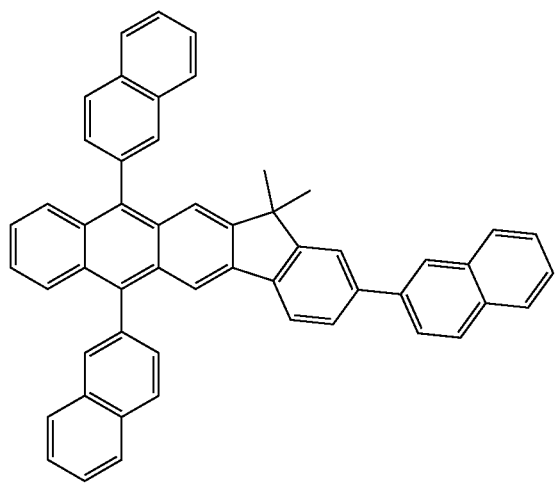
H29
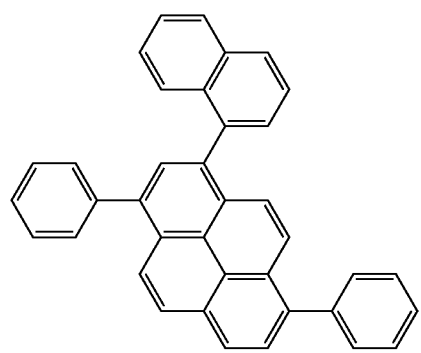
H30
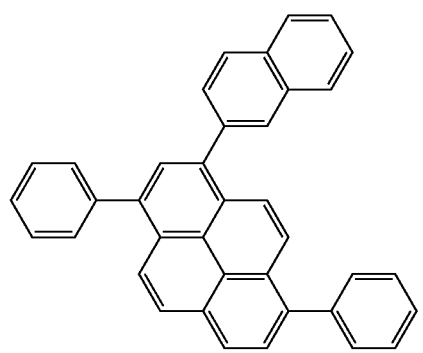

-continued
H31
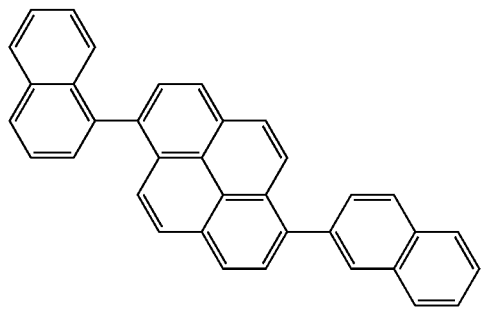
H32
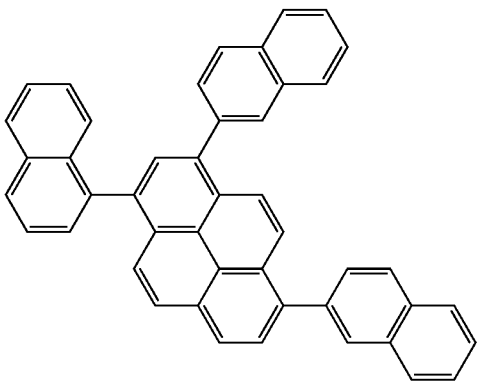
H33
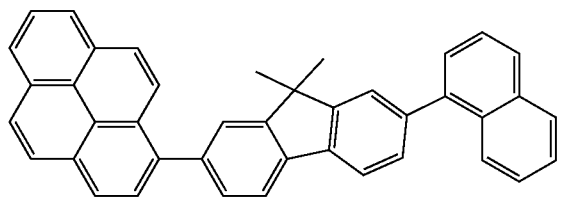
H34
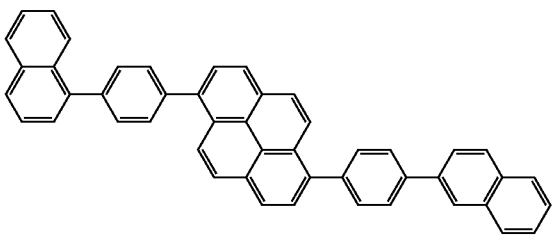
H35
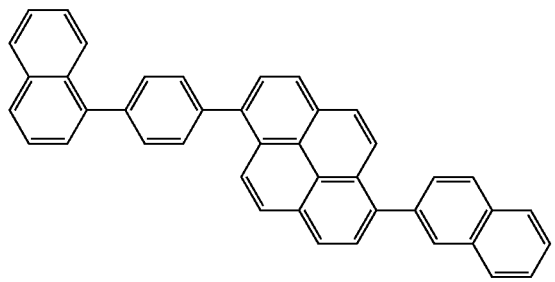
H36
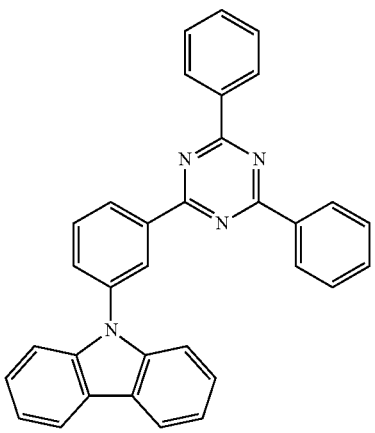
H37
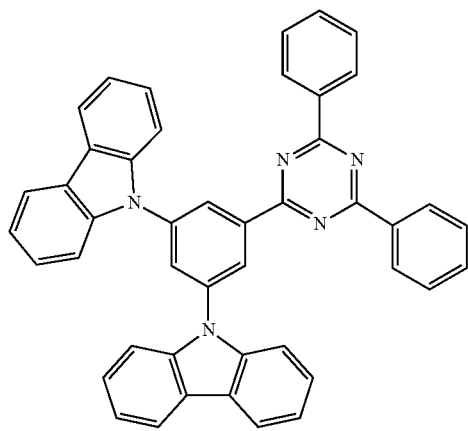
H38
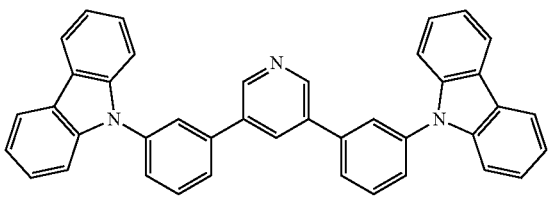

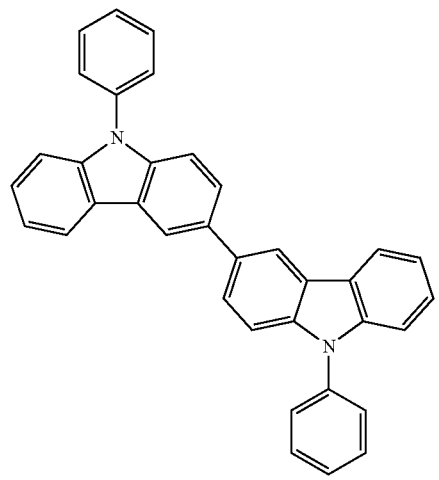
H39
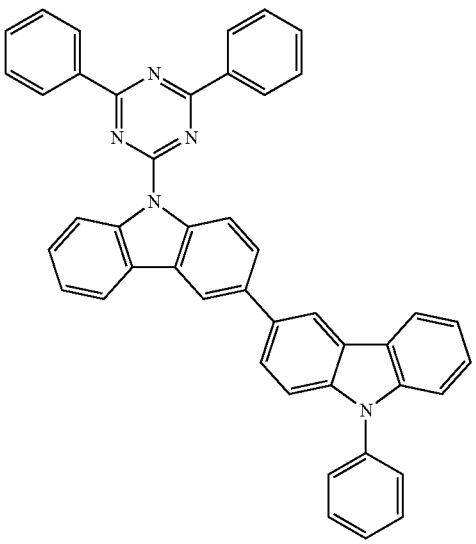
H40
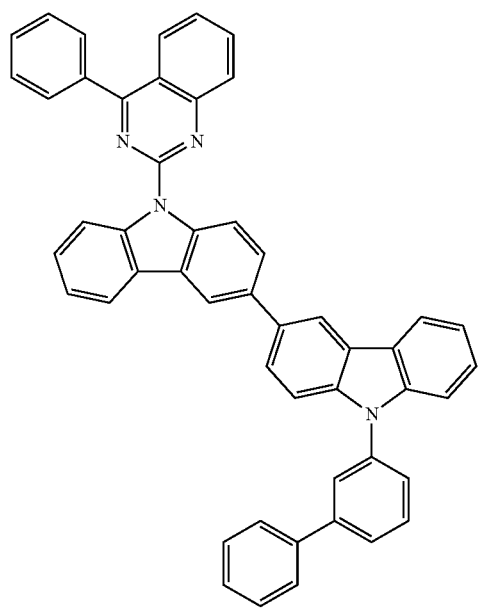
H41
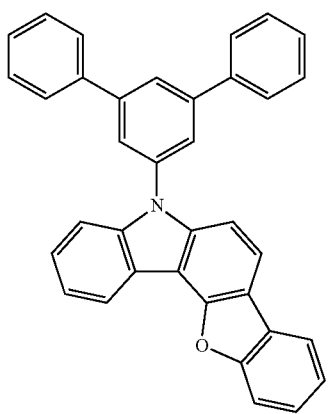
H42
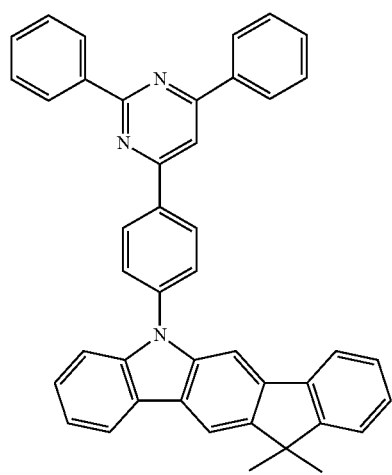
H43
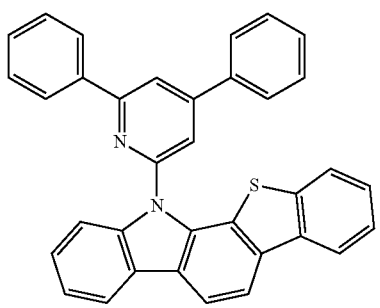
H44

-continued
H45
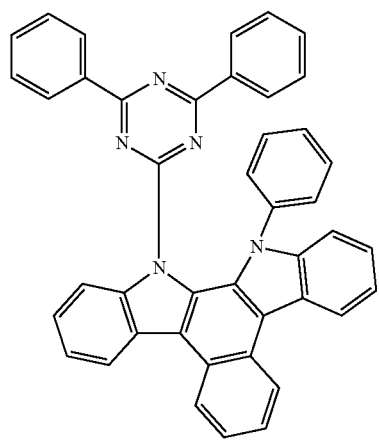
H46
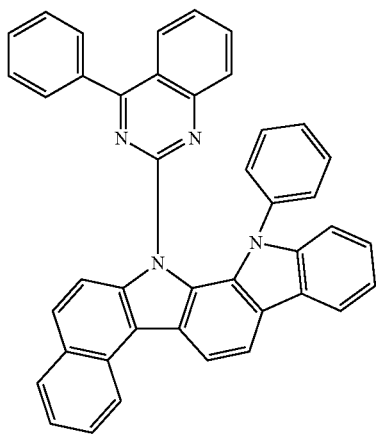
H47
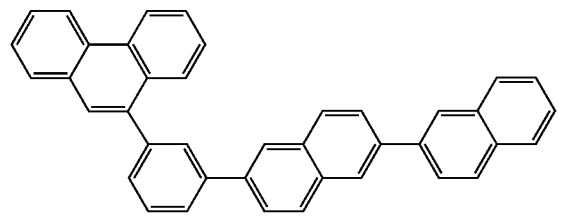
H48
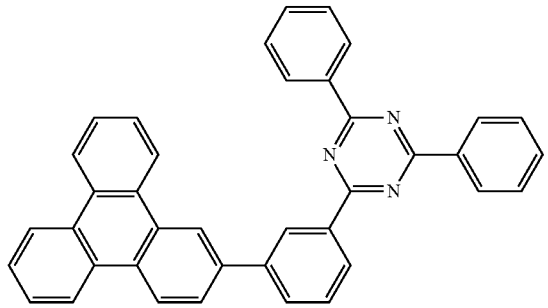
H49
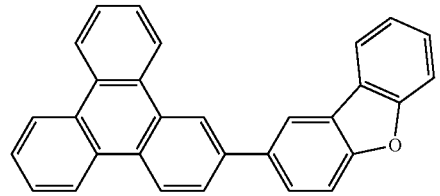
H50
H51
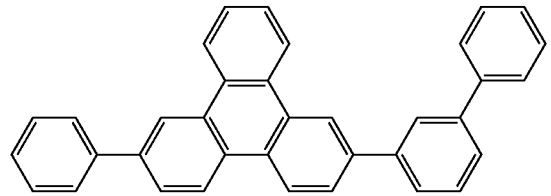
H52
H53
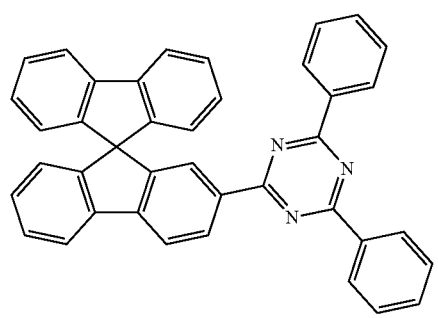
H54
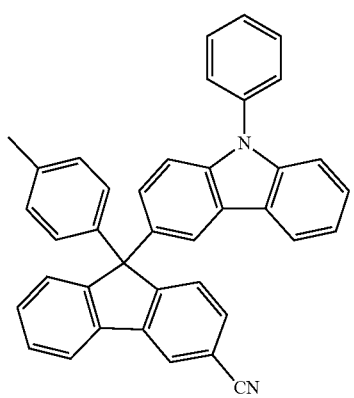

-continued
| | |
|---|---|
| H55 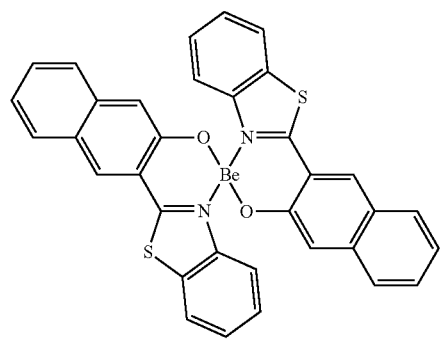 | H56 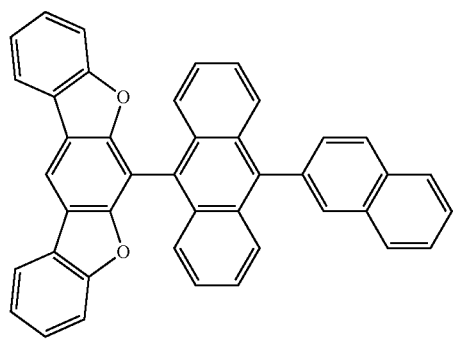 |
| H57 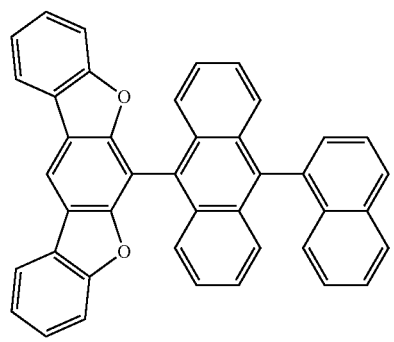 | H58 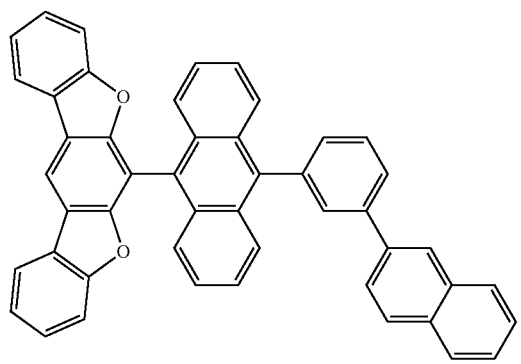 |
| H59 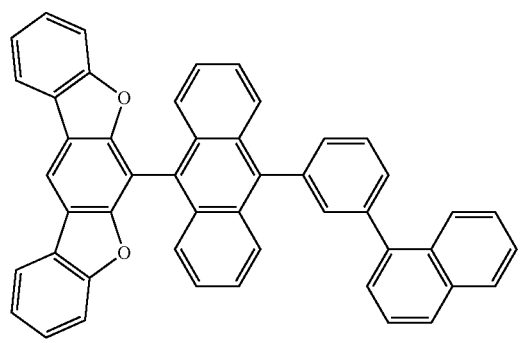 | H60 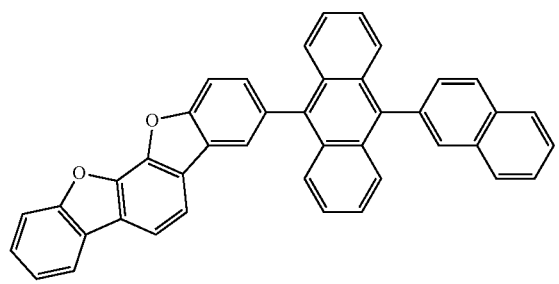 |
| H61 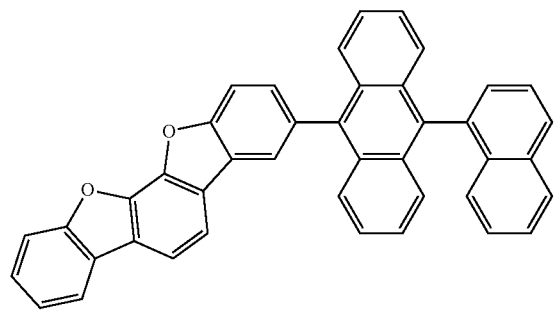 | H62 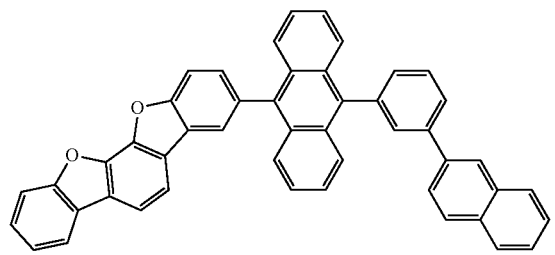 |

-continued
H63
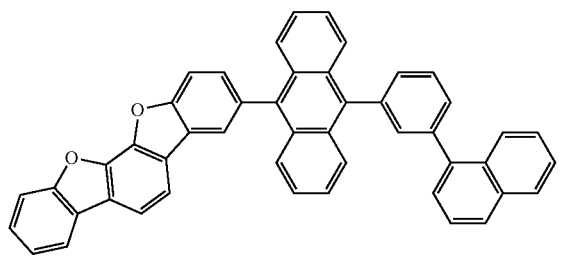
H64
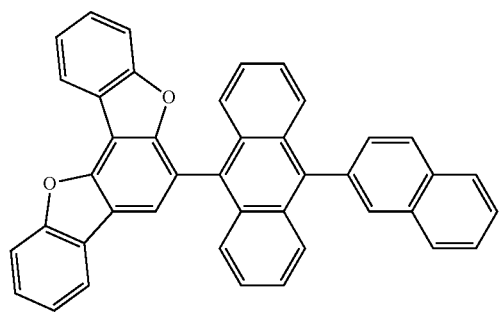
H65
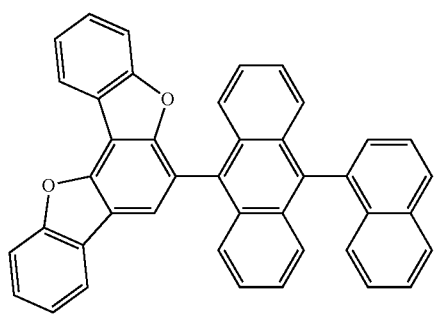
H66
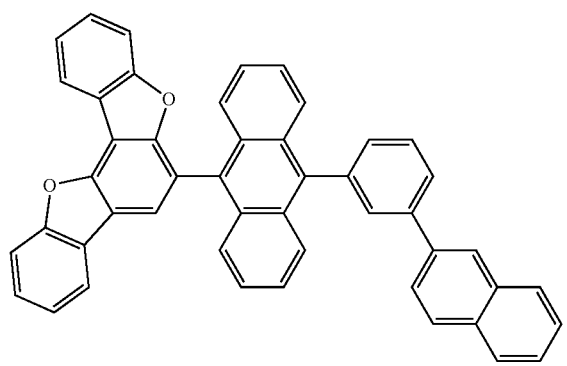
H67
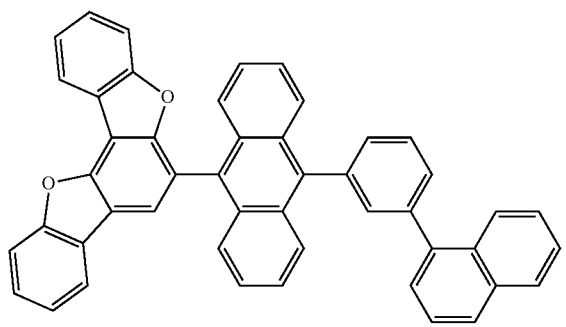
H68
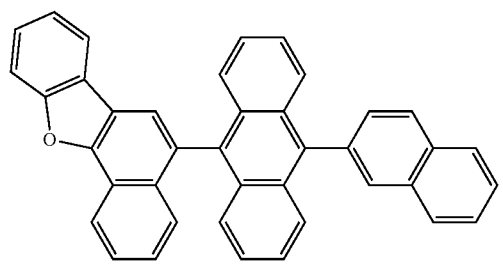
H69
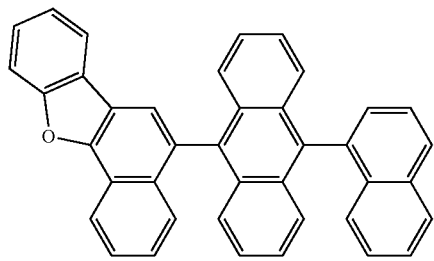
H70
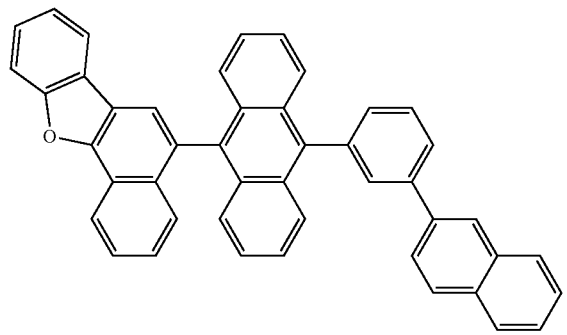

-continued
H71
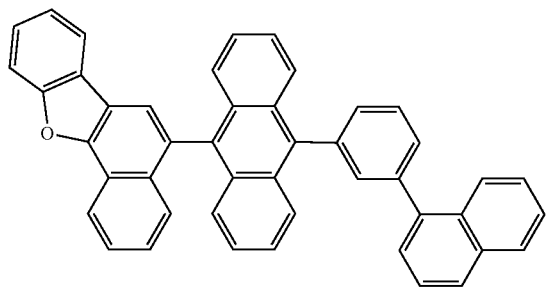
H72
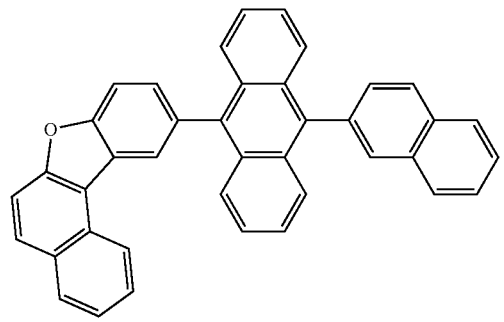
H73
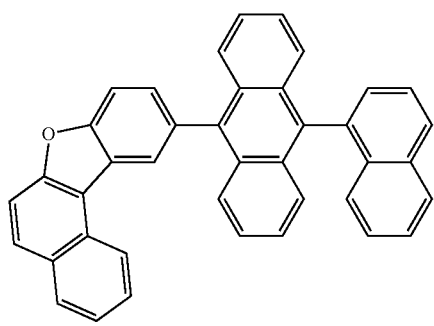
H74
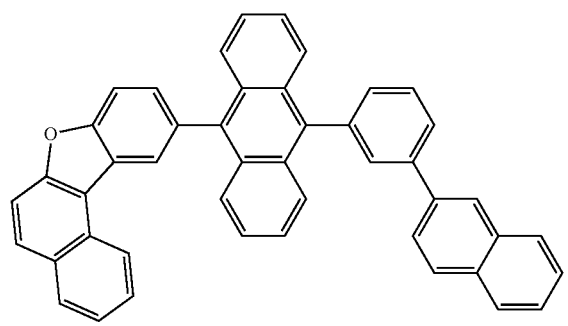
H75
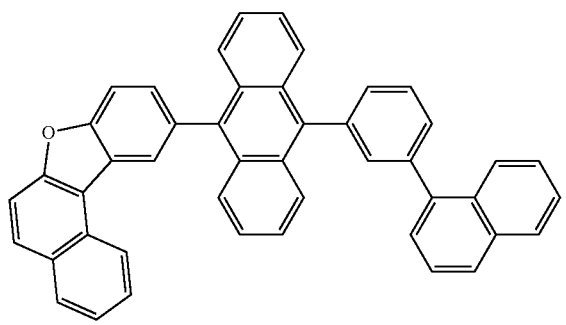
H76
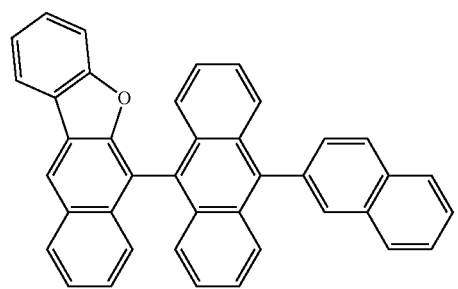
H77
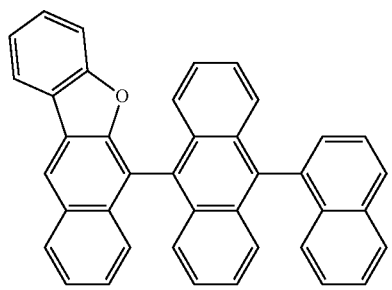
H78
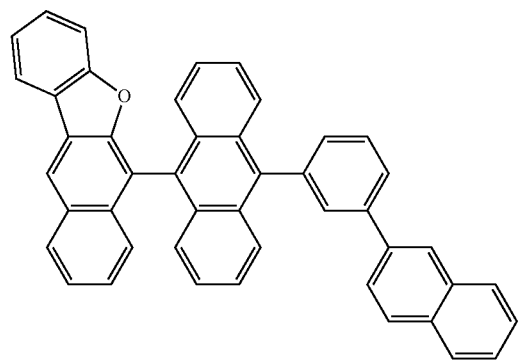

-continued
H79
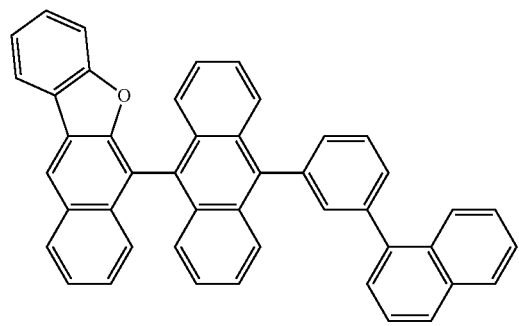
H80
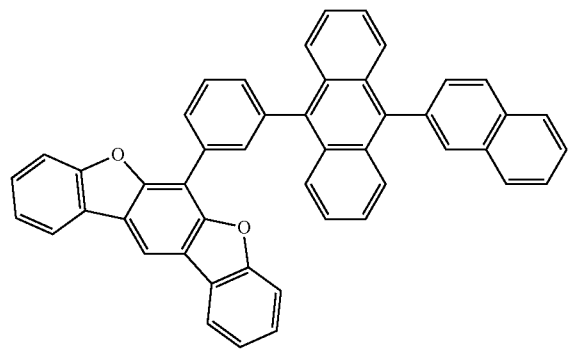
H81
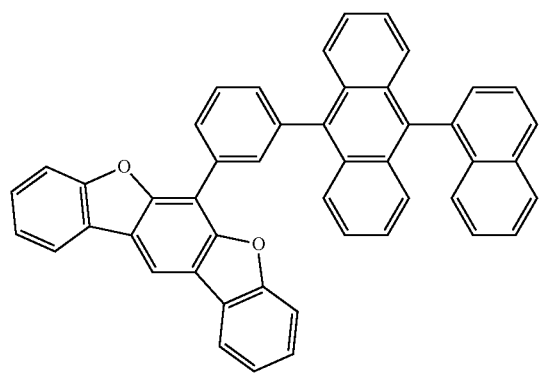
H82
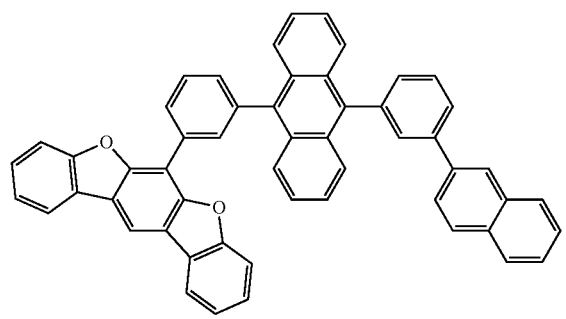
H83
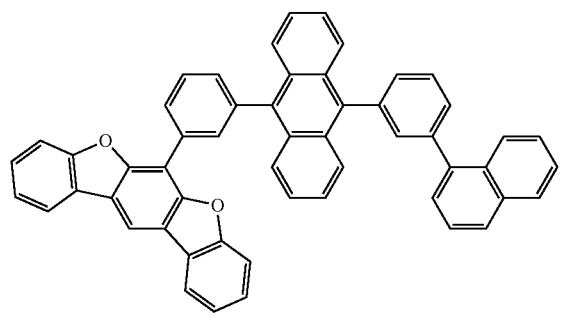
H84
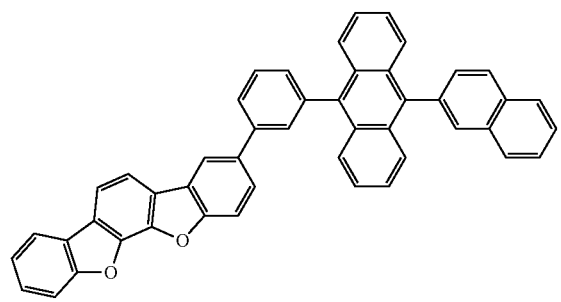
H85
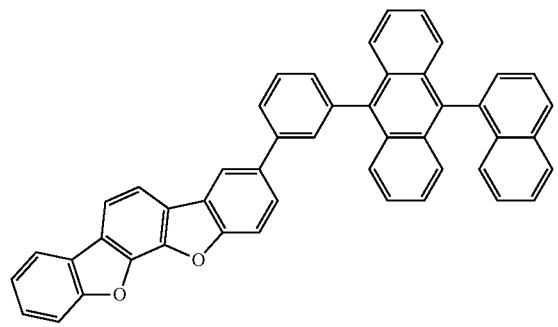
H86
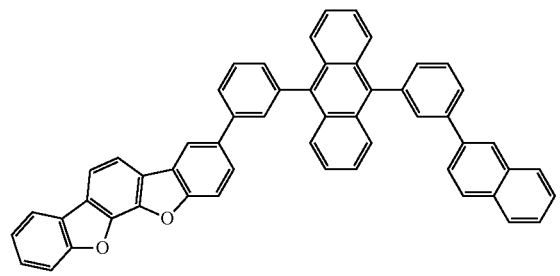

-continued
H87
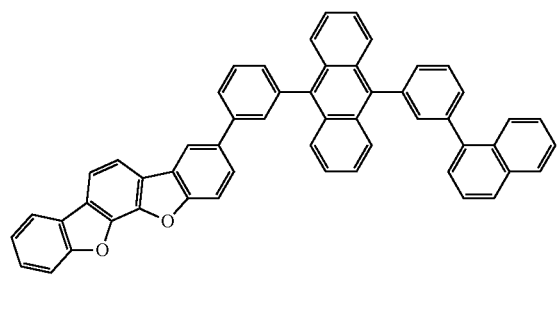
H88
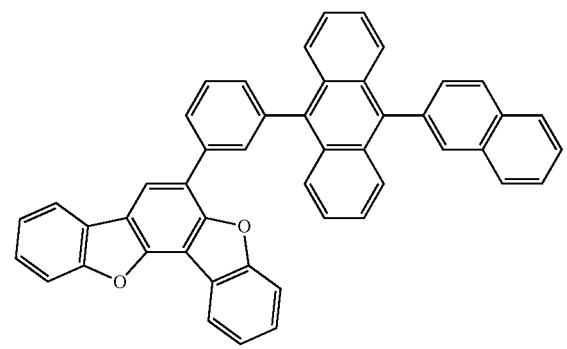
H89
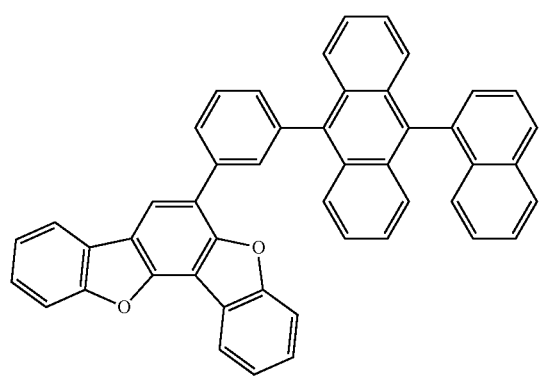
H90
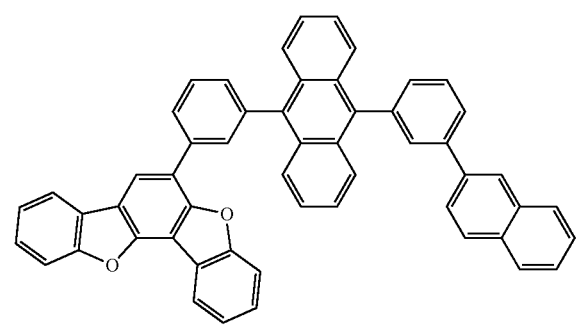
H91
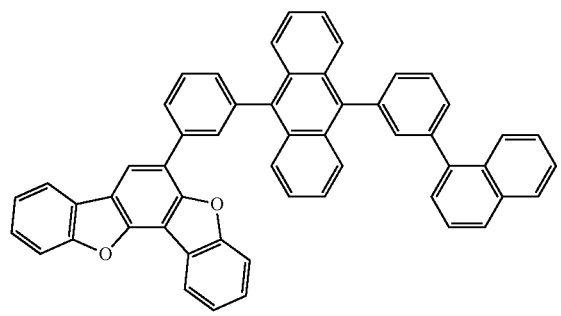
H92
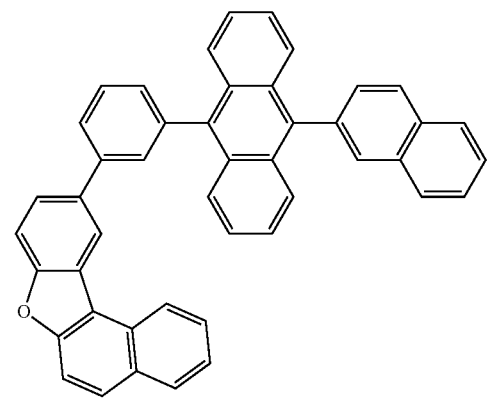
H93
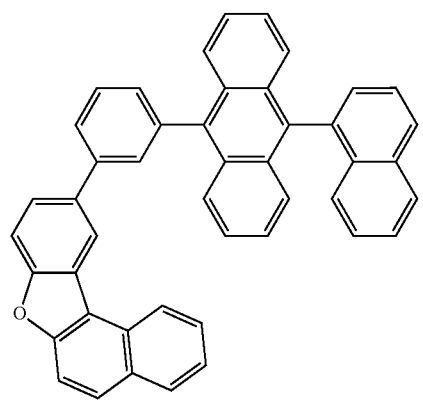
H94
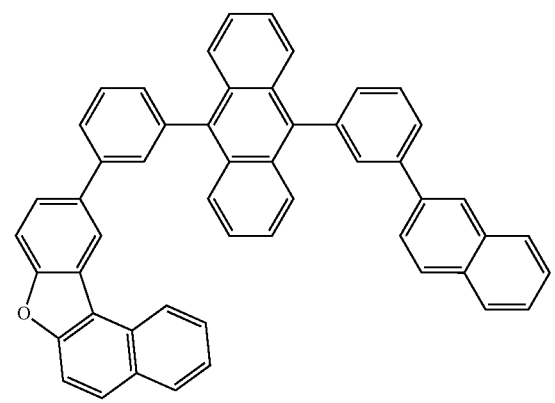

-continued
H95
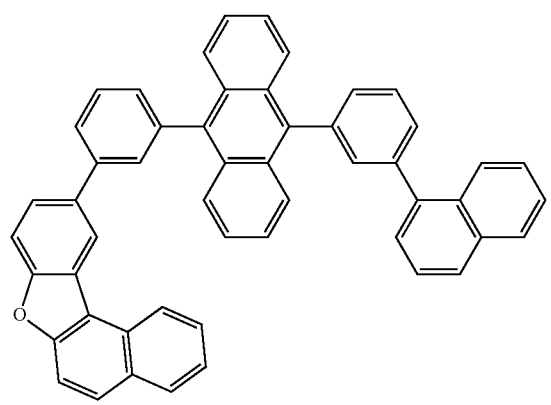
H96
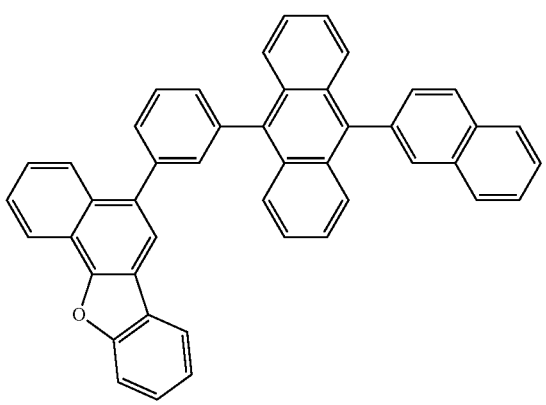
H97
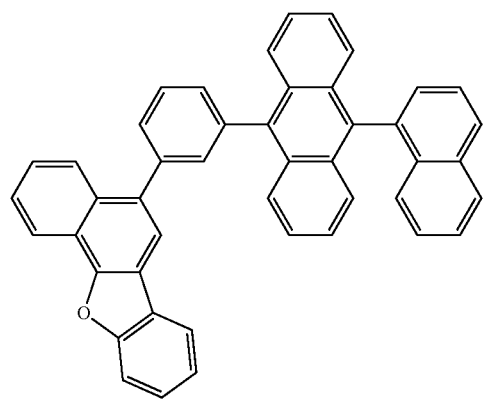
H98
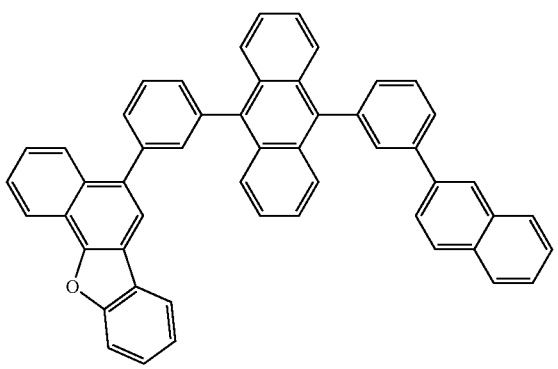
H99
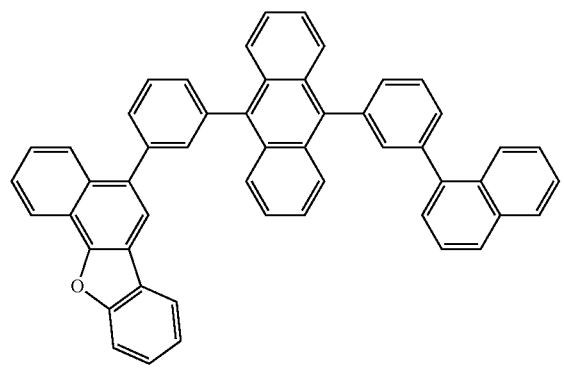
H100
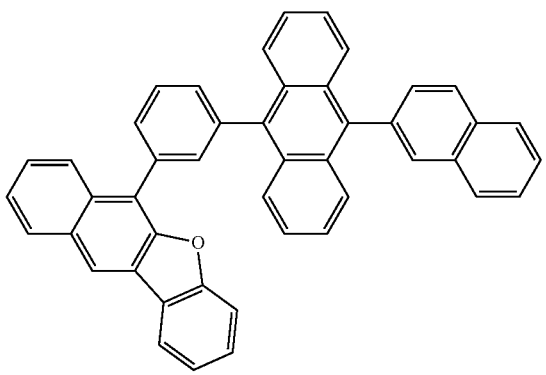
H101
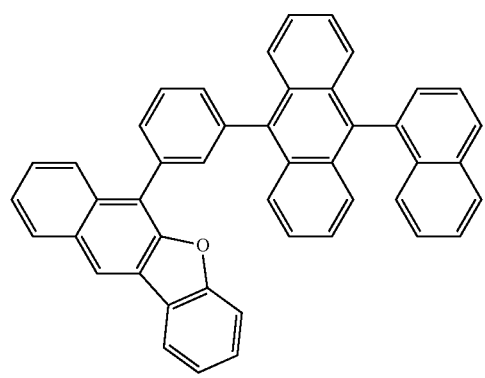
H102
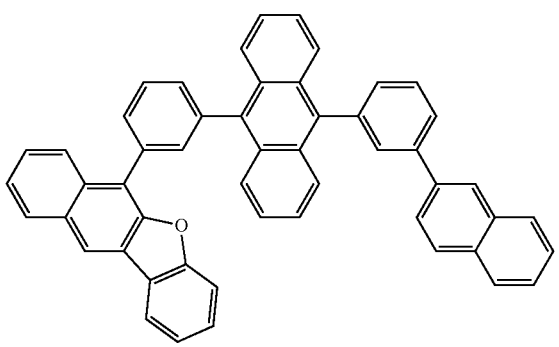

-continued
H103
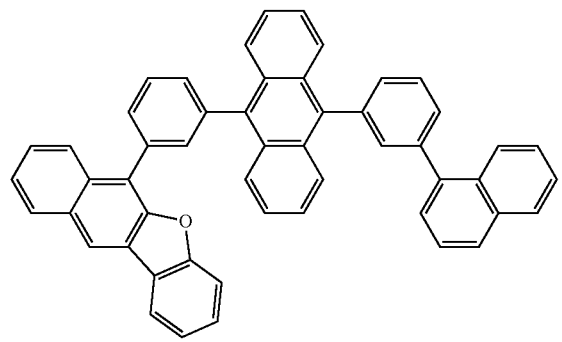
H104
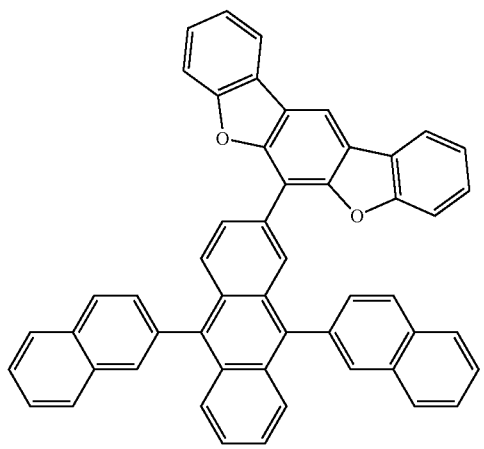
H105
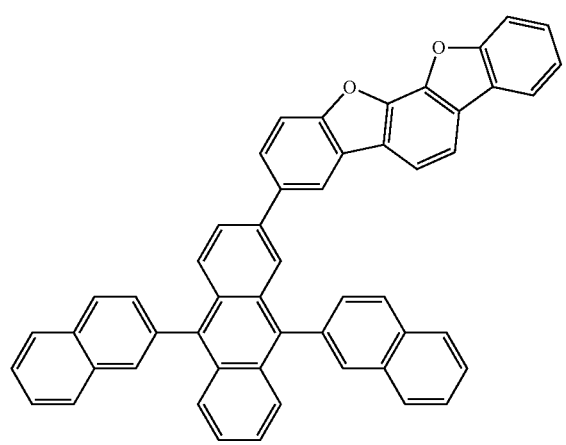
H106
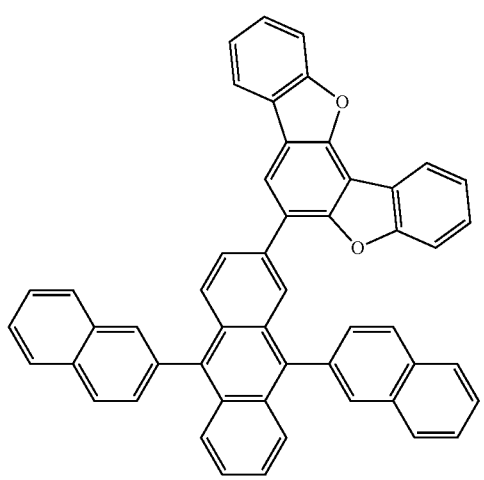
H107
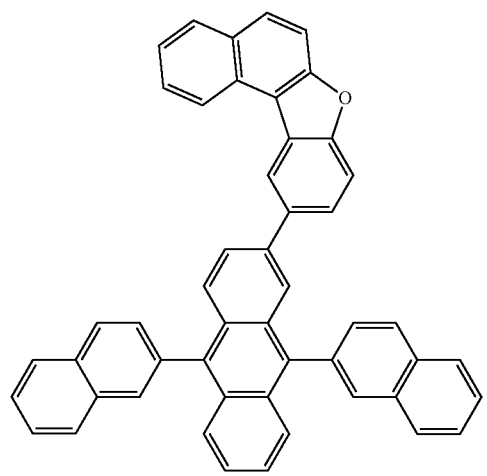
H108
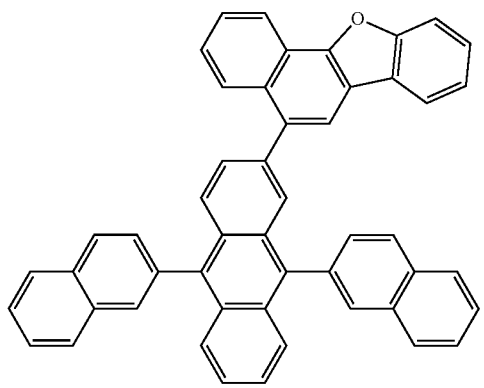

-continued
H109
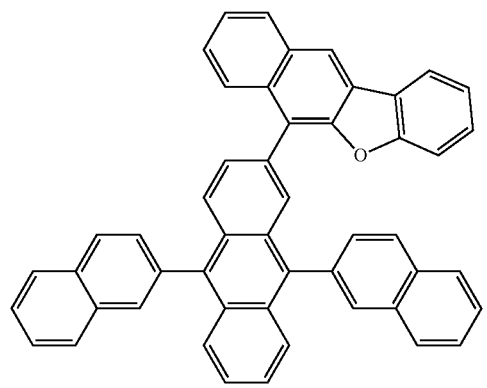
H110
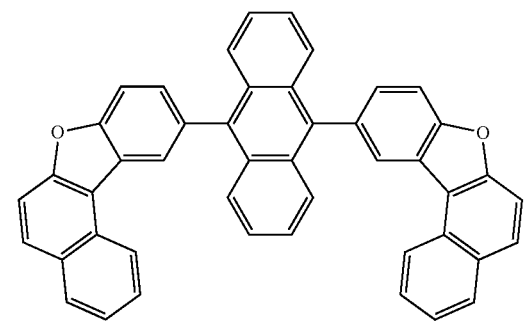
H111
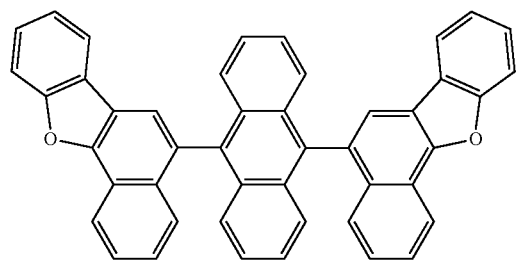
H112
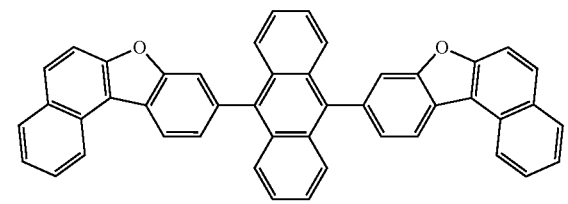
H113
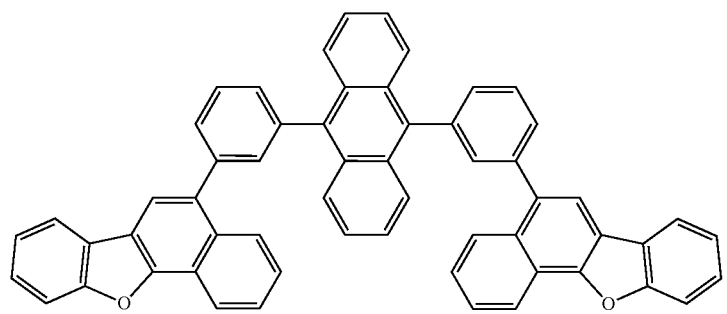
H114
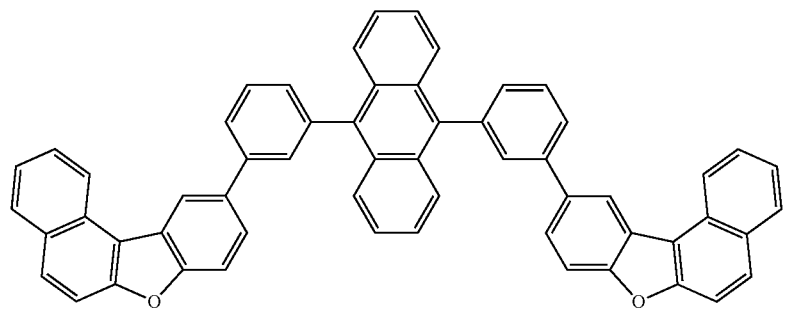

-continued
H115
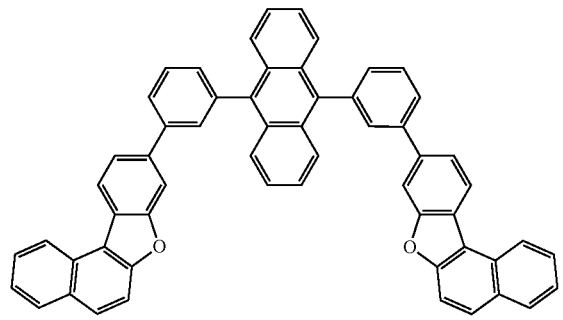
H116
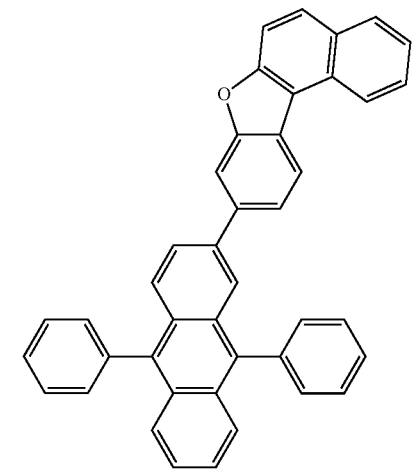
H117
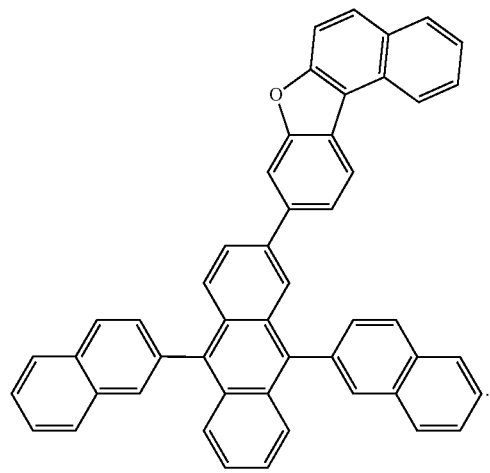
H118
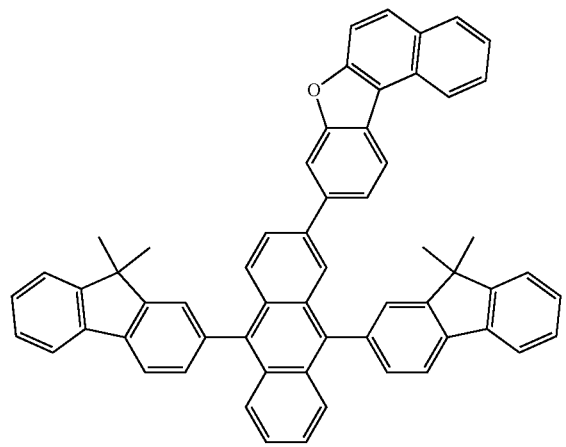
H119
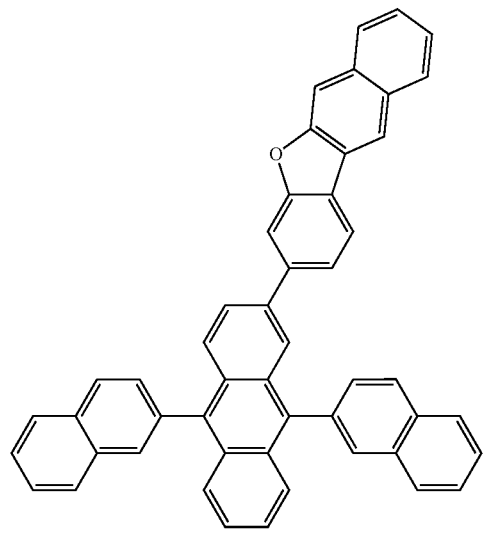
H120
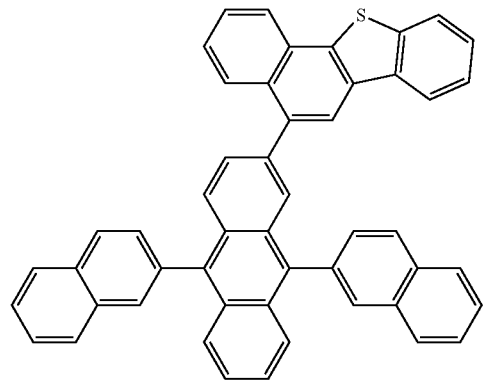

Phosphorescent Dopant Included in Emission Layer of Interlayer 150

The emission layer may be patterned into a red emission layer and a green emission layer according to a representative sub-pixel, and the horizontal dipole moment of the green dopant may be greater than the horizontal dipole moment of the red dopant. The emission layer may further include a blue emission layer patterned into a blue emission layer. The green dopant and the red dopant may each be a phosphorescent dopant. The green dopant and the red dopant may each be understood by referring to the descriptions of the green dopant and the red dopant provided herein.

Electron Transport Region in Interlayer 150

The electron transport region may have i) a single-layered structure consisting of a single layer consisting of a single material, ii) a single-layered structure consisting of a single layer including a plurality of different materials, or iii) a multi-layered structure having a plurality of layers including a plurality of different materials. The electron transport region may include a buffer layer, a hole blocking layer, an electron control layer, an electron transport layer, or an electron injection layer, but the exemplary embodiments are not limited thereto.

In some exemplary embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked on the emission layer in each stated order, but the exemplary embodiments are not limited thereto. The electron transport region (for example, the buffer layer, the hole blocking layer, the electron control layer, or the electron transport layer in the electron transport region) may include a metal-free compound including at least one π electron deficient nitrogen-containing cyclic group that may easily accept electrons.

For example, the "π electron deficient nitrogen-containing cyclic group" may be i) a first ring, ii) a condensed cyclic group in which two or more first rings are condensed, or iii) a condensed cyclic group in which at least one first ring and at least one second ring are condensed, wherein the first ring is a heteromonocyclic group (for example, an imidazole group, a pyridine group, or a triazine group) which includes at least one *—N=*' moiety as a ring-forming moiety, and the second ring is a cyclic group (for example, a benzene group, a dibenzofuran group, or a carbazole group) which does not include *—N=*' moiety as a ring-forming moiety.

Examples of the π electron deficient nitrogen-containing cyclic group include a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a cinnoline group, a phenanthroline group, a phthalazine group, a naphthyridine group, an azacarbazole group, an azafluorene group, an azadibenzosilole group, an azadibenzothiophene group, an azadibenzofuran group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, an imidazopyridine group, an imidazopyrimidine group, an imidazotriazine group, an imidazopyrazine group, and an imidazopyridazine group, but the exemplary embodiments are not limited thereto.

For example, the electron transport region may include a compound represented by Formula 601 and including at least one π electron deficient nitrogen-containing cyclic group.

$$[Ar_{601}]xe11 - [(L_{601})xe1 - R_{601}]xe21 \quad \text{Formula 601}$$

wherein, in Formula 601, $Ar_{601}$ may be selected from a substituted or unsubstituted $C_5$-$C_{60}$ carbocyclic group and a substituted or unsubstituted $C_1$-$C_{60}$ heterocyclic group, xe11 may be 1, 2, or 3, $L_{601}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xe1 may be 0, 1, 2, 3, 4, or 5, $R_{601}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ may each be understood by referring to the description of $Q_1$ provided herein, and xe21 may be 1, 2, 3, 4, or 5.

In some exemplary embodiments, at least one of $Ar_{601}$, $L_{601}$, and $R_{601}$ in Formula 601 may each independently include the π-electron-depleted nitrogen-containing ring. In some exemplary embodiments, when xe11 in Formula 601 is 2 or greater, at least two $Ar_{601}$(s) may be bound via a single bond. In some exemplary embodiments, in Formula 601, $Ar_{601}$ may be a substituted or unsubstituted anthracene group.

In some exemplary embodiments, the electron transport region may include a compound represented by Formula 601-1:

Formula 601-1

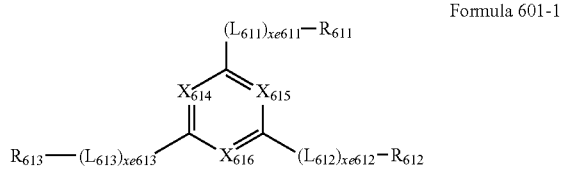

wherein, in Formula 601-1, $X_{614}$ may be N or $C(R_{614})$, $X_{615}$ may be N or $C(R_{615})$, $X_{616}$ may be N or $C(R_{616})$, at least one selected from $X_{614}$ to $X_{616}$ may be N, $L_{611}$ to $L_{613}$ may each be understood by referring to the description of $L_{601}$ provided herein, xe611 to xe613 may each be understood by referring to the description of xe1 provided herein, $R_{611}$ to $R_{613}$ may each be understood by referring to the description of $R_{601}$ provided herein, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a biphenyl group, a terphenyl group, or a naphthyl group.

In some exemplary embodiments, in Formulae 601 and 601-1, xe1 and xe611 to xe613 may each independently be 0, 1, or 2.

The electron transport region may include one of Compounds ET1 to ET36, 2,9-dimethyl-4,7-diphenyl-1,10-phenanthroline (BCP), 4,7-diphenyl-1,10-phenanthroline (Bphen), tris-(8-hydroxyquinoline)aluminum (Alq3), bis(2-methyl-8-quinolinolato-N1,O8)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), or any combination thereof, but the exemplary embodiments are not limited thereto:

ET1

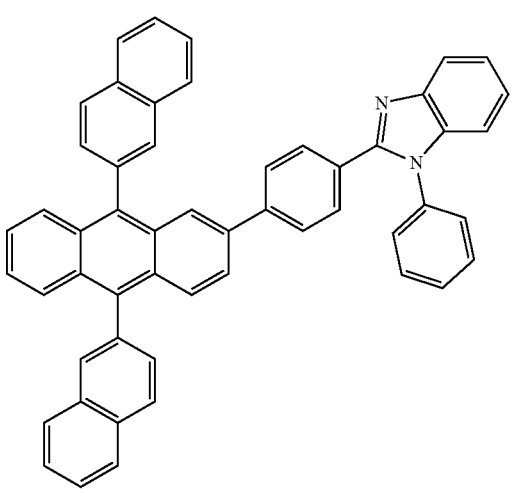

ET2

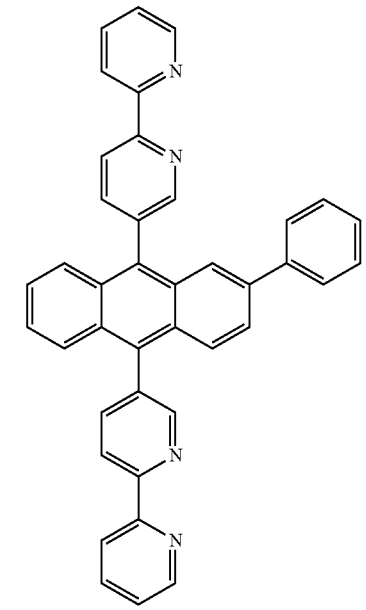

ET3

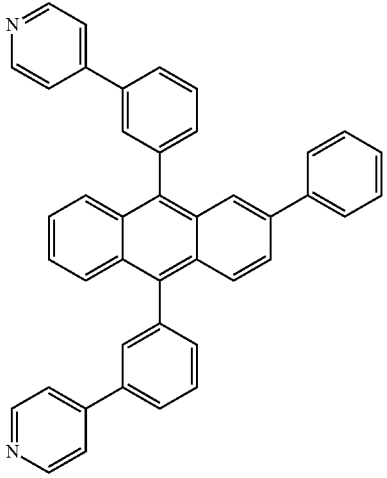

ET4

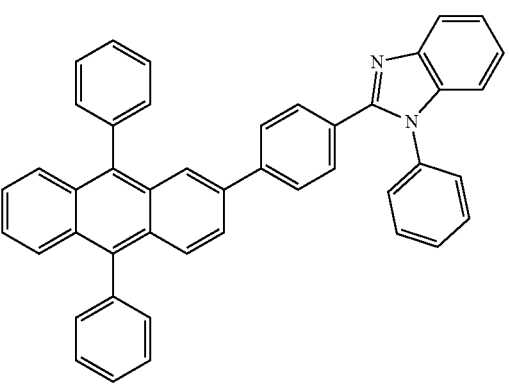

ET5
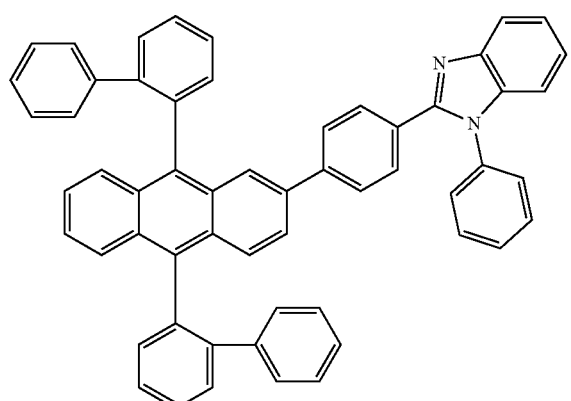
ET8
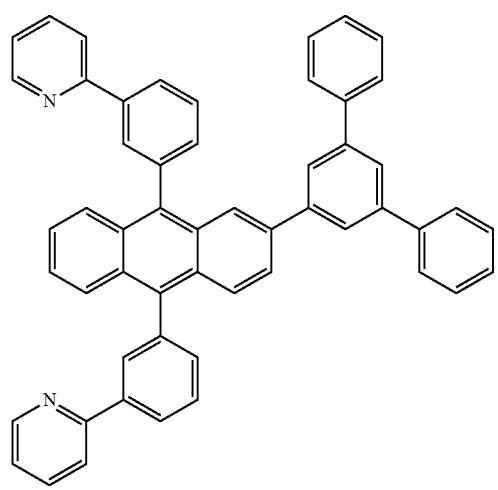
ET6
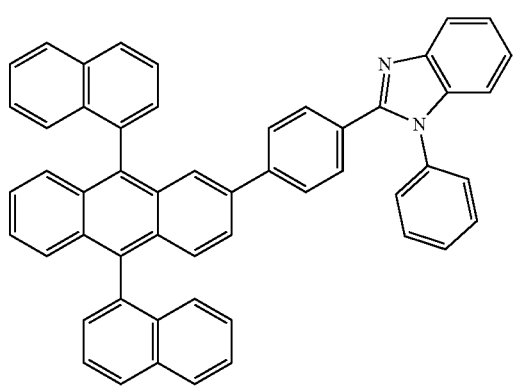
ET7
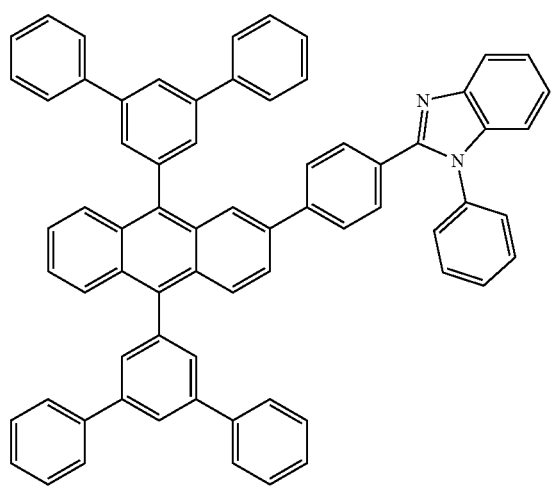
ET9
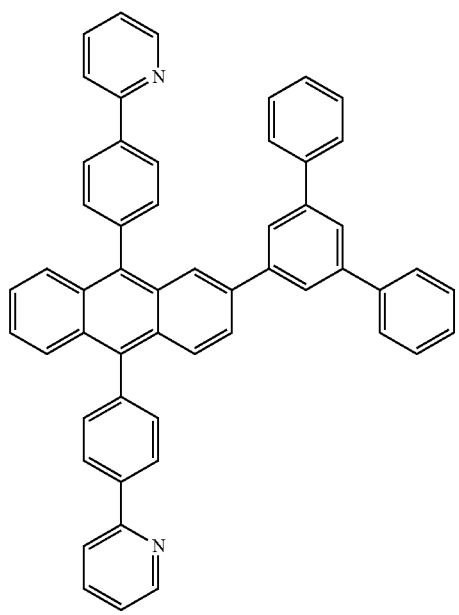

ET10
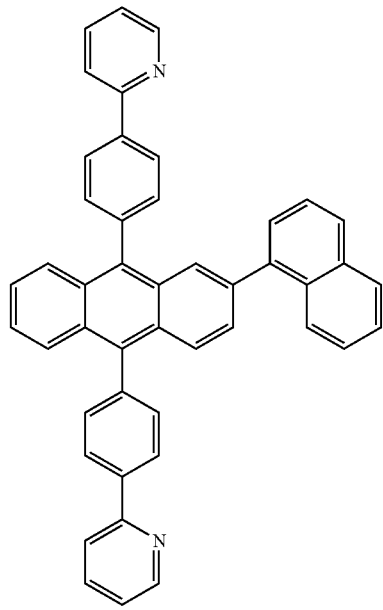
ET11
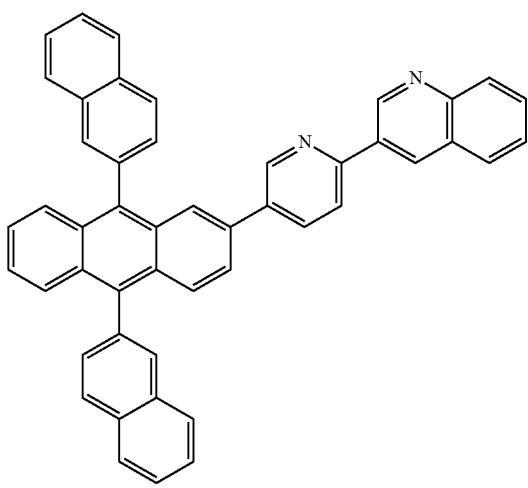
ET12
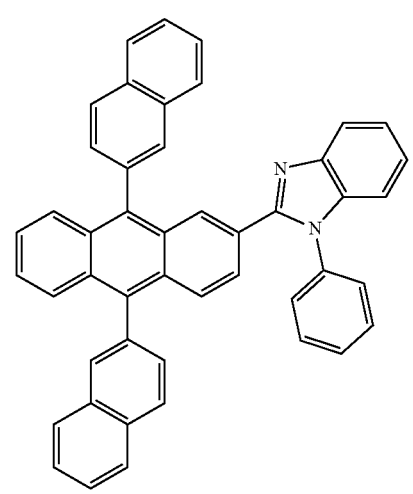
ET13
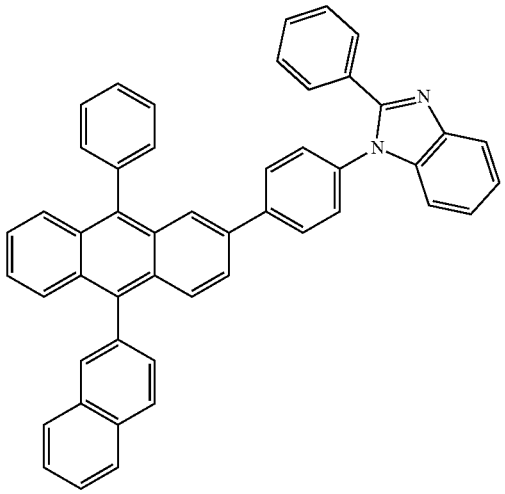
ET14
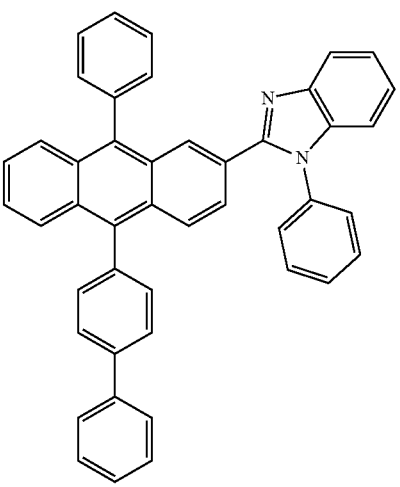
ET15
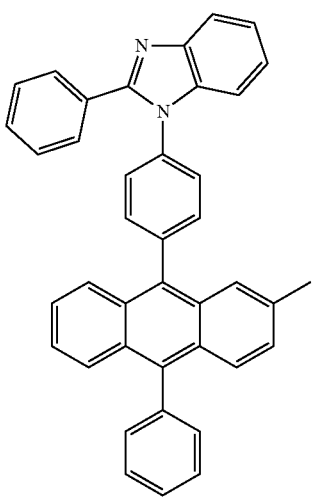

ET16
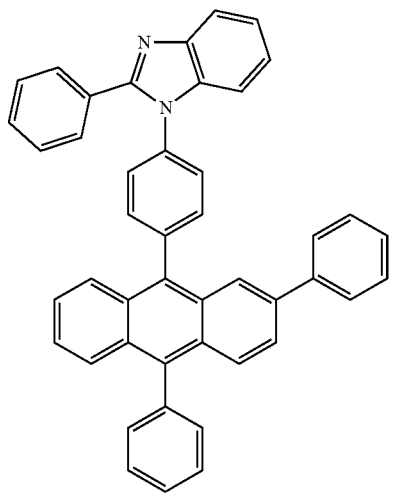
ET17
ET18
ET19
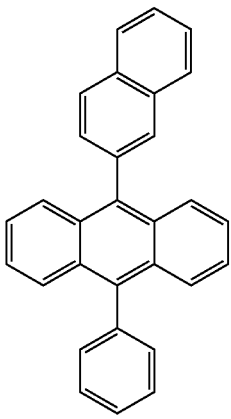
ET20
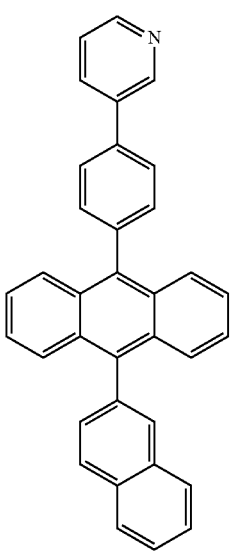
ET21
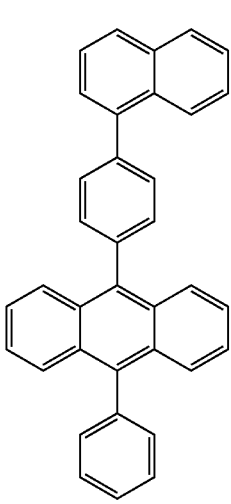

ET22
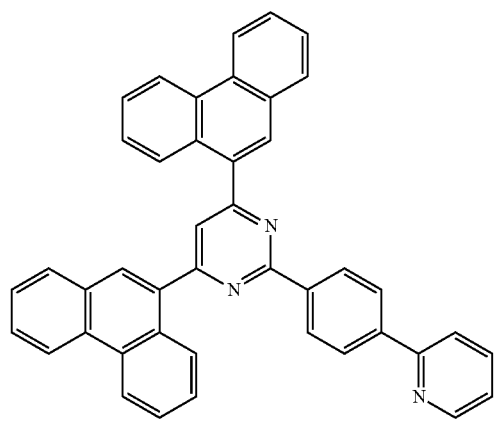
ET25
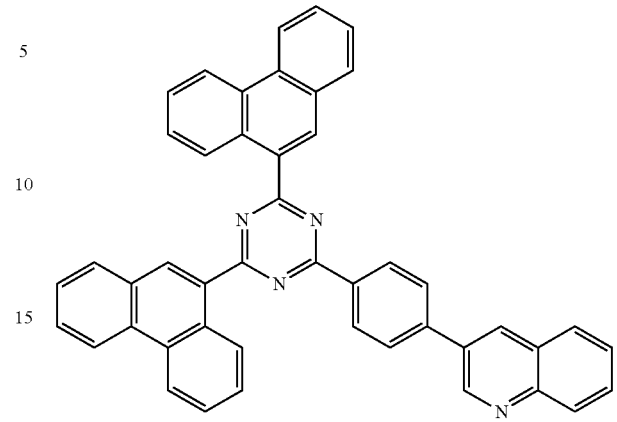
ET23
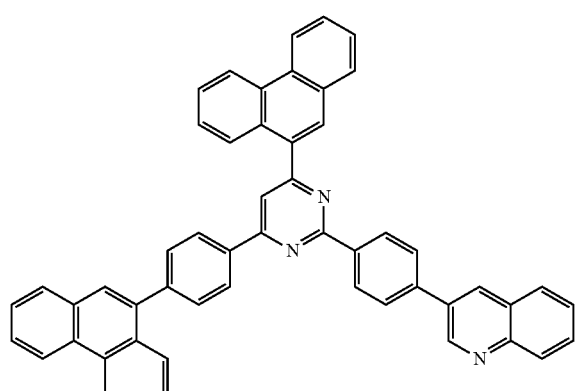
ET26
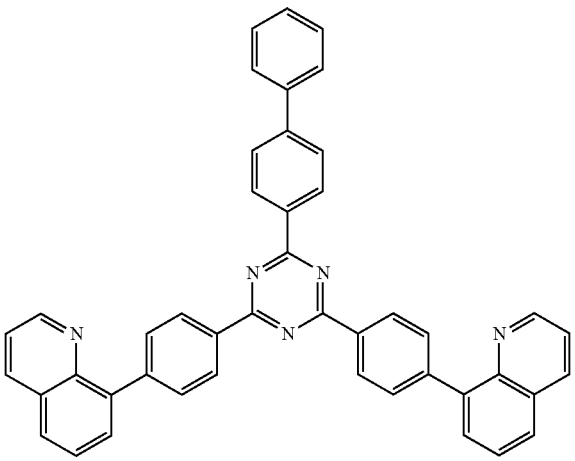
ET24
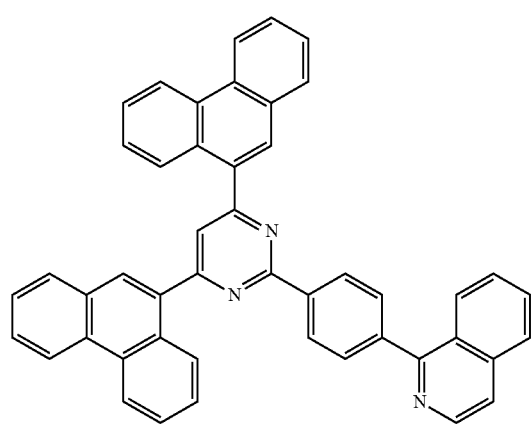
ET27
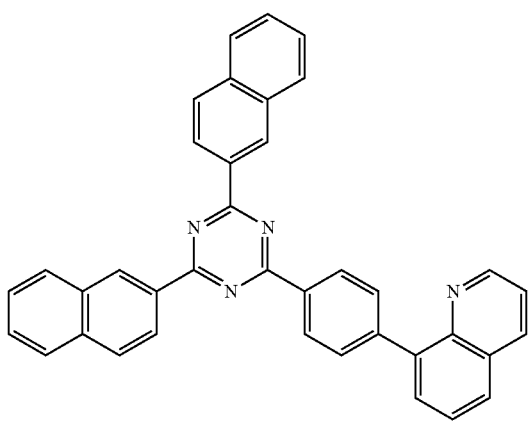

ET28
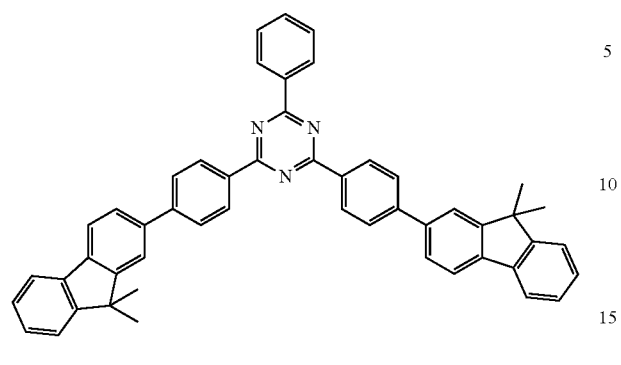
ET29
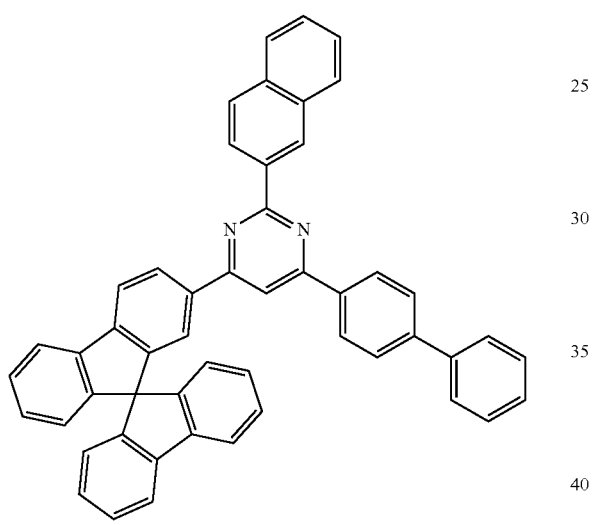
ET30
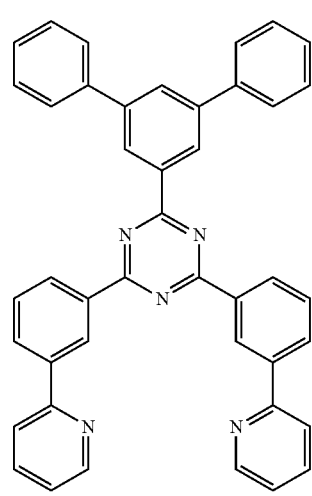
ET31
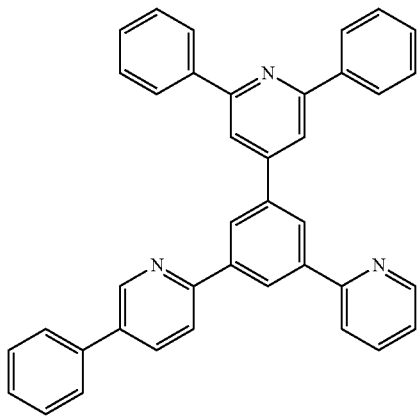
ET32
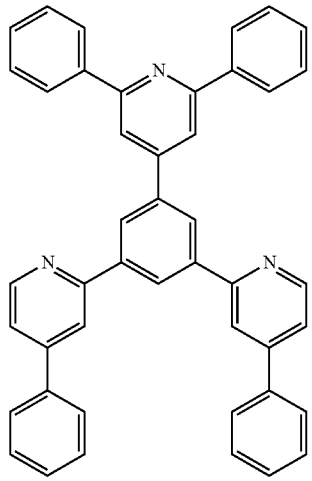
ET33
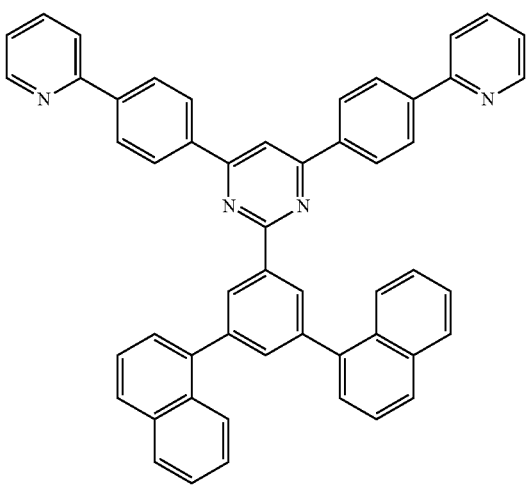

ET34

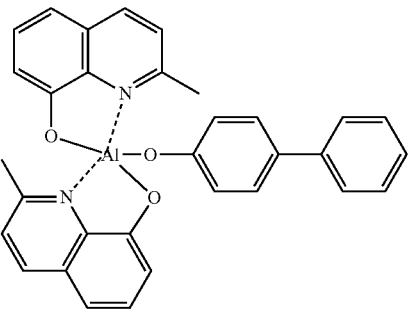

BAlq

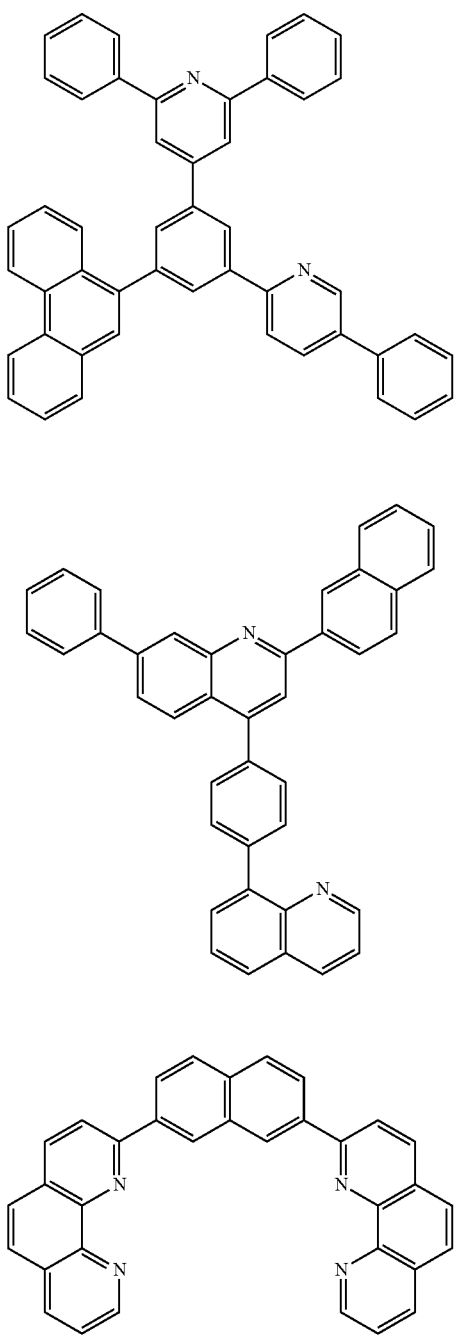

TAZ

ET35

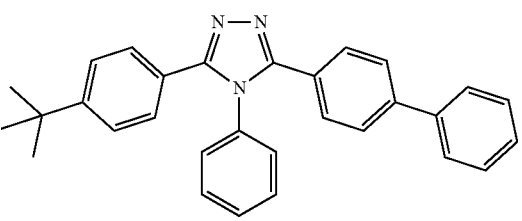

NTAZ

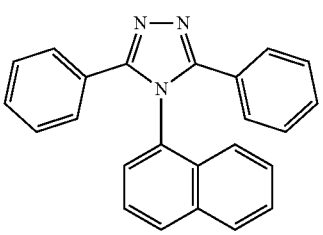

ET36

Alq3

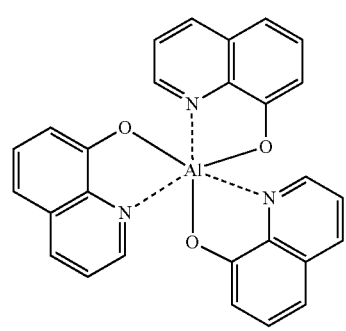

The thicknesses of the buffer layer, the hole blocking layer, or the electron control layer may each independently be in a range of about 20 Å to about 1,000 Å, and in some exemplary embodiments, about 30 Å to about 300 Å. When the thicknesses of the buffer layer, the hole blocking layer or the electron control layer are within any of these ranges, excellent hole blocking characteristics or excellent electron controlling characteristics may be obtained without a substantial increase in driving voltage.

The thickness of the electron transport layer may be in a range of about 100 Å to about 1,000 Å, and in some exemplary embodiments, about 150 Å to about 500 Å. When the thickness of the electron transport layer is within any of these ranges, excellent electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. Each ligand coordinated with the metal ion of the alkali metal complex and the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof, but the exemplary embodiments are not limited thereto.

For example, the metal-containing material may include a Li complex. The Li complex may include, e.g., Compound ET-D1 ((8-Hydroxyquinolinato)lithium (LiQ)) or Compound ET-D2:

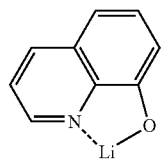

ET-D1

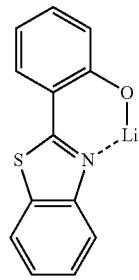

ET-D2

The electron transport region may include an electron injection layer that facilitates injection of electrons from the second electrode 190. The electron injection layer may be in direct contact with the second electrode 190.

The electron injection layer may have i) a single-layered structure consisting of a single layer consisting of a single material, ii) a single-layered structure consisting of a single layer including a plurality of different materials, or iii) a multi-layered structure having a plurality of layers including a plurality of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof. The alkali metal may be Li, Na, K, Rb, Cs or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may respectively be oxides, halides (e.g., fluorides, chlorides, bromides, or iodines), or any combination thereof of each of the alkali metal, the alkaline earth metal, and the rare earth metal. The alkali metal-containing compound may be alkali metal oxides such as $Li_2O$, $Cs_2O$, or $K_2O$, alkali metal halides such as LiF, NaF, CsF, KF, LiI, NaI, CsI, or KI, or any combination thereof. The alkaline earth-metal-containing compound may include alkaline earth-metal compounds, such as BaO, SrO, CaO, $BaXSr_{1-x}O$ (wherein 0<x<1), or $Ba_xCa_{1-x}O$ (wherein 0<x<1). The rare earth metal-containing compound may include $YbF_3$, $ScF_3$, $ScO_3$, $Y_2O_3$, $Ce_2O_3$, $GdF_3$, $TbF_3$, $YbI_3$, $ScI_3$, $TbI_3$, or any combination thereof.

The alkali metal complex, the alkaline earth metal complex, and the rare earth metal complex may include: i) one of ions of the alkali metal, alkaline earth metal, and rare earth metal described above and ii) a ligand bound to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxydiaphenyloxadiazole, hydroxydiphenylthiadiazole, hydroxyphenylpyridine, hydroxyphenylbenzimidazole, hydroxyphenylbenzothiazole, bipyridine, phenanthroline, cyclopentadiene, or any combination thereof, but the exemplary embodiments are not limited thereto.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In some exemplary embodiments, the electron injection layer may further include an organic material (e.g., a compound represented by Formula 601). When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

The thickness of the electron injection layer may be in a range of about 1 Å to about 100 Å, and in some exemplary embodiments, about 3 Å to about 90 Å. When the thickness of the electron injection layer is within any of these ranges, excellent electron injection characteristics may be obtained without a substantial increase in driving voltage.

Second Electrode 190

The second electrode 190 may be on the interlayer 150. In an exemplary embodiment, the second electrode 190 may be a cathode that is an electron injection electrode. In some exemplary embodiments, a material for forming the second electrode 190 may be a material having a low work function, for example, a metal, an alloy, an electrically conductive compound, or any combination thereof.

The second electrode 190 may include lithium (Li), silver (Ag), magnesium (Mg), aluminum (Al), aluminum-lithium (Al—Li), calcium (Ca), magnesium-indium (Mg—In), magnesium-silver (Mg—Ag), an ITO, an IZO, or any combination thereof, but the exemplary embodiments are not limited thereto. The second electrode 190 may be a transmissive electrode, a semi-transmissive electrode, or a reflective electrode. The second electrode 190 may have a single-layered structure, or a multi-layered structure including two or more layers.

Capping Layer

A first capping layer may be located outside the first electrode 110, and/or a second capping layer may be located outside the second electrode 190. In some exemplary embodiments, the light-emitting device 10 may have a structure in which the first capping layer, the first electrode 110, the interlayer 150, and the second electrode 190 are sequentially stacked in this stated order, a structure in which the first electrode 110, the interlayer 150, the second electrode 190, and the second capping layer are sequentially stacked in this stated order, or a structure in which the first capping layer, the first electrode 110, the interlayer 150, the second electrode 190, and the second capping layer are sequentially stacked in this stated order.

In the light-emitting device 10, light emitted from the emission layer in the interlayer 150 may pass through the first electrode 110 (which may be a semi-transmissive electrode or a transmissive electrode) and through the first capping layer to the outside. In the light-emitting device 10, light emitted from the emission layer in the interlayer 150 may pass through the second electrode 190 (which may be a semi-transmissive electrode or a transmissive electrode) and through the second capping layer to the outside.

The first capping layer and the second capping layer may improve the external luminescence efficiency based on the principle of constructive interference. The first capping layer and the second capping layer may each independently be a capping layer including an organic material, an inorganic capping layer including an inorganic material, or a composite capping layer including an organic material and an inorganic material.

The first capping layer and the second capping layer may each independently have a refractive index of about 1.6 or greater at 589 nm. For example, the first capping layer may have a refractive index of about 1.6 at 589 nm, and the second capping layer may have a refractive index of about 1.7 at 589 nm. In some exemplary embodiments, the first capping layer and the second capping layer may each have a refractive index of about 1.6 at 589 nm. For example, the second capping layer may have a refractive index of about 1.6 at 589 nm, and the first capping layer may have a refractive index of about 1.7 at 589 nm.

In some exemplary embodiments, the first capping layer and the second capping layer may each independently have a refractive index in a range of about 1.6 to about 2.5 at 589 nm. In some exemplary embodiments, the first capping layer or the second capping layer may each be in contact with the first electrode 110 or the second electrode 190.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may optionally be substituted with a substituent of O, N, S, Se, Si, F, Cl, Br, I, or any combination thereof. In some exemplary embodiments, at least one of the first capping layer and the second capping layer may each independently include an amine group-containing compound.

In some exemplary embodiments, at least one of the first capping layer and the second capping layer may each independently include the compound represented by Formula 201, the compound represented by Formula 202, or any combination thereof. In one or more exemplary embodiments, at least one of the first capping layer and the second capping layer may each independently include a compound selected from Compounds HT28 to HT33, a compound selected Compounds CP1 to CP5, or any combination thereof, but the exemplary embodiments are not limited thereto:

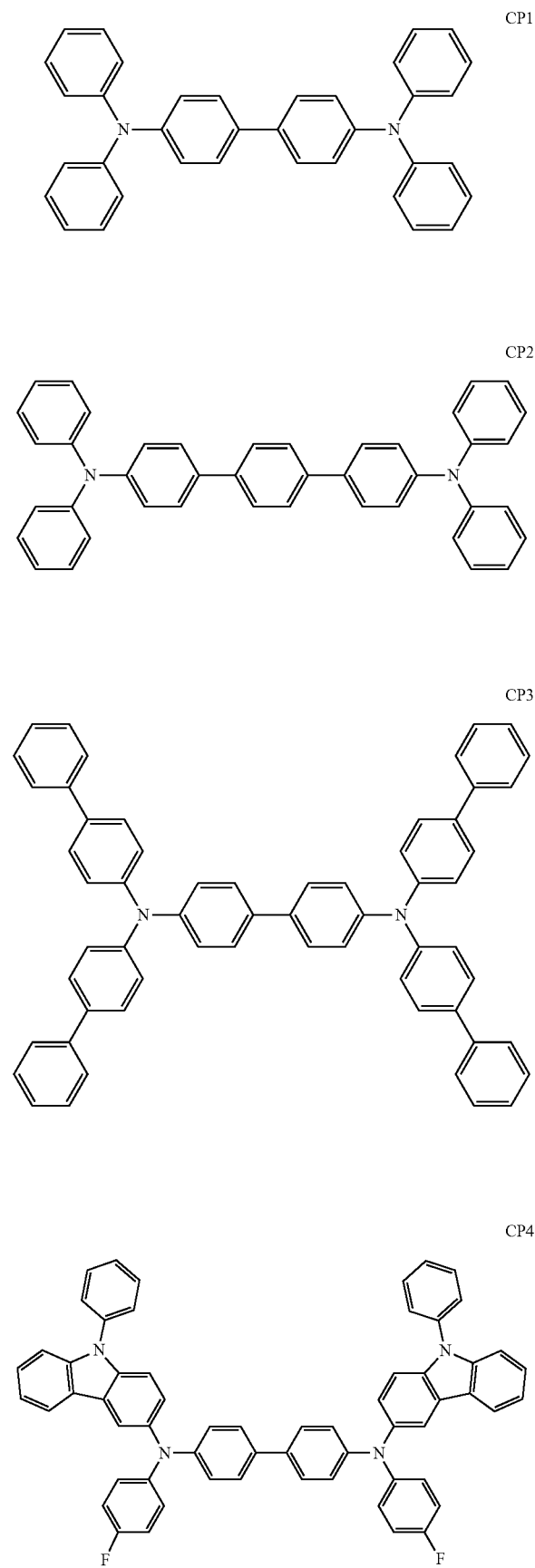

CP5

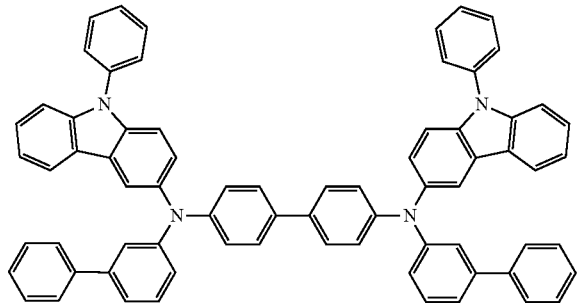

Electronic Apparatus

The light-emitting device may be included in various electronic apparatuses. In some exemplary embodiments, an electronic apparatus including the light-emitting device may be an emission apparatus or an authentication apparatus.

The electronic apparatus (e.g., an emission apparatus) may further include, in addition to the light-emitting device, i) a color filter, ii) a color-conversion layer, or iii) a color filter and a color-conversion layer. The color filter and/or the color-conversion layer may be disposed on at least one traveling direction of light emitted from the light-emitting device. For example, light emitted from the light-emitting device may be blue light or white light. The light-emitting device may be understood by referring to the descriptions provided herein. In some exemplary embodiments, the color-conversion layer may include a quantum dot. The quantum dot may be, for example, the quantum dot described herein.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel defining film may be located between the plurality of sub-pixel areas to define each sub-pixel area. The color filter may further include a plurality of color filter areas and light-blocking patterns between the plurality of color filter areas, and the color-conversion layer may further include a plurality of color-conversion areas and light-blocking patterns between the plurality of color-conversion areas.

The plurality of color filter areas may include: a first color filter area emitting first color light; a second color filter area emitting second color light; and/or a third color filter area emitting a third color light, and the first color light, the second color light, and/or the third color light may have different maximum emission wavelengths. In some exemplary embodiments, the first color light may be red light, the second color light may be green light, and the third color light may be blue light, but the exemplary embodiments are not limited thereto. In some exemplary embodiments, the plurality of color filter areas (or a plurality of color-conversion areas) may each include a quantum dot, but the exemplary embodiments are not limited thereto. In some exemplary embodiments, the first color filter area may include a red quantum dot, the second color filter area may include a green quantum dot, and the third color filter area may not include a quantum dot. The quantum dot may be understood by referring to the description of the quantum dot provided herein. The first color filter area, the second color filter area, and/or the third color filter area may each further include an emitter, but the exemplary embodiments are not limited thereto.

In some exemplary embodiments, the light-emitting device may emit first light, the first color filter area may absorb the first light to emit a 1-1 color light, the second color filter area may absorb the first light to emit a 2-1 color light, and the third color filter area may absorb the first light to emit a 3-1 color light. In some exemplary embodiments, the 1-1 color light, the 2-1 color light, and the 3-1 color light may each have a different maximum emission wavelength. In some exemplary embodiments, the first light may be blue light, the 1-1 color light may be red light, the 2-1 color light may be green light, and the 3-1 light may be blue light, but the exemplary embodiments are not limited thereto.

The electronic apparatus may further include a thin-film transistor, in addition to the light-emitting device. The thin-film transistor may include a source electrode, a drain electrode, and an activation layer, wherein one of the source electrode and the drain electrode may be electrically connected to one of the first electrode and the second electrode of the light-emitting device. The thin-film transistor may further include a gate electrode, a gate insulating film, or the like.

The activation layer may include a crystalline silicon, an amorphous silicon, an organic semiconductor, and an oxide semiconductor, but the exemplary embodiments are not limited thereto.

The electronic apparatus may further include a sealing portion for sealing the light-emitting device. The sealing portion may be located between the color filter and the light-emitting device. The sealing portion may allow light to pass to the outside from the light-emitting device and prevent the air and moisture to permeate to the light-emitting device at the same time. The sealing portion may be a sealing substrate including a transparent glass or a plastic substrate. The sealing portion may be a thin-film encapsulating layer including a plurality of organic layers and/or a plurality of inorganic layers. When the sealing portion is a thin film encapsulating layer, the electronic apparatus may be flexible. The encapsulation layer may be formed by alternately stacking at least one organic layer and at least one inorganic layer.

There may be two or more of each of the inorganic layer and the organic layer. The organic layer may include polymers, for example, the organic layer may be a single-layered film or a laminate film including a polyethylene terephthalate, a polyimide, a polycarbonate, an epoxy, a polyethylene, and a polyacrylate. In some exemplary embodiments, the organic layer may include a polyacrylate, for example, a polymerized monomer composition including a diacrylate-based monomer and a triacrylate-based monomer. The monomer composition may further include a monoacrylate-based monomer. In addition, the monomer composition may further include a photoinitiator such as TPO, but the exemplary embodiments are not limited thereto.

The inorganic layer may be a single-layered film or a laminate film including a metal oxide or a metal nitride. In some exemplary embodiments, the inorganic layer may include at least one of $SiN_x$, $Al_2O_3$, $SiO_2$, and $TiO_2$.

The uppermost layer exposed to the outside from among the encapsulation layers may be formed as an inorganic layer to prevent the light-emitting device from water vapor transmission. The encapsulation layer may include at least one sandwich structure in which at least one organic layer is inserted between at least two inorganic layers. The encapsulation layer may include at least one sandwich structure in which at least one inorganic layer is inserted between at least two organic layers.

The encapsulation layer may include a first inorganic layer, a first organic layer, and a second inorganic layer, which are sequentially stacked from the top of the light-emitting device. In some exemplary embodiments, the encapsulation layer may include a first inorganic layer, a first organic layer, a second inorganic layer, a second organic layer, and a third inorganic layer, which are sequentially stacked from the top of the light-emitting device. In some exemplary embodiments, the encapsulation layer may include a first inorganic layer, a first organic layer, a second inorganic layer, a second organic layer, a third inorganic layer, a third organic layer, and a fourth inorganic layer, which are sequentially stacked from the top of the light-emitting device.

A halogenated metal layer including LiF may be further included between the light-emitting device and the first inorganic layer. The halogenated metal layer may prevent the light-emitting device from damage by forming the first inorganic layer by using sputtering or plasma deposition.

The first organic layer may have a smaller area than the second inorganic layer, and the second organic layer may have a smaller area than the third inorganic layer. In addition, the first organic layer may be fully covered by the second inorganic layer, and the second organic layer may be fully covered by the third inorganic layer.

In some exemplary embodiments, the encapsulation layer may be on the second electrode. In some exemplary embodiments, a capping layer may not be included between the encapsulation layer and the second electrode. In some exemplary embodiments, the encapsulation layer may be in contact with the second electrode. The authentication apparatus may be, for example, a biometric authentication apparatus that identifies an individual according biometric information (e.g., a fingertip, a pupil, or the like). The authentication apparatus may further include a biometric information collecting unit, in addition to the light-emitting device described above.

The electronic apparatus may be applicable to or take the form of various displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, an endoscope display device), a fish finder, various measurement devices, gauges (e.g., gauges of an automobile, an airplane, a ship), a projector, but the exemplary embodiments are not limited thereto.

Figure 4:
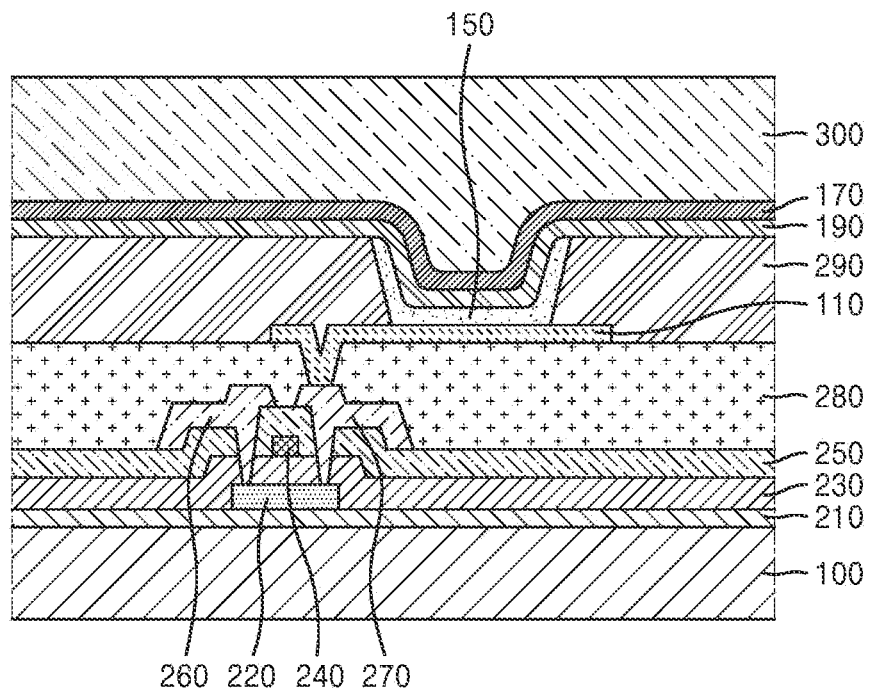
FIG. 4 is a schematic cross-sectional view of an exemplary embodiment of an emission apparatus device constructed according to principles of the invention.

Description of FIG. 4

FIG. 4 is a schematic cross-sectional view of an exemplary embodiment of an emission apparatus device constructed according to principles of the invention.

An emission apparatus in FIG. 4 may include a substrate 100, a thin-film transistor, a light-emitting device, and an encapsulation unit 300 sealing the light-emitting device. The substrate 100 may be a flexible substrate, a glass substrate, or a metal substrate. A buffer layer 210 may be on the substrate 100. The buffer layer 210 may prevent penetration of impurities through the substrate 100 and provide a generally flat surface on the substrate 100.

A thin-film transistor may be on the buffer layer 210. The thin-film transistor may include an activation or active layer 220, a gate electrode 240, a source electrode 260, and a drain electrode 270. The active layer 220 may include an inorganic semiconductor such as a silicon or a polysilicon, an organic semiconductor, or an oxide semiconductor and include a source area, a drain area and a channel area.

A gate insulating film 230 for insulating the active layer 220 and the gate electrode 240 may be on the active layer 220, and the gate electrode 240 may be on the gate insulating film 230. An interlayer insulating film 250 may be on the gate electrode 240. The interlayer insulating film 250 may be between the gate electrode 240 and the source electrode 260 and between the gate electrode 240 and the drain electrode 270 to provide insulation therebetween.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220.

Such a thin-film transistor may be electrically connected to a light-emitting device to drive the light-emitting device and may be protected by a passivation layer 280. The passivation layer 280 may include an inorganic insulating film, an organic insulating film, or a combination thereof. A light-emitting device may be on the passivation layer 280. The light-emitting device may include a first electrode 110, an interlayer 150, and a second electrode 190.

The first electrode 110 may be on the passivation layer 280. The passivation layer 280 may not fully cover the drain electrode 270 and expose a specific area of the drain electrode 270, and the first electrode 110 may be disposed to connect to the exposed drain electrode 270.

A pixel-defining film 290 may be on the first electrode 110. The pixel-defining film 290 may expose a specific area of the first electrode 110, and the interlayer 150 may be formed in the exposed area. The pixel-defining film 290 may be a polyimide or polyacryl organic film. Some higher layers of the interlayer 150 may extend to the upper portion of the pixel-defining film 290 and may be disposed in the form of a common layer.

The second electrode 190 may be on the interlayer 150, and a capping layer 170 may be additionally formed on the second electrode 190. The capping layer 170 may be formed to cover the second electrode 190. The encapsulation unit 300 may be on the capping layer 170. The encapsulation unit 300 may be on the light-emitting device to protect a light-emitting device from moisture or oxygen. The encapsulation unit 300 may be understood by referring to the descriptions of the encapsulation layer provided herein.

Manufacturing Method

The layers constituting the hole transport region, the emission layer, and the layers constituting the electron transport region may be formed in a specific region by using one or more suitable methods such as vacuum deposition, spin coating, casting, Langmuir-Blodgett (LB) deposition, ink-jet printing, laser printing, and laser-induced thermal imaging.

When the layers constituting the hole transport region, the emission layer, and the layers constituting the electron transport region are each formed by vacuum deposition, the vacuum deposition may be performed at a deposition temperature in a range of about 100° C. to about 500° C. at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

When the layers constituting the hole transport region, the emission layer, and the layers constituting the electron transport region are each formed by spin coating, the spin coating may be performed at a coating rate of about 2,000 revolutions per minute (rpm) to about 5,000 rpm and at a heat treatment temperature of about 80° C. to about 200° C., depending on the material to be included in each layer and the structure of each layer to be formed.

General Definitions Including Substituents

The term "interlayer" as used herein refers to a single layer and/or a plurality of all layers between a first electrode and a second electrode in a light-emitting device. Materials included in the "interlayer" may be organic materials, inorganic materials, or any combination thereof.

The term "π electron deficient nitrogen-containing cyclic group" as used herein refers to a $C_1$-$C_{60}$ heterocyclic group having at least one *—N=*' moiety as a ring-forming moiety.

The term "$C_1$-$C_{60}$ alkyl group" as used herein refers to a linear or branched aliphatic hydrocarbon monovalent group having 1 to 60 carbon atoms, and examples thereof include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —O$A_{101}$ (wherein $A_{101}$ is a $C_1$-$C_{60}$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl group, a bicyclo[1.1.1]pentyl group, a bicyclo[2.1.1]hexyl group, a bicyclo[2.2.1]heptyl group, or a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group including a heteroatom (e.g., N, O, Si, P, S, or any combination thereof) as a ring-forming atom and 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group including a heteroatom (e.g., N, 0, Si, P, S, or any combination thereof) as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a structure corresponding to the 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system having a heteroatom (e.g., N, 0, Si, P, S, or any combination thereof) as a ring-forming atom and 1 to 60 carbon atoms. The term "$C_1$-$C_{60}$ heteroarylene group" as used herein refers to a divalent group having a heterocyclic aromatic system having a heteroatom (e.g., N, 0, Si, P, S, or any combination thereof) as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group).

The term "monovalent non-aromatic fused polycyclic group" as used herein refers to a monovalent group that has two or more rings fused and only carbon atoms as ring forming atoms (e.g., 8 to 60 carbon atoms), wherein the entire molecular structure is non-aromatic. Examples of the monovalent non-aromatic fused polycyclic group include an indenyl group, a fluorenyl group, a spiro-bifluorenyl group, a benzofluorenyl group, an indenophenanthrenyl group, and an indenoanthracenyl group. The term "divalent non-aromatic fused polycyclic group" as used herein refers to a divalent group having a structure corresponding to the monovalent non-aromatic fused polycyclic group.

The term "monovalent non-aromatic fused heteropolycyclic group" as used herein refers to a monovalent group that has two or more rings fused, and has a heteroatom (N, O, Si, P, S, or any combination thereof) as ring-forming atoms other than carbon atoms, wherein the molecular structure as a whole is non-aromatic in the entire molecular structure. Examples of the monovalent non-aromatic fused heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzooxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic fused heteropolycyclic group" as used herein refers to a divalent group having a structure corresponding to the monovalent non-aromatic fused heteropolycyclic group.

The term "$C_5$-$C_{60}$ carbocyclic group" as used herein refers to a monocyclic or polycyclic group having 5 to 60 carbon atoms only as ring-forming atoms. The $C_5$-$C_{60}$ carbocyclic group may be an aromatic carbocyclic group or a non-aromatic carbocyclic group. The term "$C_5$-$C_{60}$ carbocyclic group" as used herein refers to a compound (e.g., a benzene group), a monovalent group (e.g., a phenyl group), or a divalent group (e.g., a phenylene group). Also, depending on the number of substituents connected to the $C_5$-$C_{60}$ carbocyclic group, the $C_5$-$C_{60}$ carbocyclic group may be a trivalent group or a quadrivalent group.

Examples of the $C_5$-$C_{60}$ carbocyclic group include a cyclopentadiene group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and an indenoanthracene group.

The term "$C_1$-$C_{60}$ heterocyclic group" as used herein refers to a monocyclic or polycyclic group which includes 1 to 60 carbon atoms and as ring-forming atoms, a heteroatom (e.g., N, O, Si, P, S, or any combination thereof), in addition to carbon atoms. The $C_1$-$C_{60}$ heterocyclic group may be an aromatic heterocyclic group or a non-aromatic heterocyclic group. The term "$C_1$-$C_{60}$ heterocyclic group" as used herein refers to a compound (e.g., a pyridine group), a monovalent group (e.g., a pyridinyl group), or a divalent group (e.g., a pyridinylene group). Also, depending on the number of substituents connected to the $C_1$-$C_{60}$ heterocyclic group, the $C_1$-$C_{60}$ heterocyclic group may be a trivalent group or a quadrivalent group.

Examples of the $C_1$-$C_{60}$ heterocyclic group include a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a cinnoline group, a phenanthroline group, a phthalazine group, a naphthyridine group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an azacarbazole group, an azafluorene group, an azadibenzosilole group, an azadibenzothiophene group, an azadibenzofuran group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, an imidazopyridine group, an imidazopyrimidine group, an imidazotriazine group, an imidazopyrazine group, an imidazopyridazine group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, and a benzothienodibenzothiophene group.

The substituent of the substituted $C_5$-$C_{60}$ carbocyclic group, the substituted $C_1$-$C_{60}$ heterocyclic group, the substituted $C_1$-$C_{60}$ alkylene group, the substituted $C_2$-$C_{60}$ alkenylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic fused polycyclic group, the substituted divalent non-aromatic fused heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic fused polycyclic group, and substituted monovalent non-aromatic fused heteropolycyclic group may be:

- deuterium (-D), —F, —Cl, —Br, —I, a hydroxyl group, a cyano group, or a nitro group;
- a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with at least one selected from deuterium, —F, —Cl, —Br, —I, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, and —P(=O)$(Q_{11})(Q_{12})$;
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, or a monovalent non-aromatic fused heteropolycyclic group, each unsubstituted or substituted with at least one selected from deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2(Q_{21})$, and —P(=O)$(Q_{21})(Q_{22})$;
- Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, or —P(=O)$(Q_{31})(Q_{32})$, or any combination thereof.

As used herein, $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, a monovalent non-aromatic fused heteropolycyclic group, a biphenyl group, or a terphenyl group.

"Ph" used herein represents a phenyl group, "Me" used herein represents a methyl group, "Et" used herein represents an ethyl group, "t-Bu," "Bu," "ter-Bu," or "But" used herein represents a tert-butyl group, and "OMe" used herein represents a methoxy group.

The term "biphenyl group" as used herein refers to a phenyl group substituted with at least one phenyl group. The "biphenyl group" belongs to "a substituted phenyl group" having a "$C_6$-$C_{60}$ aryl group" as a substituent.

The term "terphenyl group" as used herein refers to a phenyl group substituted with at least one phenyl group. The "terphenyl group" belongs to "a substituted phenyl group" having a "$C_6$-$C_{60}$ aryl group substituted with a $C_6$-$C_{60}$ aryl group" as a substituent.

The terms "hydrogen" and "deuterium" refer to their respective atoms and corresponding radicals, and the terms "—F, —Cl, —Br, and —I" are radicals of, respectively, fluorine, chlorine, bromine, and iodine.

As used herein, the term "atom" may mean an element or its corresponding radical bonded to one or more other atoms.

As used herein, a substituent for a monovalent group, e.g., alkyl, may also be, independently, a substituent for a corresponding divalent group, e.g., alkylene.

Hereinafter, a light-emitting device according to some exemplary embodiments will be described in more detail with reference to Examples.

EXAMPLES

Example 1

Anodes (ITO) were patterned onto a substrate according to a first, a second, and a third sub-pixel, and a pixel insulating film was formed on an edge portion.

HAT-CN, which is known in the art, was vacuum-deposited on the anodes that are exposed to form a hole injection layer having a thickness of 100 Å. Then TAPC, as a hole transport compound, was vacuum-deposited to form a hole transport layer having a thickness of 300 Å.

N,N'-bis(3-methylphenyl)-N,N'-diphenyl-[1,1-biphenyl]-4,4'-diamine (TPD) was formed on the hole transport layer of the first sub-pixel as a first auxiliary layer having a thickness of 700 Å.

The compounds Alq3 and tris(1-phenylisoquinoline) iridium(111) (Ir(phq)$_3$) were co-deposited at a weight ratio of 97:3 on the first auxiliary layer to form a red emission layer having a thickness of 400 Å. (N,N'-di(1-naphthyl)-N,N'-diphenylbenzidine (NPB) was deposited on the hole transport layer of the second sub-pixel to form a second auxiliary layer having a thickness of 300 Å.

The compounds Alq3 and Ir(3',5',4-mppy)2tmd were co-deposited at a weight ratio of 90:10 on the second auxiliary layer to form a green emission layer having a thickness of 300 Å. The compounds 4,4'-bis(2,2-diphenylvinyl)-1,1'-biphenyl (DPVBi) and perylene were co-deposited at a weight ratio of 99:1 on the hole transport layer of the third sub-pixel to form a blue emission layer having a thickness of 200 Å. 2,2',2"-(1,3,5-Benzinetriyl)-tris(1-phenyl-1-H-benzimidazole) (TPBi) was deposited on the emission layer to form an electron transport layer having a thickness of 550 Å.

LiF was deposited on the electron transport layer to form an electron injection layer having a thickness of 8 Å, and Al was deposited on the electron injection layer at a thickness of 1,000 Å, to form an electrode thereby completing the manufacture of a light-emitting device.

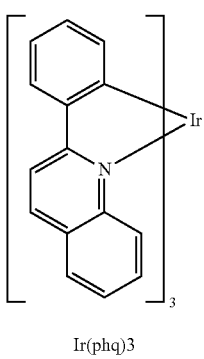

Ir(phq)3

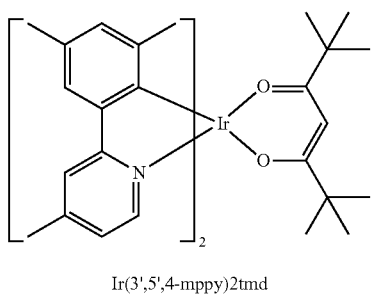

Ir(3',5',4-mppy)2tmd

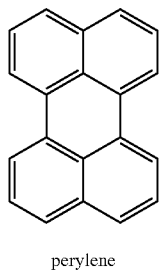

perylene

Comparative Example 1

A light-emitting device was manufactured in substantially the same manner as in Example 1, except that Ir(MDQ)$_2$(acac) was used instead of Ir(phq)3 in forming a red emission layer, and Ir(ppy)$_3$ was used instead of Ir(3',5',4-mppy)2tmd in forming a green emission layer.

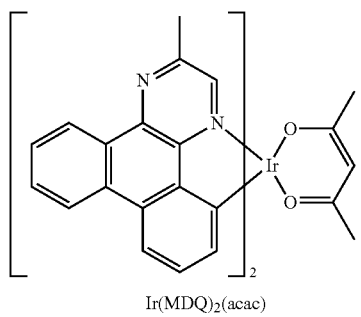

Ir(MDQ)$_2$(acac)

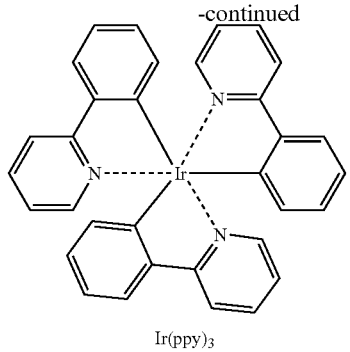

Ir(ppy)$_3$

Measurement of Horizontal Dipole Moment of Dopants and Ratio

The ratios of horizontal dipole moments regarding the green dopant and the red dopant in Example 1 and Comparative Example 1 were measured. The horizontal dipole moment was measured, after laser light had passed through the sample, by measuring components in a planar direction polarized by a polarization filter using an analyzer sold under the trade designation LUXOL_OLED PL Analyzer by CoCoLink, a Korean tech company of Seoul, South Korea. The detailed measurement methods are known in the art and thus are omitted herein.

The results are shown in Table 1.

TABLE 1

| | Dopant | |
|---|---|---|
| | Red | Green |
| Example 1 | Ir(phq)$_3$ | Ir(3',5',4-mppy)$_2$tmd |
| Ratio (%) | 70 | 80 |
| Comparative Example 1 | Ir(MDQ)$_2$(acac) | Ir(ppy)$_3$ |
| Ratio (%) | 80 | 72 |

Ratio" as used in Table 1 refers to the ratio of the horizontal dipole moment to the total dipole moment of the dopant.

Color-Coordinate Change Measurement According to a Viewing Angle

The color-coordinates of the light-emitting devices of Comparative Example 1 and Example 1 according to a viewing angle (from 0 degrees to 60 degrees) were measured, and the measured points were connected and shown in FIGS. 2 and 3.

In the graphs in FIGS. 2 and 3, R, G, B, and Y respectively represents that the corresponding area is in red, green, blue, and yellow. In the graphs in FIGS. 2 and 3, the background lines each represent a minimum perceptible color difference (MPCD) line.

As shown in FIG. 2, as the viewing angle gradually increases, the color-coordinate changes from red to blue to green, and the direction of the overall color-coordinate change movement is different from the MPCD line direction. Accordingly, in the case of the light-emitting device of FIG. 2, the color change depending on the change in the viewing angle is observed by the naked eye of a user.

As shown in FIG. 3, as the viewing angle gradually increases, the color-coordinate changes, however, the direction of the overall color-coordinate change movement is same to the MPCD line direction. (numbers 15, 30, 45, and 60 respectively represents a viewing angle of 15, 30, 45, or 60). Accordingly, in the case of the light-emitting device of FIG. 3, it was significant and unexpected that the color change depending on the change in the viewing angle was barely observed by the naked eye of a user.

In the light-emitting devices constructed according to the principles and one or more exemplary embodiments, color change according to the viewing angle may not be observed by the naked eye of a user, thus allowing the user to recognize the color viewed from the front as being substantially identical to the color viewed from the side.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting device comprising:
   a first electrode;
   an interlayer on the first electrode and comprising an emission layer patterned into a red emission layer, a green emission layer, and a blue emission layer for a corresponding sub-pixel;
   a second electrode on the interlayer; and
   an encapsulation layer on the second electrode;
   wherein the red emission layer comprises a red light-emitting material having a horizontal dipole moment, the green emission layer comprises a green light-emitting material having a horizontal dipole moment, and the blue emission layer comprises a blue light-emitting material, and
   the horizontal dipole moment of the green light-emitting material is greater than the horizontal dipole moment of the red light-emitting material.

2. The light-emitting device of claim 1, wherein the horizontal dipole moment of the green light-emitting material is in a range of about 60% to about 95% of a total dipole moment of the green light-emitting material.

3. The light-emitting device of claim 1, wherein the horizontal dipole moment of the red light-emitting material is about 80% or lower of a total dipole moment of the red light-emitting material.

4. The light-emitting device of claim 1, wherein the horizontal dipole moment of the red light-emitting material is in a range of about 60% to about 80% of a total dipole moment of the red light-emitting material.

5. The light-emitting device of claim 4, wherein the horizontal dipole moment of the red light-emitting material is in a range of about 65% to about 75% of a total dipole moment of the red light-emitting material.

6. The light-emitting device of claim 1, further comprising a capping layer with a refractive index of about 1.6 or higher disposed on the second electrode.

7. The light-emitting device of claim 6, wherein the capping layer is in contact with the second electrode.

8. The light-emitting device of claim 1, wherein the encapsulation layer comprises at least one organic layer and at least one inorganic layer.

9. The light-emitting device of claim 1, wherein the blue light-emitting material is a metal complex including a ligand and a metal.

10. The light-emitting device of claim 1, wherein a direction of a color-coordinate change movement according to a viewing angle is a minimum perceptible color difference line direction.

11. The light-emitting device of claim 10, wherein the color-coordinate change movement is a movement at a viewing angle of greater than about 0 degrees to about 60 degrees.

12. The light-emitting device of claim 1, wherein the green light-emitting material and the red light-emitting material are each represented by Formula 401:

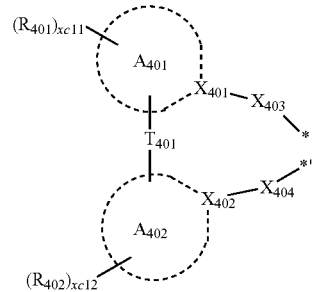

Formula 401

Formula 402 wherein, in Formulae 401 and 402,

M is iridium, platinum, palladium, osmium, titanium, gold, hafnium, europium, terbium, rhodium, rhenium, or thulium;

$L_{401}$ is a ligand represented by Formula 402, and xc1 is 1, 2, or 3, and when xc1 is an integer of 2 or greater, at least two $L_{401}$(s) are identical to or different from each other;

$L_{402}$ is an organic ligand, and xc2 is an integer from 0 to 4, and when xc2 is an integer of 2 or greater, at least two $L_{402}$(s) are identical to or different from each other;

$X_{401}$ and $X_{402}$ are each, independently from one another, nitrogen or carbon;

ring $A_{401}$ and ring $A_{402}$ are each, independently from one another, a $C_5$-$C_{60}$ carbocyclic group or a $C_1$-$C_{60}$ heterocyclic group;

$T_{401}$ is a single bond, —O—, —S—, —C(=O)—, —N($Q_{411}$)—, —N=, —C($Q_{411}$)($Q_{412}$)—, —C($Q_{411}$)=C($Q_{412}$)—, —C($Q_{411}$)=, or =C=;

$X_{403}$ and $X_{404}$ are each, independently from one another, a chemical bond, O, S, N($Q_{413}$), B($Q_{413}$), P($Q_{413}$), C($Q_{413}$)($Q_{414}$), or Si($Q_{413}$)($Q_{414}$);

$R_{401}$ and $R_{402}$ are each, independently from one another, hydrogen, deuterium, —F, —Cl, —Br, —I, a hydroxyl group, a cyano group, a nitro group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic fused polycyclic group, a substituted or unsubstituted monovalent non-aromatic fused heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), wherein $Q_{401}$ to $Q_{403}$ and $Q_{411}$ to $Q_{414}$ are each, independently from one another, hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, a monovalent non-aromatic fused heteropolycyclic group, a biphenyl group, or a terphenyl group;

xc11 and xc12 are each, independently from one another, an integer from 0 to 10; and

* and *' in Formula 402 each indicate a binding site to M in Formula 401.

13. The light-emitting device of claim 12, wherein $L_{402}$ is an organic ligand comprising a halogen group, a diketone group, a carboxylic acid group, —C(=O), an isonitrile group, a —CN group, a phosphorus group, or any combination thereof.

* * * * *